United States Patent [19]
Iwano et al.

[11] Patent Number: 5,621,750
[45] Date of Patent: Apr. 15, 1997

[54] SURFACE EMISSION TYPE SEMICONDUCTOR LASER, METHOD AND APPARATUS FOR PRODUCING THE SAME

[75] Inventors: Hideaki Iwano; Katsumi Mori; Takayuki Kondo; Tatsuya Asaka, all of Suwa, Japan

[73] Assignee: Seiko Epson Corporation, Tokyo, Japan

[21] Appl. No.: 491,955

[22] PCT Filed: Jan. 20, 1995

[86] PCT No.: PCT/JP95/00060

§ 371 Date: Jul. 17, 1995

§ 102(e) Date: Jul. 17, 1995

[87] PCT Pub. No.: WO95/20254

PCT Pub. Date: Jul. 27, 1995

[30] Foreign Application Priority Data

Jan. 20, 1994 [JP] Japan ......................................... 6-4859

[51] Int. Cl.$^6$ ................. H01S 3/19; H01L 21/20
[52] U.S. Cl. .................. 372/96; 372/46; 372/92; 438/32; 438/29
[58] Field of Search .................. 372/96, 92, 45, 372/46; 437/129

[56] References Cited

U.S. PATENT DOCUMENTS

| | | | |
|---|---|---|---|
| 5,351,256 | 9/1994 | Schneider et al. | 372/96 |
| 5,356,832 | 10/1994 | Mori et al. | 437/129 |
| 5,373,520 | 12/1994 | Shoji et al. | 372/96 |
| 5,375,133 | 12/1994 | Mori et al. | 372/96 |
| 5,459,746 | 10/1995 | Itaya et al. | 372/46 |

FOREIGN PATENT DOCUMENTS

| | | |
|---|---|---|
| 0475372 | 3/1992 | European Pat. Off. . |
| 0531542 | 3/1993 | European Pat. Off. . |
| 2606223 | 5/1988 | France . |
| 4-275478 | 10/1992 | Japan . |

OTHER PUBLICATIONS

"Enhanced Performance of Offset-gain High Barrier Vertical Cavity Surface Emitting Lasers", *IEEE Journal of Quantum Electronics*, vol. 29, No. 6 (Jun. 1993), pp. 2013–2022.
"Method for Accurate Growth of Vertical Cavity Surface Emitting Lasers", *Applied Physics Letters*, vol. 62, No. 11 (Mar. 1993), pp. 1182–1184.
Patent Abstracts of Japan, vol. 13, No. 574 (E–863) & JP,A,01 239 890, Sep. 25, 1989.
Patent Abstracts of Japan, vol. 14, No. 128 (P–1019) & JP,A,01 320 408, Dec. 26, 1989.
Patent Abstracts of Japan, vol. 17, No. 13 (E–1304) & Jp,A,04 24299, Nov. 01,1993.
Patent Abstracts of Japan, vol. 16, No. 420 (E–1259) & JP,A,04 144 183, May 18, 1992.
"Phase Coupled Two Dimensional AlGaAs Vertical Cavity Sel Array", *Applied Physics Letters*, vol. 56, No. 21 (May 1990), pp. 2089–2091.
English–language Abstract of JP–A–4–275478.
Randall S. Geels et al., "Sumbilliamp threshold vertical-cavity laser diodes," *Appl. Phys. Lett.*, vol. 57, No. 16, Oct. 15, 1990.

*Primary Examiner*—James W. Davie
*Attorney, Agent, or Firm*—Oliff & Berridge

[57] ABSTRACT

A surface emission type semiconductor laser has insulation layers (107, 108) embedding separation grooves for partially separating the waveguide path in an optical resonator formed by a pair of reflecting mirrors, namely a distributed reflection type multilayer film mirror (104) and a dielectric multilayer film mirror (111), and a quantum well active layer (105).

A surface emission type semiconductor laser is designed such that the lasing wavelength $\lambda_G$ of an edge emission type semiconductor laser having the same semiconductor layers as those of the optical resonator is set to be shorter than a desired lasing wavelength $\lambda_{EM}$ of the surface emission type semiconductor laser by a given differential wavelength (gain offset) $\Delta\lambda_{EM}$.

50 Claims, 48 Drawing Sheets ature. 5,621,750

SURFACE EMISSION TYPE SEMICONDUCTOR LASER, METHOD AND APPARATUS FOR PRODUCING THE SAME

TECHNICAL FIELD

The present invention relates to the structure of a surface emission type semiconductor laser for emitting light in a direction perpendicular to the plane of a substrate, and a method and apparatus for producing such a semiconductor laser. The present invention further relates to the structure of a surface emission type semiconductor laser usable in a parallel optical information processor such as an image forming device or optical communication system as well as a method and apparatus for producing such a semiconductor laser.

BACKGROUND ART

One of the surface emission type semiconductor lasers has been reported in Extended Abstracts (The 50th Autumn Meeting, 1989); The Japan Society of Applied Physics, Volume 3, pp. 909, 29a-ZG-7, issued on Sep. 27, 1989. FIG. 45 shows a perspective view of a light emitting unit in such a semiconductor laser. The semiconductor laser is produced through the following process. An n-type GaAs substrate 2202 is first processed to grow n-type AlGaAs/AlAs multilayer film 2203, n-type AlGaAs clad layer 2204, p-type GaAs active layer 2205 and p-type AlGaAs clad layer 2206 thereon. The substrate 2202 is then etched to leave a column-like region 2220 which is buried by AlGaAs layers 2207, 2208, 2209 and 2210 formed sequentially in the order of p-type, n-type, p-type and p-type. Thereafter, a dielectric multilayer film 2211 is deposited on the top of the p-type AlGaAs cap layer 2210 and n-type and p-type ohmic electrodes 2201, 2212 are then formed. Thus, a surface emission type semiconductor laser will be formed.

In the surface emission type semiconductor laser of the prior art shown in FIG. 45 the embedding layers 2207 and 2208 provide a p-n junction as means for preventing an electric current from flowing to parts other than the active layer. However, with the p-n junction it is very difficult to provide a sufficient current constriction and a non-effective current cannot be completely suppressed. In the prior art, therefore, it is difficult to perform a continuous oscillation drive at room temperature due to the joule effect heat in the laser elements being increased by such non-effective current. In the laser of the prior art, the entire optical resonator is buried by a material having its refractive index lower than that of the resonator. Thus, light will be confined in the resonator. Even if the cross-sectional configuration of the resonator in a direction parallel to the plane of the resonator substrate is changed, the light emission spot in the basic oscillatory mode will be formed into a dot-like shape having its diameter equal to about 2 μm. When it is desired to form a surface emission type semiconductor laser into a two-dimensional array configuration by which the laser is characterized, it is difficult to use a plurality of independent resonators to provide a single and stable laser beam from the laser beams of the respective resonators due to interference since the laser beams from the individual resonators are not equalized in phase even if the resonators are located close to one another in the substrate plane.

FIG. 46 shows a cross-sectional view of another surface emission type semiconductor laser according to the prior art. Such a laser is structured by forming n-type distributed Bragg reflection (DBR) type mirror 2402, n-type clad layer 2408, quantum well active layer 2403, p-type clad layer 2409, p-type DBR mirror 2404 and p-type ohmic electrode 2405 on n-type GaAs substrate 2401. The single crystalline state in a hatched region 2406 is then broken by implanting hydrogen ions thereinto to form a high-resistance region such that an injected current will only concentrate into the oscillatory region. An n-type ohmic electrode 2407 is formed on the underside of the substrate 2401. Light is emitted from the laser in a direction 2410 perpendicular to the plane of the substrate 2401.

In the surface emission type semiconductor laser of the prior art shown in FIG. 46, the injected current will flow through the p-type DBR mirror 2404. In the p-type DBR mirror 2404, the current flows in the form of positive holes as carriers. A positive hole has an effective mass about ten times larger than that of an electron and cannot well move beyond the heterobarrier within the mirror. Thus, the p-type DBR mirror 2404 presents an increased resistance component. The surface emission type semiconductor laser of the prior art shown in FIG. 46 must increase the number of mirror layers to increase the reflectivity in the p-type DBR mirror 2404. This raises a problem in that the resistance is very high in the p-type DBR mirror 2404.

DISCLOSURE OF THE INVENTION

An object of the present invention is to provide a surface emission type semiconductor laser which can provide a sufficiently satisfactory current constriction, has a relatively low threshold current and a relatively high external differential quantum efficiency and is improved in efficiency and reliability. Another object of the invention is to provide an apparatus for and a method of producing such a semiconductor laser.

To this end, the present invention provides a first surface emission type semiconductor laser comprising:

a substrate formed of a compound semiconductor of first conductance type;

a lower electrode formed on the bottom of said substrate;

a distributed reflection multilayer film mirror of first conductance type formed on the top of said substrate;

a first clad layer of first conductance type formed on said distributed reflection multilayer film mirror;

a quantum well active layer formed on said first clad layer;

a second clad layer of second conductance type formed on said quantum well active layer and having one or more column-like portions;

a contact layer of second conductance type formed on the column-like portion or portions in the second clad layer;

a buried insulation layer embedded around said column-like portion or portions of said second clad layer and said contact layer, including at least a first insulation layer which covers surface of said second clad layer and said contact layer being formed of silicon compound;

an upper electrode formed to bridge between said contact and buried insulation layers and having an opening facing a part of said contact layer; and a dielectric multilayer film mirror formed at least on said contact layer to cover the opening of said upper electrode.

In the semiconductor laser, an optical resonator is defined by the distributed reflection type multilayer film mirror, the first clad layer, the quantum well active layer, the column-like portion of the second clad layer, the contact layer and the dielectric multilayer film mirror.

If the semiconductor laser includes a plurality of said column-like portions (resonator portions), since the parallel transverse modes produced at the respective resonator portions are electromagnetically coupled, laser beams synchronized in phase with one another will be radiated from the respective resonator portions.

The buried insulation layer comprises at least the first insulation layer which is continuously formed over the surfaces of the clad and contact layers and preferably also includes a second insulation layer formed on the first insulation layer for flattening the area surrounding the second clad layer column-like portion or portions and the contact layer. It is desirable that the second insulation layer is formed of a material which can be shaped at a temperature lower than that of the first insulation layer. The first insulation layer can prevent impurities in the second insulation layer, such as sodium, chlorine, heavy metals, hydrogen and the like, from moving to the second clad layer or quantum well active layer through thermodiffusion or the like. The first insulation layer is preferably formed through thermal CVD (chemical vapor deposition). It is therefore desirable that the film thickness of the first insulation layer is reduced to shorten the time of the optical resonator being subjected to heat on film formation and to reduce damage to the crystal due to heat.

As described, the first insulation layer may have a sufficient thickness to prevent movement of materials adversely affecting the optical resonator. The film thickness of the first insulation layer preferably ranges between 500 Angsttoms and 2000 Angstroms. The first insulation layer is preferably formed of at least one silicon compound selected from a group consisting of silicon oxide, silicon nitride and silicon carbide. The second insulation layer is preferably formed of at least one material selected from a group consisting of silicon compounds formed at a temperature lower than said silicon compound used for the first insulation layer, heat-resistant resins such as polyimide and polycrystalline II–VI group compound semiconductors.

After the second clad layer has been etched to form the column-like portion or portions, the film thickness of the second clad layer at areas other than the column-like portion or portions is preferably between 0 μm (i.e. removed) and 0.58 μm and more preferably between 0 and 0.35 μm. When the areas of the second clad layer other than the column-like portion or portions are very thin or even the second clad layer completely removed in these areas without the underlying active layer being etched, current may be effectively injected into the quantum well so as to provide an increased external differential quantum efficiency.

The quantum well active layer consists of n-type GaAs well and $Al_{0.3}Ga_{0.7}As$ barrier layers. The film thickness of the well layer is preferably between 40 Angstroms and 120 Angstroms while the film thickness of the barrier layer is preferably between 40 Angstroms and 100 Angstroms. It is further preferred that the total number of well layers ranges between 3 and 40. According to such a quantum well active layer, the surface emission type semiconductor laser can fully be improved in lowering the threshold current level and raising the light output level, temperature characteristic and reproducibility of lasing wavelength.

The distributed reflection type multilayer film mirror has its reflectivity equal to or higher than 99.2% within a range of a wavelength at least 40 nm which includes a lasing wavelength $\lambda_{EM}$, and the lasing wavelength is set within this a range. The reflectivity of the distributed reflection type multilayer film mirror depends on the amount of doping in the respective semiconductor layers forming the mirror. If the distributed reflection type multilayer film mirror is formed by alternately forming an $Al_{0.8}Ga_{0.2}As$ layer and an $Al_{0.15}Ga_{0.85}As$ layer, it is preferred that n-type dopant doped in the respective layers has its average amount of doping ranging between $5\times10^{16}$ cm$^{-3}$ and $1\times10^{19}$ cm$^{-3}$. The carrier concentration of the distributed reflection type multilayer film mirror of the interface area between an $Al_{0.8}Ga_{0.2}As$ layer containing more aluminum and an $Al_{0.15}Ga_{0.85}As$ layer containing less aluminum and also larger band gap is desirably higher than those of the areas other than the interface area. More particularly, the maximum doping value of the interface area is preferably 1.1 to 100 times the minimum doping value at the areas other than the interface area.

It is also preferred that the reflectivity of the dielectric multilayer film mirror ranges between 98.5% and 99.5%. If the reflectivity is lower than 98.5%, the lasing threshold current will increase. On the other hand, if the reflectivity is higher than 99.5%, the optical output cannot easily be taken out to reduce the external differential quantum efficiency. The material forming the dielectric multilayer film mirror has preferably little light absorption loss relative to the lasing wavelength. More particularly, such a material is a dielectric material having its absorption coefficient equal to or lower than 100 cm$^{-1}$ relative to the lasing wavelength. Such dielectric materials include $SiO_x$, $Ta_2O_5$, $ZrO_x$, $TiO_x$, $ZrTiO_x$, $M_gF_x$, $C_aF_x$, $B_aF_x$ and $A_1F_x$.

Each of the column-like portions in the clad layer forms part of a separate optical resonator. If it is assumed that the diameter of the column-like portion is Da and the diameter of the opening in the upper electrode is Dw, it is preferred that the diameter Da is between 6 μm and 12 μm and the diameter Dw is between 4 μm and 8 μm. It is also preferred that Dw is slightly smaller than Da. The diameter of the column-like portion (resonator diameter) and the diameter of the opening (exit port diameter) influence the transverse mode characteristic of the laser. To provide the emitted light in the basic transverse mode, it is preferred that the resonator diameter is smaller than a given level. To provide a higher output, it is also preferred that the resonator is not too small. In view of this, it is desirable that Da and Dw are respectively within said ranges to provide a basic transverse mode oscillation.

The first and second clad layers are formed by semiconductors indicated by $Al_xGa_{1-x}As$ where x is preferably equal to or larger than 0.4, more preferably equal to or larger than 0.65 and most preferably between 0.7 and 0.8. When the value x is set within the above range, the band gap in the clad layers becomes sufficiently high to provide better confinement of the injected carriers into the active layer. This provides a higher external differential quantum efficiency.

It is further preferred that each of the column-like portions in the second clad layer has its film thickness ranging between 0.8 μm and 3.5 μm. If the film thickness is smaller than 0.8 μm, the distribution of the injected carriers is not uniform and more carriers are distributed particularly adjacent the periphery of the column-like portions. This creates a recombination of carriers which will not contribute to the laser oscillation. As a result, the light output will be thermally saturated before the threshold for laser oscillation is reached since the density of carriers is insufficient adjacent the center of the resonator. On the other hand, if the film thickness is larger than 3.5 μm, the resistance in the element increases to increase the power consumption. Thus, the thermal saturation may be created with lower injected current.

The present invention also provides a second surface emission type semiconductor laser comprising:

a substrate formed of a compound semiconductor of first conductance type;

a lower electrode formed on the bottom of said substrate;

a distributed reflection multilayer film mirror of first conductance type formed on the top of said substrate;

a first clad layer of first conductance type formed on said distributed reflection multilayer film mirror;

a quantum well active layer formed on said first clad layer;

a second clad layer of second conductance type formed on said quantum well active layer and having one or more column-like portions;

a contact layer of second conductance type formed on the column-like portion or portions in the second clad layer;

a buried insulation layer embedded around said column-like portion or portions of said second clad layer and said contact layer;

an upper electrode formed to bridge between said contact and buried insulation layers and having an opening facing a part of said contact layer; and a dielectric multilayer film mirror formed at least on said contact layer to cover the opening of said upper electrode, wherein the peak wavelength $\lambda_G$ of the gain spectrum of said quantum well active layer is set to be smaller than a desired lasing wavelength $\lambda_{EM}$ by a given differential wavelength (gain offset) $\Delta\lambda_{BS}$.

The second semiconductor laser is particularly characterized by that the peak wavelength $\lambda_G$ of the gain spectrum in the active layer is set to be smaller, by a gain offset $\Delta\lambda_{BS}$, than the lasing wavelength $\lambda_{EM}$ of the surface emission type semiconductor laser. A way to determine the peak wavelength $\lambda_G$ is by making an edge emission type semiconductor laser having the same semiconductor layers as the semiconductor layers formed on the substrate to form the surface emission type semiconductor laser of the present invention. The lasing wavelength of the edge emission type semiconductor laser is substantially equal to $\lambda_G$. The gain offset $\Delta\lambda_{BS}$ is preferably between 5 nm and 20 nm, more preferably between 5 nm and 15 nm and most preferably between 10 nm and 15 nm. When such a gain offset is set, the lasing wavelength regulated by the resonator length can substantially be equal to the peak wavelength of the gain spectrum to provide a reliable laser oscillation with an increased efficiency even if the peak wavelength of the gain spectrum in the active layer is shifted to become longer due to an increase of the temperature.

More particularly, if the peak wavelength of the gain spectrum is longer than the lasing wavelength of the surface emission type semiconductor laser, the peak wavelength of the gain spectrum will be shifted by the injection of current to become longer thereby to reduce the gain required by the laser oscillation. This provides a difficulty in obtaining high-power oscillation. On the other hand, if the gain offset is too large, the gain at the lasing wavelength $\lambda_{EM}$ becomes too small for lasing even if the peak wavelength of the gain spectrum becomes longer through the injection of current. For example, if the gain offset $\Delta\lambda_{BS}$ exceeds 20 nm, it becomes difficult to perform the continuous drive at a practical threshold current. On the other hand, if the gain offset $\Delta\lambda_{BS}$ is smaller than 5 nm, the peak wavelength of the gain spectrum will be shifted through the injection of current to become longer and to reduce the gain at the lasing wavelength. This cannot provide a sufficient laser oscillation. Since $\lambda_G$ is temperature dependent it needs to be measured at a temperature of the surface emission type semiconductor laser at which it is used.

In the semiconductor laser having such a set gain offset, the other components thereof and more particularly the buried insulation layer, second clad layer, quantum well active layer, distributed reflection type multilayer film mirror and dielectric multilayer film mirror are preferably similar to those of the aforementioned first semiconductor laser.

In the surface emission type semiconductor lasers of the present invention, it is preferred that the plane of polarization in the laser beam is controlled by means of the configuration of the column-like portion or portions which form part of optical resonators. This will be described in detail.

Each of the column-like portion or portions forming part of the resonator or resonators preferably has a cross-section parallel to the semiconductor substrate which is of a rectangular configuration having longer and shorter sides. It has been experimentally found that the plane of polarization in the laser beam is aligned with a direction parallel to the shorter side of each rectangular column-like portion. If it is to form a single resonator in a laser element or a plurality of resonators in the same laser element, the plane or planes of polarization in the laser beam or beams emitted from the resonator or resonators are aligned with the shorter side or sides of the rectangular column-like portion or portions in the resonator or resonators.

When the length of a longer side in the rectangular column-like portion is A and the length of a shorter side is B, it is preferred that the dimensional relationship thereof is B<A<2B. If A is equal to or larger than 2B, the light exit port will be of rectangular configuration rather than circular or of a regular polygon configuration. This will provide a plurality of light emission spots for a single exit port. Furthermore, the volume of each of the resonators will be increased to increase the laser oscillation threshold current.

It is further preferred that a plurality of column-like portions each having a rectangular cross-section are formed in the second clad layer with their shorter sides being parallel to one another. In such a semiconductor laser, the planes of polarization in the laser beams emitted from the respective column-like portions are aligned with the shorter sides of the respective column-like portions. Since the shorter sides of the column-like portions are parallel to one another, the laser beams emitted from a single opening (light exit port) will be synchronous in phase with one another and also have the planes of polarization aligned with one another. If such a semiconductor laser is used in a laser application instrument, for example, the planes of polarization in the laser beams can easily be set in a particular direction without need of a fine positional adjustment for each element. If the buried insulation layer in such a semiconductor laser is formed of a material having a light transmission property, the buried insulation layer is substantially transparent for the lasing wavelength. Thus, light leaking into the buried insulation layer can also contribute to the laser output. The light emission spot can correspondingly be enlarged. As a result, the semiconductor laser can emit laser beams each having a single light emission spot, the laser beams being synchronized in phase and aligned in plane of polarization with one another.

A plurality of column-like portions each having a rectangular cross-section can emit a laser beam of substantially circular cross-section by arranging these column-like portions in symmetry on a two-dimensional plane parallel to the semiconductor substrate and also by shaping the opening in the upper electrode into a circle or regular polygon. Resonators including the respective column-like portions may be arranged on the semiconductor substrate so that each of the resonators will have an individual upper electrode. Thus, the laser beam emitted from each of the resonators can be of substantially circular cross-section. The laser beams can independently be turned on and off and modulated for every resonator.

When the resonators are arranged to make all the shorter sides of the rectangular column-like portions parallel to one another, the planes of polarization in the laser beams emitted from the respective resonators can be aligned with one another in the same direction. If at least one of the optical resonators is arranged to set the shorter sides of its column-like portion not parallel to those of the other optical resonators, the plane of polarization in the laser beam emitted from the one optical resonator can be different from those of the other optical resonators.

When a plurality of column-like portions each having a rectangular cross-section are equidistantly arranged on a two-dimensional plane parallel to the semiconductor substrate in a transverse or longitudinal array, the laser beam can be of a line beam.

The plane of polarization in the laser beam may be arranged parallel to the shorter sides of a rectangular cross-sectional light exit port formed in an electrode on the side of light exit, rather than use of the rectangular column-like portions. Such an arrangement is effective in a case where the cross-section of the column-like portion cannot be of rectangular configuration under restriction to the arrangement of column-like portions on the two-dimensional plane. Both the column-like portion and light exit port may be of rectangular cross-section. In such a case, all the shorter sides of the column-like portion and light exit port may be parallel to one another. Where the length of the longer sides of the light exit port is $a$ and the length of the shorter sides thereof is $b$, it is preferred that the dimensional relationship thereof is $b<a<2b$. This is because if the ratio of b/a is higher, the ratio of B/A in the sides of the column-like portion of the optical resonator also becomes higher such that the ratio of B/A will be out of the preferred range.

The optical resonators may be arranged in any one of various layouts depending on type of instrument to which they are to be applied. For example, when laser application instruments such as a laser printer, measurement apparatus used for laser beam, optical pick up and communication tools are to be designed, a technique of controlling the plane of polarization in a laser beam is extremely useful.

The first surface emission type semiconductor laser of the present invention can be produced, for example, according to a method comprising the steps of:

(a) forming semiconductor layers including at least a distributed reflection type multilayer film mirror of a first conductance type, a first clad layer of the first conductance type, a quantum well active layer, a second clad layer of a second conductance type and a contact layer of the second conductance type on a substrate formed of a first conductance type compound semiconductor through epitaxial growth;

(b) etching said contact and second clad layers to form one or more column-like portions;

(c) forming a buried insulation layer including at least a first insulation layer of silicon compound covering the surface of said second clad layer and said contact layer around said column-like portion or portions;

(d) forming an upper electrode having an opening facing a part of said contact layer and bridging between said contact layer and said buried insulation layer; and (e) forming a dielectric multilayer film mirror at least on said contact layer to cover the opening of said upper electrode.

The second surface emission type semiconductor laser of the present invention may be produced, for example, according to a method comprising the steps of:

(a) forming semiconductor layers including at least a distributed reflection type multilayer film mirror of a first conductance type, a first clad layer of the first conductance type, a quantum well active layer, a second clad layer of a second conductance type and a contact layer of the second conductance type on a substrate formed of a first conductance type compound semiconductor through epitaxial growth;

(b) etching said contact and second clad layers to form one or more column-like portions;

(c') forming a buried insulation layer around said column-like portion or portions;

(d) forming an upper electrode having an opening facing a part of said contact layer and bridging between the contact layer and the buried insulation layer; and (e) forming a dielectric multilayer film mirror at least on said contact layer to cover the opening of said upper electrode, said semiconductor layers being controlled such that the peak wavelength $\lambda_G$ of the gain spectrum of said quantum well active layer is smaller than a desired lasing wavelength $\lambda_{EM}$ by a predetermined differential wavelength (gain offset) $\Delta\lambda_{BS}$. It is desirable that the gain offset $\Delta\lambda_{BS}$ is set to be between 5 nm and 20 nm. Since $\lambda_G$ is temperature dependent it needs to be measured at a temperature of the surface emission type semiconductor laser at which it is used.

It is desirable that the above step (c') includes at least a step of forming a first insulation layer of a silicon compound which covers surface of the second clad and contact layers.

In each of the aforementioned methods, the buried insulation layer preferably includes a second insulation layer for flattening areas around the column-like portion or portions of the second clad layer and the contact layer, such a second insulation layer being formed on the first insulation layer after the latter has been formed, for example, through a thermal CVD process.

It is also desirable that the distributed reflection type multilayer film mirror is formed by alternately depositing semiconductor layers of lower and higher refractive indexes. This can be accomplished by irradiating a light having a given wavelength such as the same wavelength as the lasing wavelength onto the substrate to detect its reflection spectrum and measuring the reflectivity profile in the semiconductor layers while they are being formed on the substrate, the depositions of the semiconductor layers having different refractive indexes being switched from one to another at maximum or minimum points in the reflectivity profile.

The reflectivity profile depends on the thickness of the layers and the refractive index of the layers, rather than crystal growth speed or time. When, during the deposition, the Al composition in a deposited layer is changed at a maximum or minimum point in the reflectivity profile and layers having correspondingly different refractive indexes are epitaxially grown one after the other, the thickness of a respective one of the layers will exactly coincide with a theoretical thickness. By suitably selecting a semiconductor laser having a predetermined lasing wavelength to provide a source of input light used in measurement of the reflectivity, the desired wavelength can strictly be set to determine a refractive index from the film thickness of each of the layers. Since the reflectivity in the distributed reflection type multilayer film mirror itself can be measured during crystal growth, the number of mirror pairs can be varied during formation of the layers. This can optimizes the structure of the semiconductor laser.

In the aforementioned step (b), it is desirable that the depth of etching is controlled by irradiating light having its wavelength within a given range (e.g., the lasing wavelength ±60 nm) onto the substrate having said semiconductor layers to detect its reflection spectrum and to measure dips appearing in the reflection spectrum due to the standing wave of the optical resonator. It is also desirable that the depth of etching is controlled to provide the film thickness of an area other than the column-like portion or portions of the second clad layer which may range between 0 and 0.58 μm, for example. The reason of the preferable range of the film thickness has been described.

As an external light enters the semiconductor layers, the active layer absorbs light having such a wavelength that a standing wave (longitudinal mode) exists in the semiconductor layer structure deposited on the distributed reflection type multilayer film mirror. The reflectivity at that wavelength will be lowered to form a recess, i.e. dip, in the reflection spectrum. Such a dip moves from the side of longer wavelengths to the side of shorter wavelengths as the film thickness of the crystal layers above the distributed reflection type multilayer film mirror decreases. With further etching, a new dip is created on the longer wavelength side. The movement and creation of dips will be repeated. By measuring the number of dips existing in the higher reflectivity zone and their movement during etching, therefore, the depth and speed of etching can be controlled. Thus, a resonator having an accurately controlled film thickness at the area other than the column-like portion or portions can be produced according to the methods of the present invention. Further, it is desirable to maintain the substrate at a predetermined temperature selected from the range between 0° and 40° C. during etching.

Since the value and shape of the reflection spectrum can simultaneously be monitored during etching, any contamination and/or damage on the surface being etched can also be estimated. The results of estimation may be fed back to the etching conditions.

It is further desirable that after the step (a), a protective film of $SiO_x$ is formed on the surface of a semiconductor layer. The protective film can prevent the semiconductor surface from being contaminated through the subsequent steps. Before the step (d), the protective film may be removed, for example, through reactive ion etching. At this time, it is desirable that light having a given wavelength is irradiated onto the substrate on which the protective film has been formed to detect its reflection spectrum and to measure the reflectivity profile which is in turn used to control the depth of etching in the protective film.

In other words, the reflectivity depends on the film thickness of the remaining protective film. Each time this film thickness is equal to or larger than an integer multiple of $\lambda/4n$ where $\lambda$ is the wavelength of a source of measurement light and n is the refractive index of the protective film, the reflectivity becomes maximum or minimum. When the protective film is completely removed, the reflectivity will no longer vary. The etching of the protective film can accurately and perfectly be performed by measuring the reflectivity during the etching and monitoring the maximum and minimum points in the reflectivity profile.

After removal of the protective film, the semiconductor layers formed in the step (a) are subsequently etched to control the length of the resonator, if necessary. It is also desirable that during this etching, light having its wavelength within a given range is irradiated onto the substrate having the semiconductor layers to detect its reflection spectrum and to measure dips appearing in the reflection spectrum due to the standing wave of the optical resonator for controlling the depth of etching. This mechanism is similar to that of the step (b). Further, etching for controlling the foregoing length of the resonator may be performed immediately after the step (a). This is advantageous in that the epitaxial layers may be etched extensively at once. Such etching uses the mechanism of the step (b) for controlling the depth of etching.

At the step (a), it is further desirable that the semiconductor layers are formed through a Metal-Organic Vapor Phase Epitaxy (MOVPE) process.

The surface emission type semiconductor laser of the present invention may be produced through the following film forming apparatus and etching apparatus.

Such a film forming apparatus for forming semiconductor layers on the substrate may comprise:

a reaction chamber having gas supply and exhaust sections;

a temperature controllable substrate support section located in the interior of said reaction tube;

an optical system for irradiating light having a given wavelength onto said substrate support section; and a photosensor for sensing the reflected light from a substrate on said substrate support section, whereby the reflectivity in the semiconductor layers being formed can be measured while forming the semiconductor layers on the substrate on the substrate support section through epitaxial growth.

As described, the film forming apparatus can extremely accurately set the film thickness of the distributed reflection type multilayer film mirror and length of resonator, for example. Since the film forming apparatus can control the film thickness while monitoring the reflectivity on the semiconductor layers, it may be applied to a molecular beam epitaxy apparatus in addition to the metal-organic vapor phase epitaxy apparatus.

An etching apparatus, which can be used in the column-like portion forming step (b) and the protective film etching step, may comprise:

an etching chamber;

a substrate support section disposed within said etching chamber;

a optical system for irradiating light having a given wavelength onto said substrate support section; and a photosensor for sensing the reflected light from said substrate support section, whereby the reflectivity can be measured while etching the layers deposited on the substrate.

As described, such an etching apparatus can accurately control the depth of etching by detecting the reflectivity profile. The etching apparatus may be applied to reactive ion etching or reactive ion beam etching.

Preferably, the windows in the film forming apparatus and in the etching apparatus are non-reflective to the light having the given wavelength and to the reflected light. The film forming apparatus and the etching apparatus of the present invention may take an optical system of various forms.

BEST MODE FOR CARRYING OUT THE INVENTION (First Embodiment)

Figure 1:
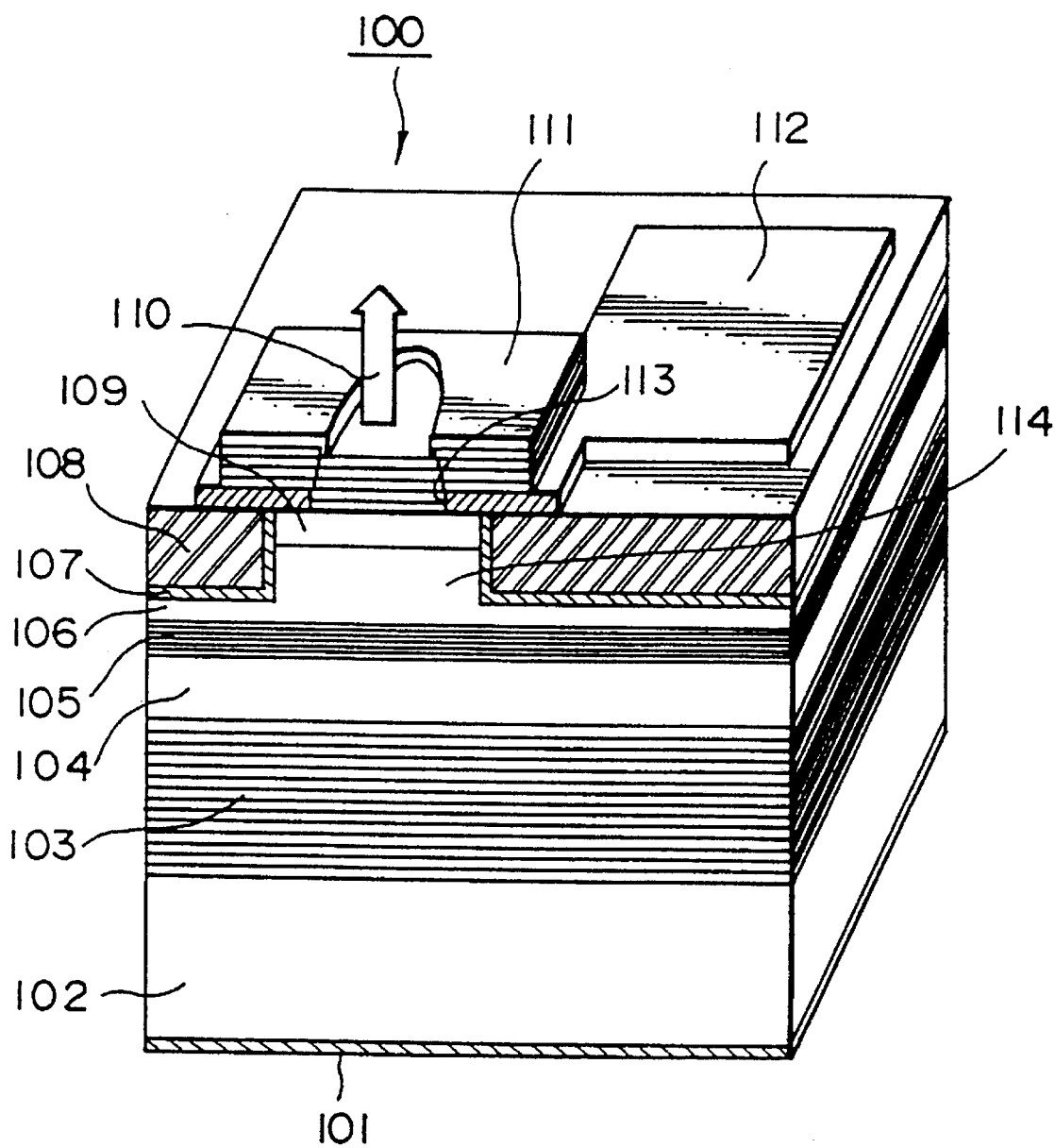
FIG. 1 is a perspective view diagrammatically showing the first embodiment of a surface emission type semiconductor laser constructed in accordance with the present invention

FIG. 1 is a perspective view showing the cross-section of a light emitting portion in a surface emission type semiconductor laser according to one embodiment of the present invention.

As shown in FIG. 1, the semiconductor laser 100 comprises a substrate 102 of n-type GaAs, a distributed-Bragg reflection type multilayer film mirror (hereinafter called "DBR mirror") 103 including 40 pairs of an n-type $Al_{0.8}Ga_{0.2}As$ layer and an n-type $Al_{0.15}Ga_{0.85}As$ layer alternately deposited one above another, and having a reflectivity of 99.5% or more relative to light having a wavelength equal to about 800 nm, a first clad layer 104 of n-type $Al_{0.7}Ga_{0.3}As$, a quantum well active layer 105 (which is of multiple quantum well (MQW) structure in this embodiment) including twenty-one pairs of an $n^-$-type GaAs well layer and an $n^-$-type $Al_{0.3}Ga_{0.7}As$ barrier layer, a second clad layer 106 of p-type $Al_{0.7}Ga_{0.3}As$ and a contact layer 109 of $p^+$-type $Al_{0.15}Ga_{0.85}As$, these layers being sequentially deposited on the substrate 102 in such an order as described. The contact layer 109 and the upper portion of the second clad layer 106 are etched into a cylindrical column-like portion 114 (hereinafter called "resonator portion", the resonator portion need not necessarily be cylindrical as will be explained later in this text). The resonator portion 114 is buried with a first insulation layer 107 of silicon oxide film ($SiO_x$ film) such as $SiO_2$ or the like and a second insulation layer 108 of heat-resistant resin such as polyimide or the like.

The first insulation layer 107 is continuously formed over the surfaces of the second clad and contact layers 106, 109 while the second insulation layer 108 is formed to bury the first insulation layer 107.

The second insulation layer 108 may be formed of any one selected from a group consisting of silicon oxide films ($SiO_x$ films) such as $SiO_2$, silicon nitride films ($SiN_x$ films) such as $Si_3N_4$, silicon carbide films ($SiC_x$ films) such as SiC, insulation silicon compound films such as SOG films ($SiO_x$ such as $SiO_2$ applied through a spin-on glass method) and polycrystalline II–VI group compound semiconductor films (e.g., ZnSe), in addition to the heat-resistant resin such as polyimide. Among them, the silicon oxide such as $SiO_2$, polyimide and SOG films are preferably used since they can be shaped at a relatively low temperature. More particularly, an SOG film is used since it can easily be shaped and flattened at its surface.

A contact metal layer (upper electrode) 112, which may be formed of Cr or Au—Zn alloy, is formed in ring-like contact with the contact layer 109. The upper electrode 112 functions as an electrode for injection of current. The other portion of the contact layer 109 not covered with the upper electrode 112 is circularly exposed. The exposed surface of the contact layer 109 (hereinafter called "opening") is fully covered with a dielectric multilayer film mirror 111 which comprises 7 pairs of an $SiO_x$ (such as $SiO_2$) layer and a $Ta_2O_5$ layer alternately deposited one above another, and which has a reflectivity ranging between 98.5% and 99.5% relative to light having a wavelength of about 800 nm. An electrode metal layer (lower electrode) 101 is formed of as of Ni or Au—Ge alloy on the underside of the n-type GaAs substrate 102.

Figure 3:
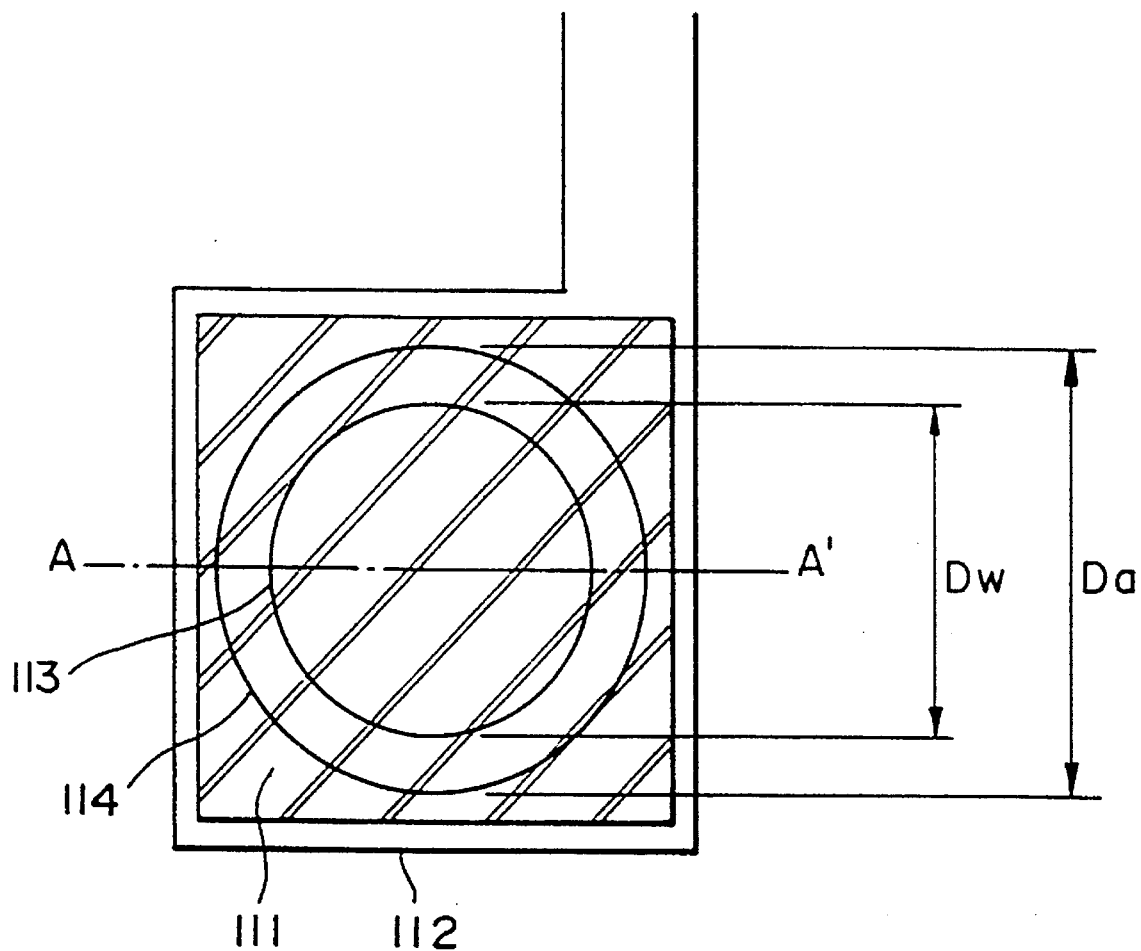
FIG. 3 is a top view of the light emitting portion in the surface emission type semiconductor laser shown in FIG. 1.

FIG. 3 is a top view of a part of laser emitting portion of the semiconductor laser shown in FIG. 1. The cross-section taken along a line A–A' in FIG. 3 corresponds to the cross-section of FIG. 1 as viewed from the front. The upper electrode 112 is alloyed such that it is in contact with the contact layer 109 to provide an ohmic contact. The dielectric multilayer film mirror 111 is formed to cover the entire surface of the resonator portion 114. It is assumed throughout the subsequent description that the diameter of the resonator portion 114 is Da and the diameter of the opening 113 is Dw, as shown in FIG. 3.

As a forward voltage is applied between the upper and lower electrodes 112, 101 (in this embodiment, the voltage is applied from the upper electrode 112 toward the lower electrode 101), a current is injected into the semiconductor laser. The injected current is converted into light at the quantum well active layer 105. The light is reciprocated and amplified between reflecting mirrors defined by the DBR mirror 103 and the dielectric multilayer film mirror 111 to form a laser beam which is emitted outwardly through the opening 113 (the exposed surface of the contact layer 109) in the first direction 110 perpendicular to the substrate 102.

The first insulation layer 107 formed of silicon oxide film ($SiO_x$ film) shown in FIG. 1 has a film thickness of 500 to 2000 Angstroms. The second insulation layer 108 of heat-resistant resin or the like is required to flatten the surface of the element. However,for example, when heat-resistant resins is used heat-resistant resins tend to include residual moisture in the film, and when an element is operated for a long time while such a heat-resistant resin is in direct contact with the semiconductor layer, voids will be produced at the interface between the heat-resistant resin and the semiconductor layer to degrade the characteristics of the element. When a thin film such as the first insulation layer 107 is inserted into the interface between the heat-resistant resin and the semiconductor layer according to one embodiment, the first insulation layer 107, in addition to other advantages, serves as a protective film to prevent such a degradation. The formation of a silicon oxide film ($SiO_x$ film) defining the first insulation layer may be made through any one of a plasma CVD method, a reactive deposition method and other methods. For such a purpose, it is most suitable to form the silicon oxide film through a normal-pressure thermal CVD method in which gaseous $SiH_4$ (mono-silane) and $O_2$ (oxygen) are used with $N_2$ (nitrogen) as a carrier gas. This is because when the film is formed by reaction at atmospheric pressure under an excessive $O_2$ condition, loss of the oxygen in the $SiO_x$ film can be depressed to provide a dense film and because the step coverage is improved to provide the side and step of the resonator portion 114 having the same film thickness as in the flattened portion.

An embodiment of the process of making the surface emission type semiconductor laser shown in FIG. 1 will be described with reference to FIGS. 22A–22C and 23D–23F which show various steps in the process.

As mentioned before, DBR mirror 103 is formed of 40 pairs of an n-type $Al_{0.15}Ga_{0.85}As$ layer and an n-type $Al_{0.8}Ga_{0.2}As$ layer alternately deposited on the n-type GaAs substrate 102 and has a reflectivity of 99.5% or more relative to light of about 800 nm. After the n-type $Al_{0.7}Ga_{0.3}As$ layer (first clad layer) 104 has been formed on DBR mirror 103, the active layer 105 of the multi-quantum well structure (MQW) is formed by alternately depositing the n⁻-type GaAs well layers and the n⁻-type $Al_{0.3}Ga_{0.7}As$ barrier layers. Thereafter, the p-type $Al_{0.7}Ga_{0.3}As$ layer (second clad layer) 106 and the p-type $Al_{0.15}Ga_{0.3}As$ layer (contact layer) 109 are sequentially deposited (see FIG. 22A).

The above layers are grown through the metal-organic vapor phase epitaxy (MOVPE) process. At this time, the growth temperature is 750° C. and the growth pressure is 150 Torr. III-group materials are organometals such as TMGa (trimethyl gallium), TMAl (trimethyl aluminum). V-group material is $AsH_3$. $H_2Se$ is used as n-type dopant and DEZn (diethyl zinc) is used as p-type dopant.

Figure 22A:
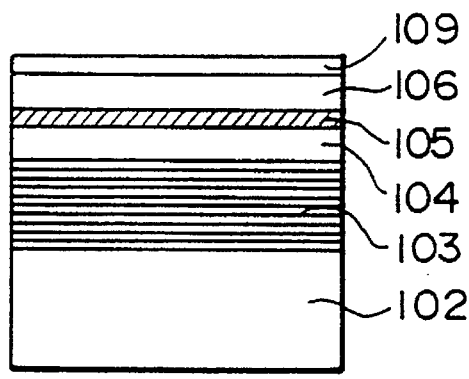
FIGS. 22A to 22C are cross-sectional views diagrammatically showing a process of making the surface emission type semiconductor laser shown in FIG. 1.
Figure 22B:
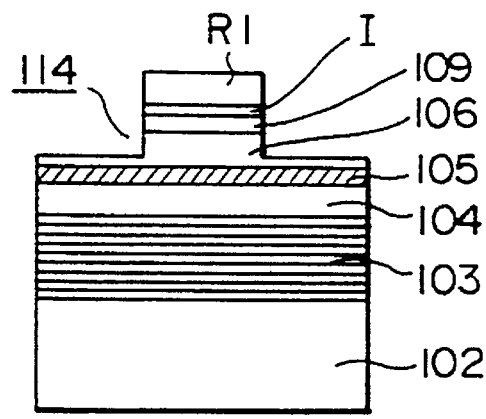
Figure 22C:
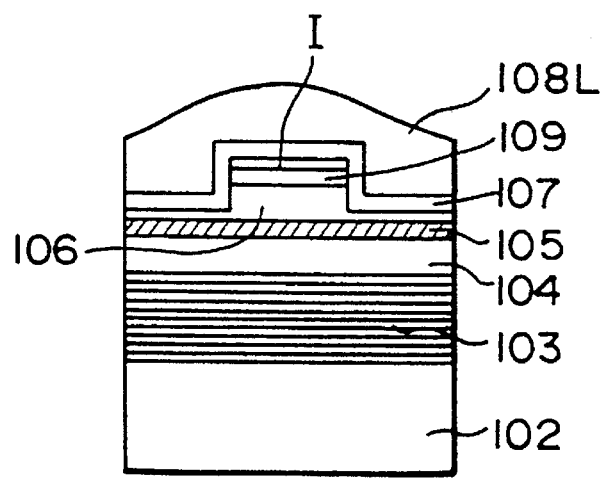

After formation of the layers shown in FIG. 22A, a protective layer I is formed on the epitaxial layer through the normal-pressure thermal CVD method, the protective layer comprising an $SiO_2$ layer having its film thickness of about 250 Angstroms. The protective layer I functions to prevent the epitaxial layers from being contaminated during the subsequent process.

In such a manner, there will be produced a wafer which comprises a lamination of the DBR mirror 103, first clad layer 104, quantum well active layer 105, second clad layer 106, contact layer 109 and protective layer I all of which are deposited on the substrate 102. A part of such a wafer is used as a sample for an edge emission type semiconductor laser which will be described later.

The protective layer I, the contact layer 109 and the upper portion of the second clad layer 106 are then etched down to the middle of the second clad layer 106 through a reactive ion beam etching (RIBE) process to leave a column-like resonator portion 114 covered with a resist pattern R1. Thus, the column-like resonator portion 114 will have the same profile as the resist pattern R1 thereon (see FIG. 22B). By use of the RIBE process, the sides of the column-like portion are substantially vertical and the epitaxial layers are not substantially damaged. For example, the RIBE process was performed at a pressure of 60 mPa by using an input microwave power equal to 150 W and an outlet voltage of 350 V with the etching gas being a combination of chlorine and argon.

In the formation of the column-like portion through the RIBE method, the temperature at the substrate 102 is preferably set at a relatively low level such as between 0° and 40° C. and more preferably between 10° C. and 20° C. Thus, the side etching in the semiconductor layers deposited on the substrate through the epitaxial growth can be controlled. If the temperature of the substrate ranges between 0° and 10° C., however, the etching rate will undesirably be lowered. If the temperature of the substrate exceeds 40° C., the etching rate undesirably increases, resulting in roughening of the etched surface and also less control of the etching rate.

Thereafter, the resist pattern R1 is removed and the SiO$_2$ layer (first insulation layer) 107 of about 1000 Angstroms is formed on the exposed surface of the epitaxial layers preferably through the normal-pressure thermal CVD method. For example, the conditions of the process are the substrate temperature of 450° C., the materials used of SiH$_4$ (monosilane) and oxygen and the carrier gas of nitrogen. SOG (spin-on-glass) film 108L is then coated on the first insulation layer 107 through a spin coating process. Thereafter, the assembly of semiconductor layers may be baked successively under an atmosphere of nitrogen at 80° C. for one minute, at 150° C. for two minutes and at 300° C. for thirty minutes (see FIG. 22C).

Figure 23D:
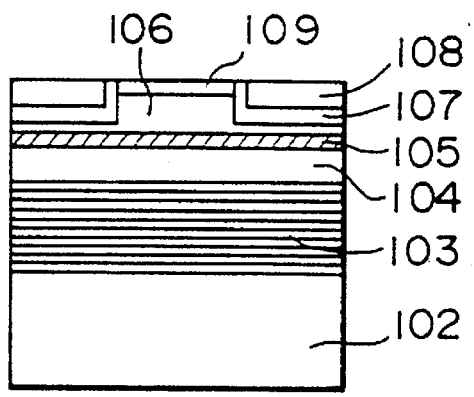
FIGS. 23D to 23F are cross-sectional views diagrammatically showing a subsequent process of making the surface emission type semiconductor laser of FIG. 1.

The SOG and SiO$_2$ films 108L, 107 and protective layer I are then etched to form a flattened surface flush with the exposed surface of the contact layer 109 (see FIG. 23D). In this case, the etching is performed through reactive ion etching (RIE) using parallel flat electrodes with the reactive gas being a combination of SF$_6$, CHF$_3$ and Ar.

Figure 23E:
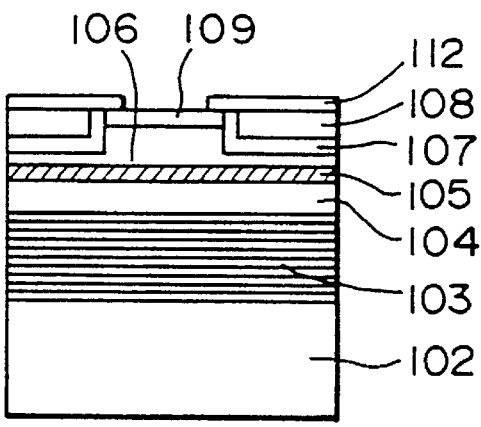
Figure 23F:
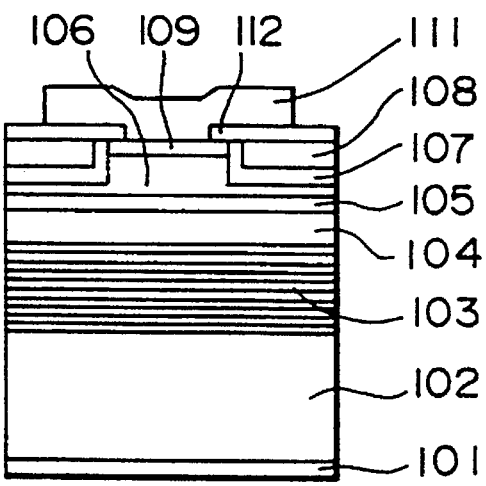

Through the known lift-off method, the upper electrode 112 is then formed in ring-shaped contact with the contact layer 109 (see FIG. 23E). The contact layer 109 is exposed through the circular opening of the upper electrode 112. Dielectric multilayer film mirror (upper mirror) 111 is formed to cover the exposed surface of the contact layer 109 through the known lift-off method (see FIG. 23F). The formation of the upper mirror 111 is accomplished as by alternately depositing seven pairs of SiO$_2$ and Ta$_2$O$_5$ layers through electron beam deposition. The upper mirror 111 has a reflectivity ranging between 98.5% and 99.5% relative to light having its wavelength of about 800 nm. For example, the speed of deposition is five Angstroms/minute for SiO$_2$ and two Angstroms/minute for Ta$_2$O$_5$.

Further, besides the foregoing lift-off method, the upper mirror 111 may be formed by etching of the RIE method.

Thereafter, a lower electrode 101 is formed of Ni or AuGe alloy on the bottom of the substrate 102 to complete a surface emission type semiconductor laser.

Although the components and producing process of this embodiment have generally been described, the primary structural features of a particular implementation of this embodiment are as follows:

(A) Quantum Well Active Layer

The quantum well active layer 105 comprises n$^-$-type GaAs well layers and n$^-$-type Al$_{0.3}$Ga$_{0.7}$As barrier layers. In this embodiment, it is an active layer of a multi-quantum well structure (MQW). The film thickness of the well layer ranges between 40 Angstroms and 120 Angstroms and is preferably equal to 61 Angstroms while the film thickness of the barrier layer ranges between 40 Angstroms and 100 Angstroms and is preferably equal to 86 Angstroms. The total number of well layers ranges between 3 and 40 and is preferably equal to 21. Thus, a surface emission type semiconductor laser can be provided in which the threshold value is lower, the output is increased, the temperature characteristics are improved and the reproducibility of the lasing wavelength is improved compared to prior art lasers.

(B) Buried Insulation Layer

The buried insulation layer is of a double-layer structure which comprises a thin silicon oxide film 107 (first insulation layer) preferably formed through the thermal CVD process and a second insulation layer (the details of the materials used have been described above) 108 buried over the first insulation layer 107. The reason of forming the first thin insulation layer 107 is because the second insulation layer 108 subsequently formed contains many impurities (e.g., sodium, chlorine, heavy metals, water and others). Such impurities should be prevented from diffusing into the second clad layer 106 and/or quantum well active layer 105 under heat or the like. Therefore, the first insulation layer 107 is required to have a sufficient film thickness for blocking the ingress of the impurities. When the thin first insulation layer 107 is formed through the thermal CVD process, it is finer than the second insulation layer 108 subsequently formed thereover. In this embodiment, to avoid any affection to the laser element from the thermal CVD process, the double-layer structure is formed by combining the thin first insulation layer 107 with the second insulation layer 108 which is not fine but can be formed at a lower temperature.

This embodiment is also characterized by that the buried insulation layer does not reach the quantum well active layer 105 or at least not extend below its uppermost surface, that is, the second clad layer 106 outside the column-like portion is left by a predetermined thickness (t) between the first insulation layer 107 and the quantum well active layer 105. For such a reason as will be described, the remaining film thickness $t$ preferably ranges between 0 and 0.58 μm and more preferably between 0 and 0.35 μm. In the surface emission type semiconductor laser, thus, the current can be injected effectively into the active layer with improved efficiency and reliability.

(C) Dielectric Multilayer Film Mirror

The dielectric multilayer film mirror 111 consists of seven pairs of an SiO$_x$ such as SiO$_2$ and a Ta$_2$O$_5$ layer which are alternately deposited and has a reflectivity ranging between 98.5% and 99.5% relative to light having its wavelength of about 800 nm. The Ta$_2$O$_5$ layer may be replaced by any one of ZrO$_x$, ZrTiO$_x$ or TiO$_x$. Similarly, the S$_i$O$_x$ layer may be replaced by any one of MgF$_2$, CaF$_2$, BaF$_2$ and NlF$_2$. Thus, the surface emission type semiconductor laser can have a lowered threshold current with the external differential quantum efficiency being improved.

Figure 46:
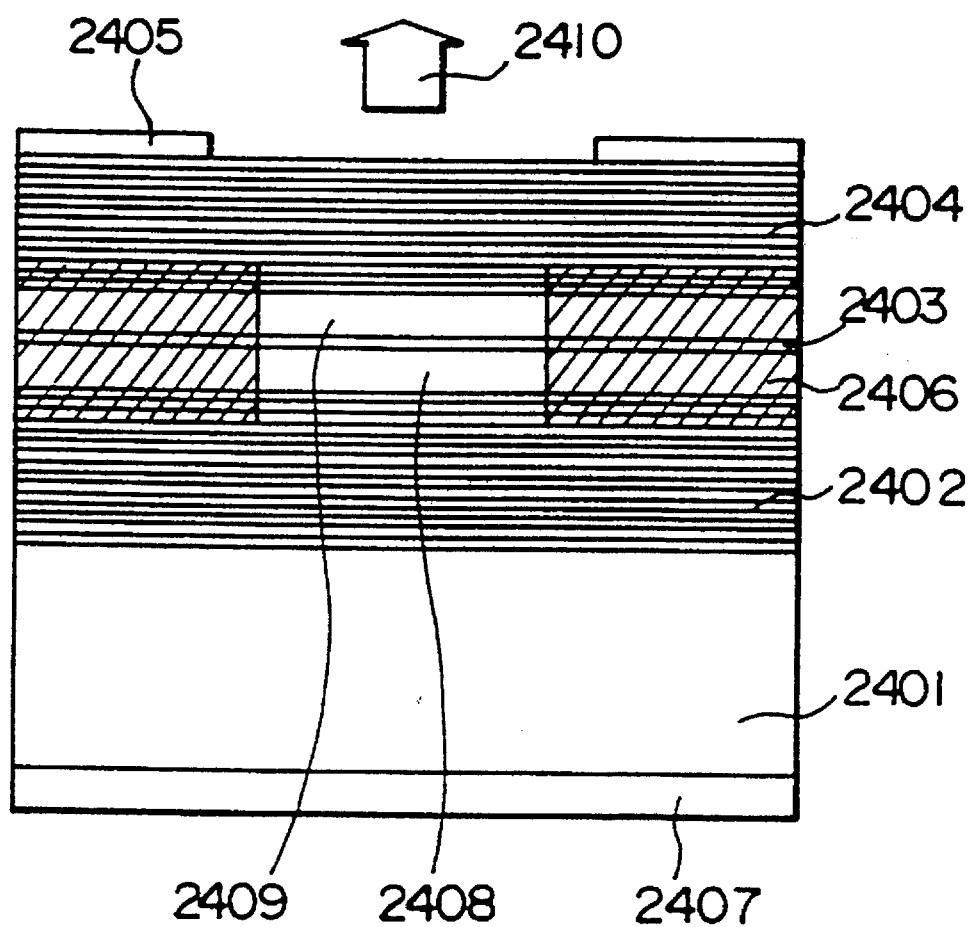
FIG. 46 is a cross-sectional view showing still another surface emission type semiconductor laser constructed in accordance with the prior art.

More particularly, the surface emission type semiconductor laser of this embodiment is characterized by that a laser resonator is formed by the n-type DBR mirror 103 and dielectric multilayer film mirror 111 without inclusion of such a prior art p-type DBR mirror as shown in FIG. 46. The prior art raises a problem in that the number of layers of the multi-layer mirror is required to be increased to increase the reflectivity of the p-type DBR mirror, thereby very much increasing the resistance of the p-type DBR mirror. On the contrary, the embodiment of the present invention is characterized by that the dielectric multilayer film mirror 111 is used without use of any p-type DBR mirror. This provides the following advantages:

(1) The laser of this embodiment will not have an increased resistance since the injected current flows through the contact and second clad layers 109, 106.

Namely, the series resistance in the device can be reduced to decrease the voltage at the threshold current ($I_{th}$) (which voltage will be called "threshold voltage" and designated "$V_{th}$"). This depresses heat produced in the device due to the injected current. As a result, the external differential quantum efficiency can be improved to increase the laser light output.

(2) Since the dielectric multilayer film mirror is formed after crystal growth in the clad, active and other layers, the surface emission type semiconductor laser can be produced to have its resonator length accurately matching the resonant conditions. The control of the resonator length will be described in more detail.

Figure 2:
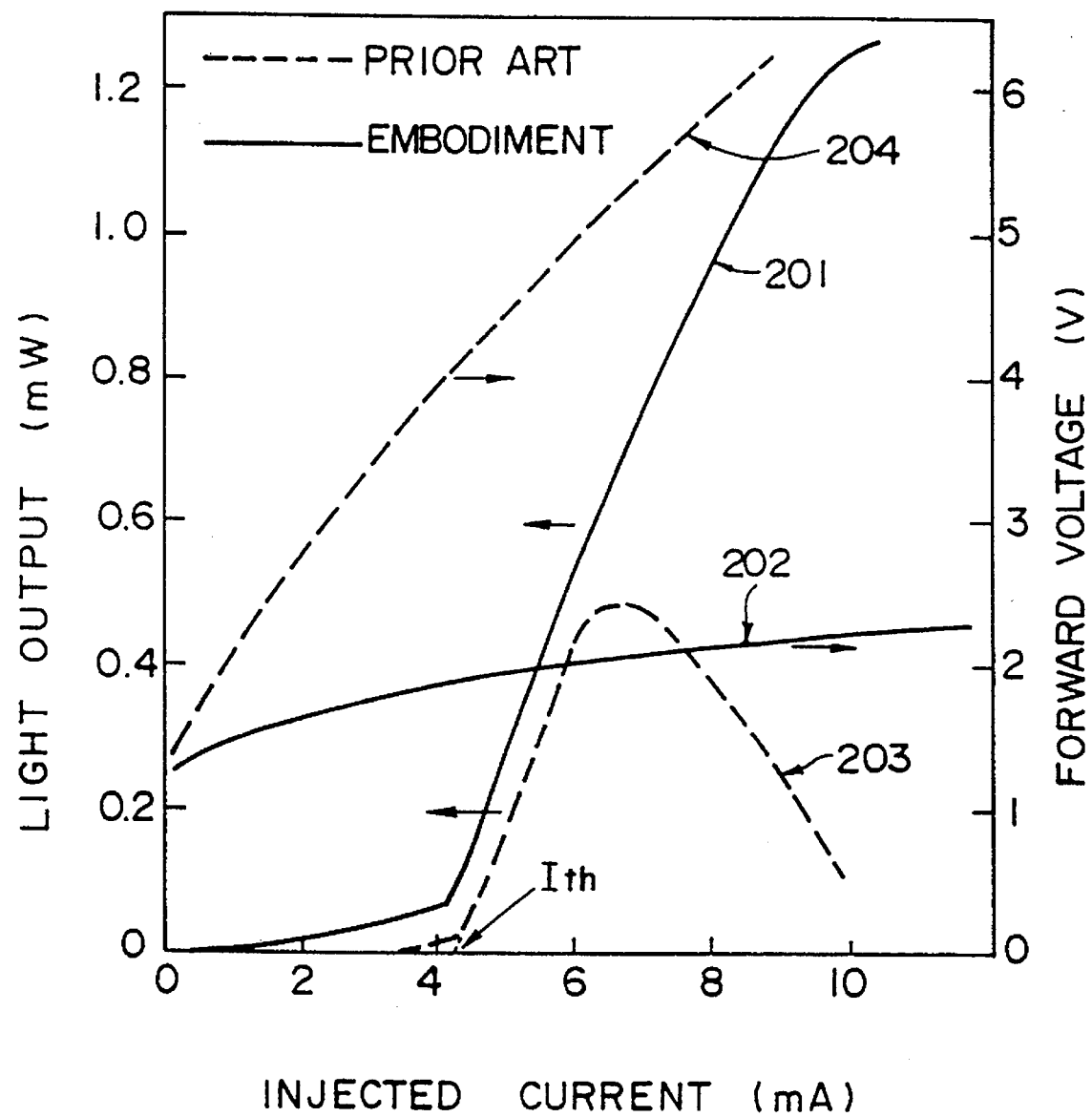
FIG. 2 is a graph illustrating the I–L and the I–V characteristics in the surface emission type semiconductor laser shown in FIG. 1 as well as a surface emission type semiconductor laser constructed in accordance with the prior art and shown in FIG. 46.

FIG. 2 collectively shows the relationships between the injected current and the light output (hereinafter called "I–L characteristic") and between the injected current and the forward voltage (hereinafter called "I–V characteristic") in the surface emission type semiconductor lasers constructed respectively according to the embodiment of the present invention shown in FIG. 1 and to the prior art shown in FIG. 46. In FIG. 2, solid lines 201 and 202 indicate the I–L and I–V characteristics in this embodiment, respectively. Broken lines 203 and 204 show the I–L and I–V characteristics in the prior art, respectively. As will be apparent from a comparison between the I–V characteristics, the resistance in the device of the present invention is largely different from that of the prior art. It is also found that the device resistance of this embodiment is smaller than that of the prior art using the p-type DBR mirror by one or more orders. The device resistance of this embodiment is equal to about 50Ω while the device resistance of the prior art is equal to about 600Ω. Furthermore, the threshold voltage $V_{th}$ (the voltage of the I–V characteristic relative to the current of the I–L characteristic) in the prior art is equal to about 4.0 V while the threshold voltage $V_{th}$ of this embodiment is lower than one-half that of the prior art or equal to about 1.9 V. Thus, the surface emission type semiconductor later of this embodiment can depress heat from the injected current into the device and output the light up to a higher current region without thermal saturation.

As will be apparent from the I–L characteristics of FIG. 2, the surface emission type semiconductor laser of the prior art can at most provide a light output equal to about 0.4 mW since the light output will be saturated at about 6 mA due to heat from the higher resistance in the device. On the contrary, the I–L characteristic of this embodiment can provide a light output of 1.2 mW since the light output is not saturated even at about 10 mA.

Figure 4:
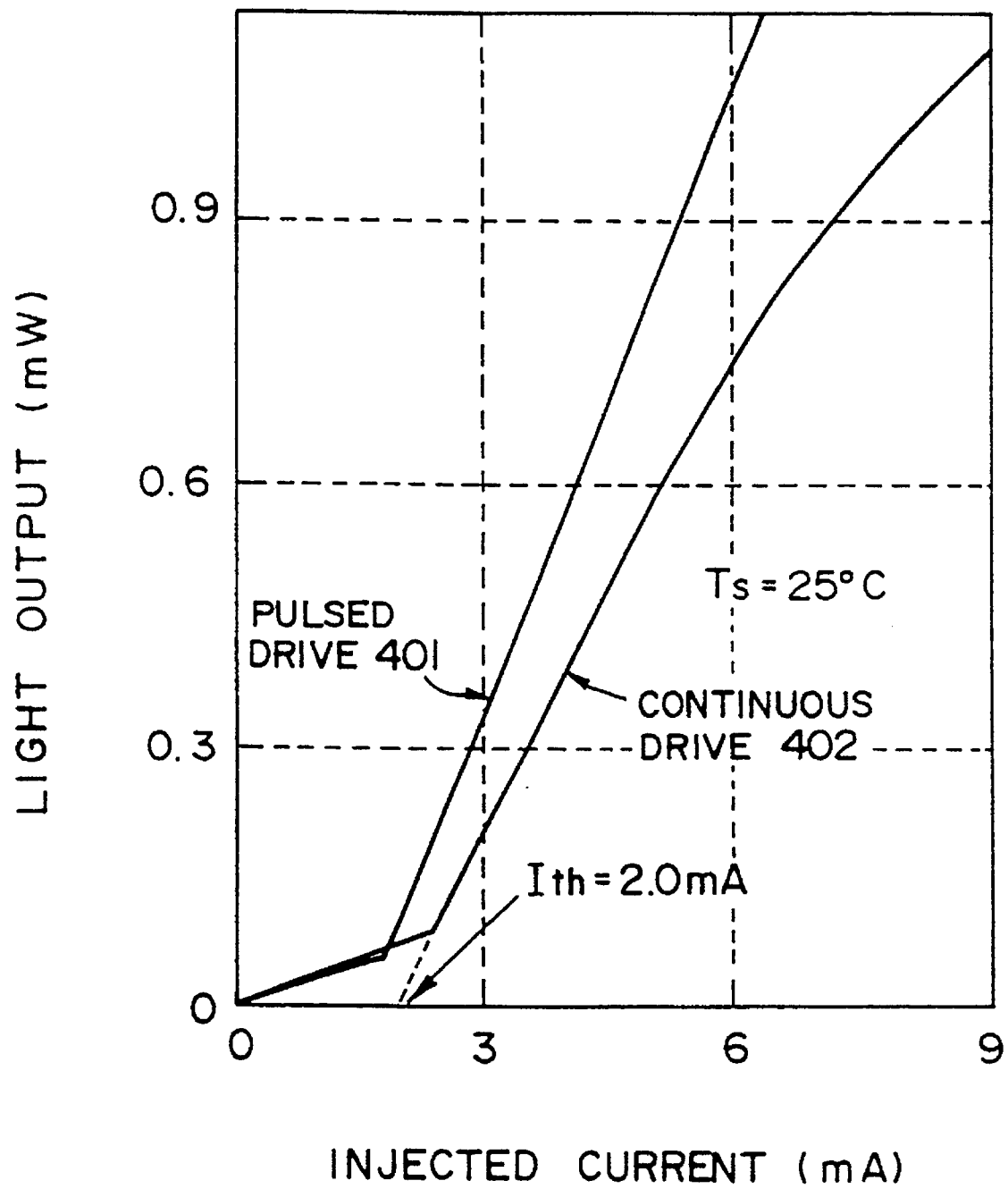
FIG. 4 is a graph showing the relationship between the injected current and the light output in the surface emission type semiconductor laser shown in FIG. 1.

FIG. 4 provides the I–L characteristics showing the relationship between the injected current and the light output in the surface emission type semiconductor laser of this embodiment. These I–L characteristics are determined from a sample of the surface emission type semiconductor laser as shown in FIGS. 1 and 3 under such conditions that Dw (diameter of the laser beam emitting portion or opening 113) is equal to 6 μm; Da (diameter of the resonator portion 114) is equal to 8 μm; the film thickness of the GaAs well layer in the quantum well active layer 105 is equal to 61 Angstroms; the film thickness of the $Al_{0.3}Ga_{0.7}As$ barrier layer is equal to 86 Angstroms; and the lasing wavelength is equal to 800 nm. The characteristic curve 401 shows results provided when the aforementioned surface emission type semiconductor laser is driven with pulsed current having a pulse width of 200 nsec and a repetitive frequency of 10 kHz while the characteristic curve 402 indicates results provided when the same surface emission type semiconductor laser is continuously driven with direct current. In both cases, the surface emission type semiconductor laser begins to initiate the lasing with clear thresholds with the threshold current for the continuous drive being very low or equal to 2 mA. The threshold current of the pulse drive is even lower than that of the continuous drive, thereby increasing the external differential quantum efficiency once lasing has started. It is found that the continuous drive is more affected by the rising temperature of the laser element due to the injected current and that as the injected current increases, the linearity of the I–L characteristic will be degraded. To provide a practical surface emission type semiconductor laser, it is important that the threshold current is low and the external differential quantum efficiency is high, thereby reducing the drive current as much as possible.

The embodiment of the present invention will be described in more detail with reference to FIGS. 5A and 5B which illustrate how the drive current can be reduced. The surface emission type semiconductor laser shown in FIG. 5A is a comparison device.

Figure 5A:
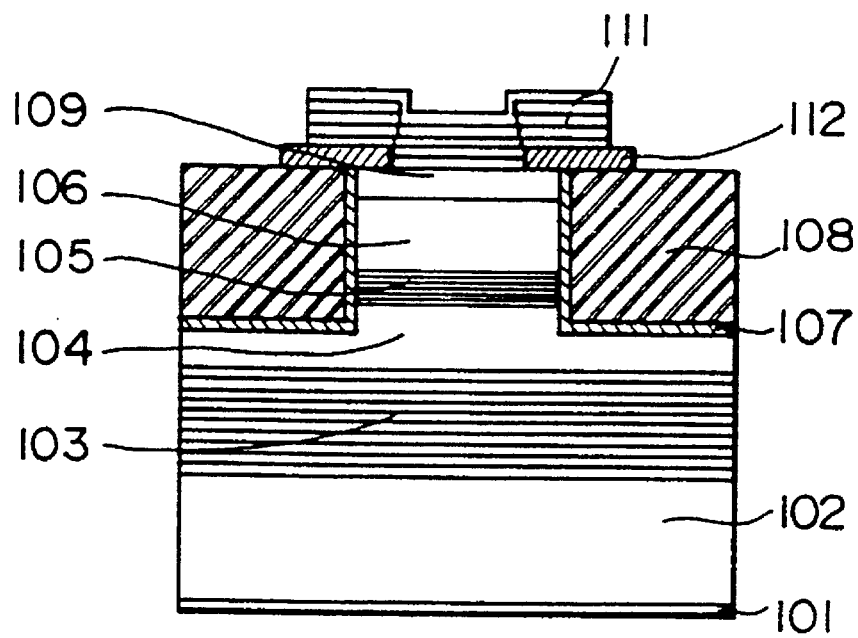
FIG. 5A is a cross-sectional view diagrammatically showing an element etched to its active layer in a control surface emission type semiconductor laser.

Referring to FIG. 5A, the cross-section thereof is different from the cross-section of FIG. 1 as viewed from the front in that the buried insulation layer is fully burying the quantum well active layer 105. More particularly, FIG. 5A shows the cross-sectional structure of the surface emission type semiconductor laser in which the contact layer 109, second clad layer 106, quantum well active layer 105 and part of the n-type clad layer 104 are etched through the reactive ion beam etching process to form a column-like portion, the column-like portion being then buried by the first insulation layer 107 of silicon oxide film ($SiO_x$ film) and the second insulation layer 108 of polyimide.

Figure 5B:
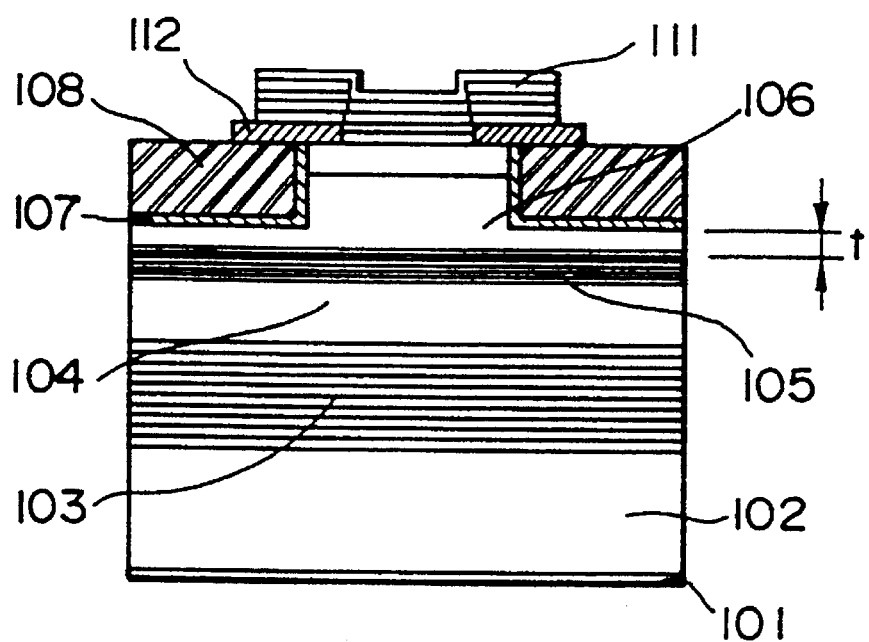
FIG. 5B is a cross-sectional view diagrammatically showing the surface emission type semiconductor laser shown in FIG. 1.

FIG. 5B shows the cross-section structurally similar to that of FIG. 1 viewed from the front. As will be apparent from this figure, the etching is made without reaching the quantum well active layer 105 as in FIG. 5A. The etching step is terminated at the middle of the second clad layer 106 of p-type $Al_{0.5}Ga_{0.5}As$ to leave the column-like portion which is buried in the same manner as in FIG. 5A. The film thickness of the remaining second clad layer portion 106 is designated "t" as shown in FIG. 5B.

Any possible problem raised by the structure of FIG. 5A will be described with reference to experimental results shown in FIG. 6.

Figure 6:
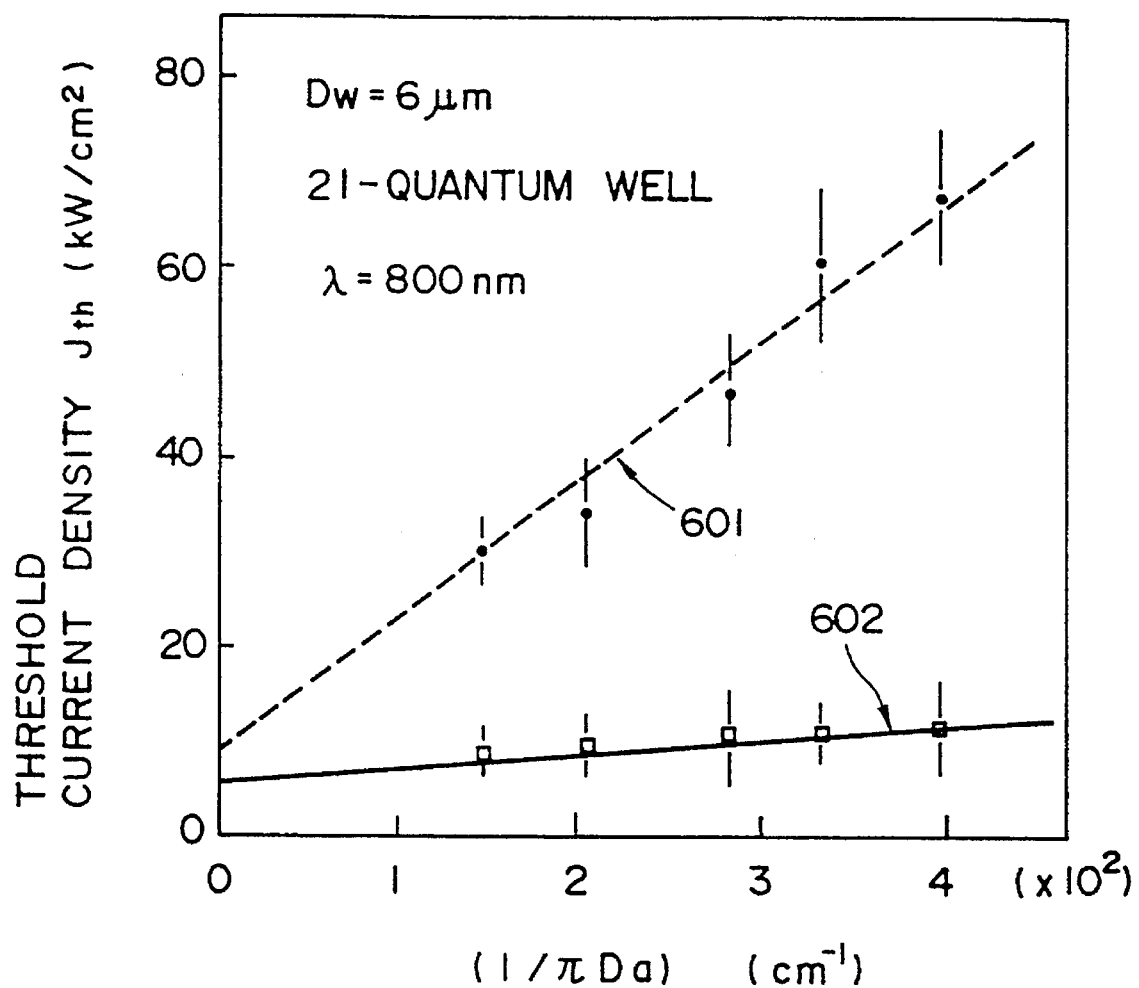
FIG. 6 is a graph illustrating the relationship between a number inversely proportional to the resonator diameter and the threshold current density in the surface emission type semiconductor laser shown in FIG. 1.

A straight line 601 in FIG. 6 shows the relationship between the threshold current density $J_{th}$ (lasing threshold current $I_{th}$ divided by the area of the resonator portion having its diameter Da) and $1/\pi Da$ in the surface emission type semiconductor laser of such a structure as shown in FIG. 5A. The values $J_{th}$ are determined by measuring the lasing threshold current $I_{th}$ with respect to a plurality of laser elements which are produced while maintaining the opening diameter Dw at a constant level of 6 μm and only varying the diameter Da of the resonator portion. When, during the etching for structuring the resonator portion(s), the quantumwell active layer 105 is etched and its sides exposed so that they will be in contact with the first insulation layer 107 as in FIG. 5A, an interface recombination current will flow along the contact plane and may provide a leak current which in turn increases the lasing threshold current $I_{th}$. The lasing threshold current $I_{th}$ is represented by the following formula (1) if there is an interface recombination current.

$$J_{th} = \frac{I_{th}}{\pi (Da/2)^2} = J_o + \frac{4\pi e N_{th} d_a v_s}{Da} \qquad \text{Formula (1)}$$

where $J_0$ is the threshold current density in case of no leak current; e is the charge of an electron; $N_{th}$ is a threshold carrier density; $d_a$ is the film thickness of the active layer; and $v_s$ is an interface recombination speed. As will be apparent from the formula (1), the value $J_{th}$ will have a component inversely proportional to the diameter Da of the resonator portion if the interface recombination current exists. As the interface recombination current increases, the rate of change of the value $J_{th}$ relative to 1/Da also increases. The interface recombination current reduces the light emission efficiency since the interface recombination current is a leak current which does not contribute to light emission but which undesirably increases the value $I_{th}$ and, thus, the joule effect heat.

A straight line 602 of FIG. 6 shows results provided from the surface emission type semiconductor laser of this embodiment shown in FIG. 5B. As will be apparent from FIG. 6, the value $J_{th}$ does not substantially depend on the value (1/Da) and the threshold current is reduced since the etching is not performed up to the quantum well active layer 105, that is, since there is not any interface between the quantum well active layer 105 and the buried insulation layer. It is found that it is particularly important for the structure of the surface emission type semiconductor laser that when the resonator portion is formed, the second clad layer 106 is caused to have the remaining film-thickness $t$ in order to eliminate the interface recombination current.

If the remaining film-thickness $t$ of the second clad layer 106 is too thick, the injected carriers are more spread to increase the value $I_{th}$. Therefore, the etching must be terminated at an appropriate depth. It is most preferred that the etching is just terminated at the interface between the second clad layer 106 and the quantum well active layer 105 or that the remaining film thickness $t$ of the second clad layer becomes equal to zero. This may lead to difficulties with respect to the manufacturing technique. Theoretically, however, there is no problem. It is sufficient not substantially to etch the active layer below the second clad layer.

Figure 7:
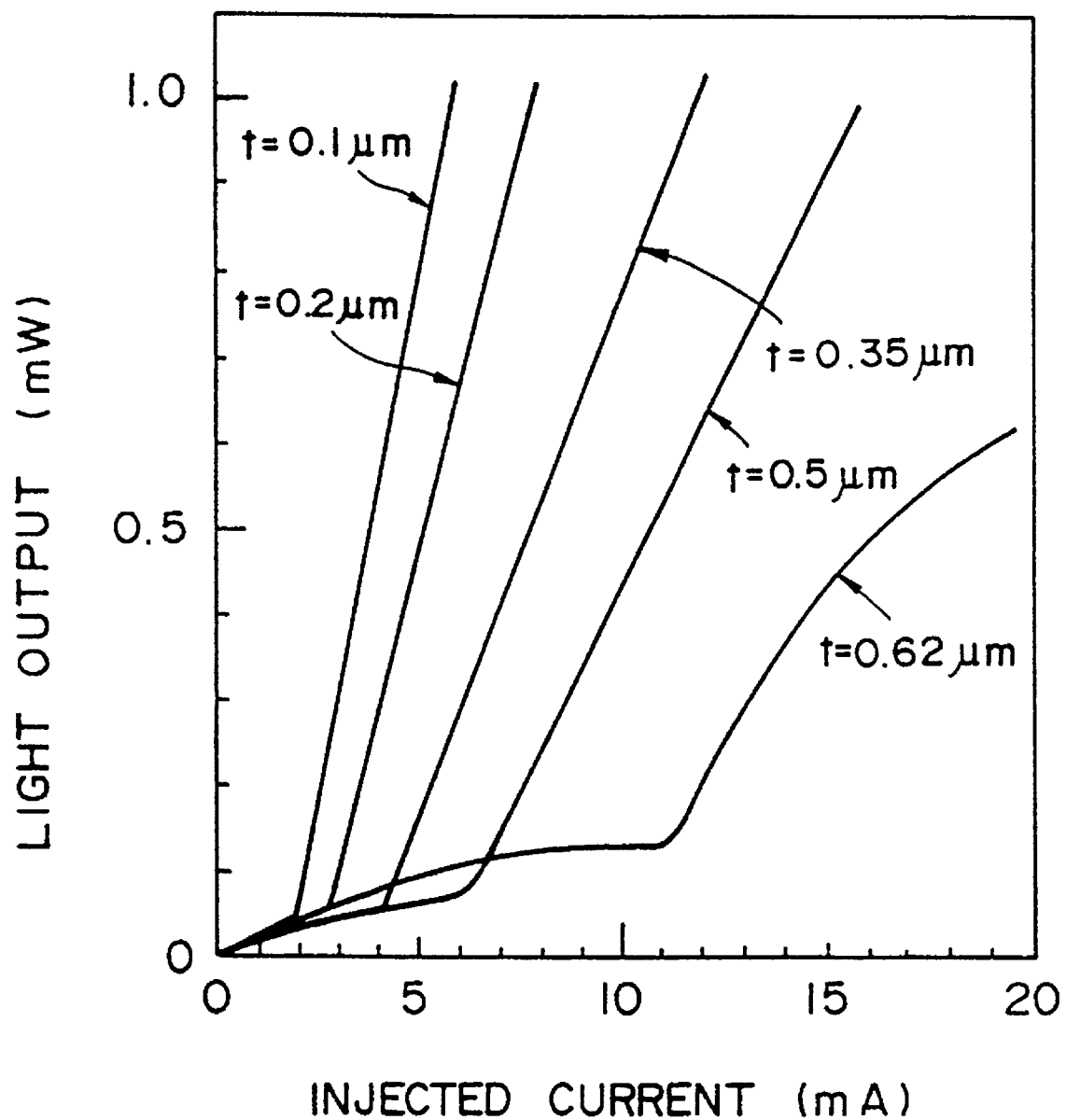
FIG. 7 is a graph of the relationship between the injected current and the light output in the surface emission type semiconductor laser shown in FIG. 1, showing the dependency of such a relationship on the remaining film thickness $t$ of the clad layer.

FIG. 7 collectively shows the I–L characteristics in a plurality of surface emission type semiconductor lasers constructed according to the embodiment of the present invention and being different from one another with respect to the remaining film thickness $t$ of the etched second clad layer 106. On determination of these I–L characteristics, a plurality of laser elements, each with a different remaining film thickness $t$, are driven in the continuous manner with a lasing wavelength of 800 nm, each laser element having a resonator portion 114 having its diameter Da of 8 µm, an opening 113 having its diameter Dw of 6 µm, a quantum well active layer 105 having a quantum well of 21 layers. As can be seen from FIG. 7, if the value $t$ is larger than 0.62 µm, the value $I_{th}$ becomes equal to or larger than 10 mA and the external differential quantum efficiency will be reduced to create the immediate heat saturation of the light output.

A preferred numerical range of the remaining film thickness $t$ of the second clad layer will be described with reference to FIG. 8.

Figure 8:
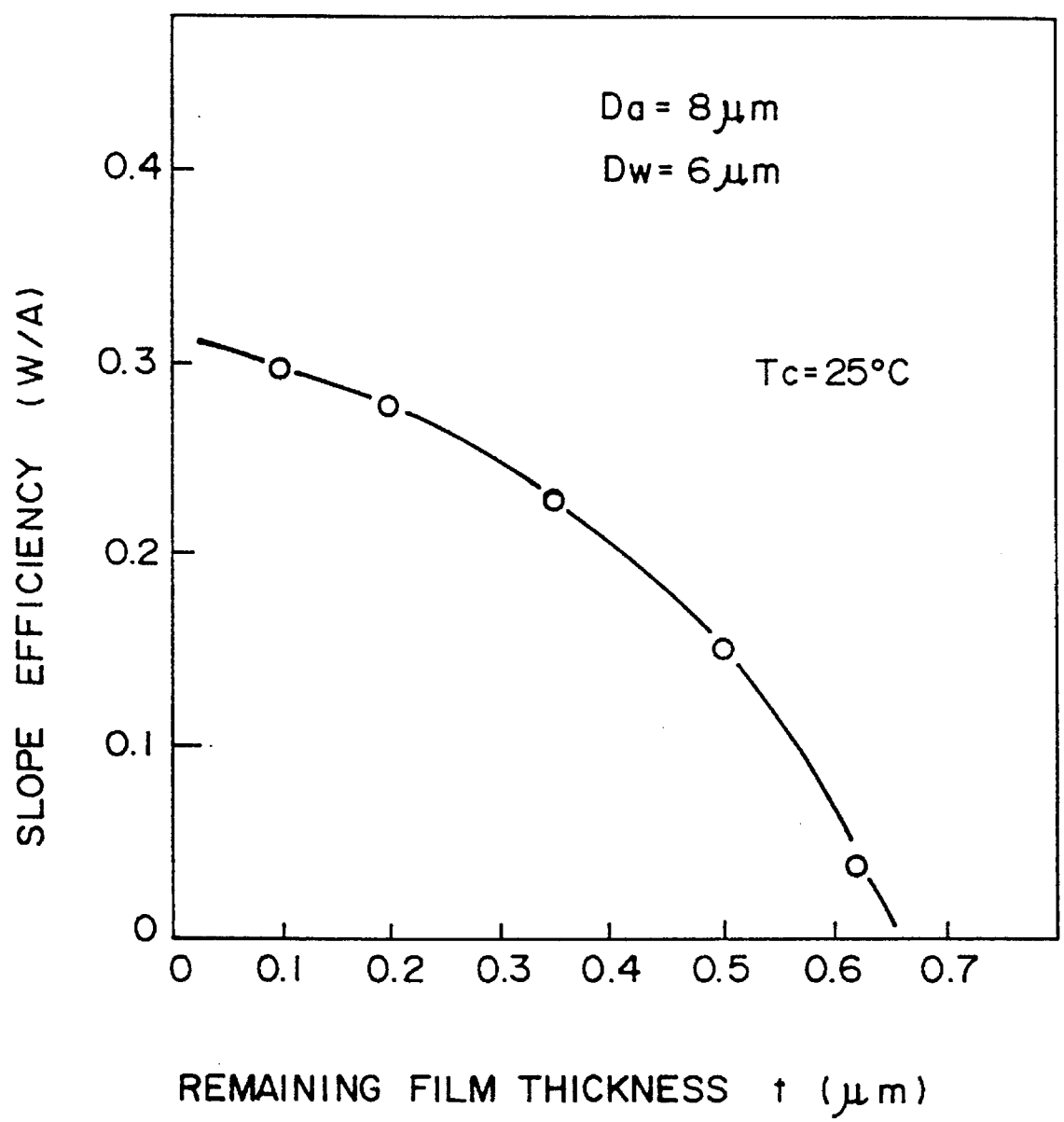
FIG. 8 is a graph of the relationship between the remaining film thickness $t$ of the clad layer and the external differential quantum efficiency (slope efficiency) in the surface emission type semiconductor laser shown in FIG. 1.

Referring to FIG. 8, a vertical axis represents a gradient (slop efficiency) showing the external differential quantum efficiency while a horizontal axis indicates the remaining film thickness $t$ of the clad layer. If the slope efficiency is 0.1 (i.e., 10%), the light output at most reaches 1 mW even through the current of 10 mA. Generally, the current of 10 mA is substantially a limit level almost equal to a heat saturation current for the laser elements. Therefore, a practically required gradient should be equal to or larger than 0.1 wherein the remaining film thickness $t$ becomes equal to about 0.58 µm. For such a fact, the remaining film thickness $t$ preferably ranges between 0 and 0.58 µm. If the surface emission type semiconductor laser is to be used, for example, in a printer, the necessary light output is preferably equal to 2 mW and more preferably 2.5 mW. At such a time, the remaining film thickness $t$ preferably ranges between 0 and 0.4 µm and more preferably between 0 and 0.3 µm.

The structural feature of the present invention resides in the structure of the quantum well active layer 105 as already described briefly. This will be described in more detail with reference to FIG. 9.

Figure 9:
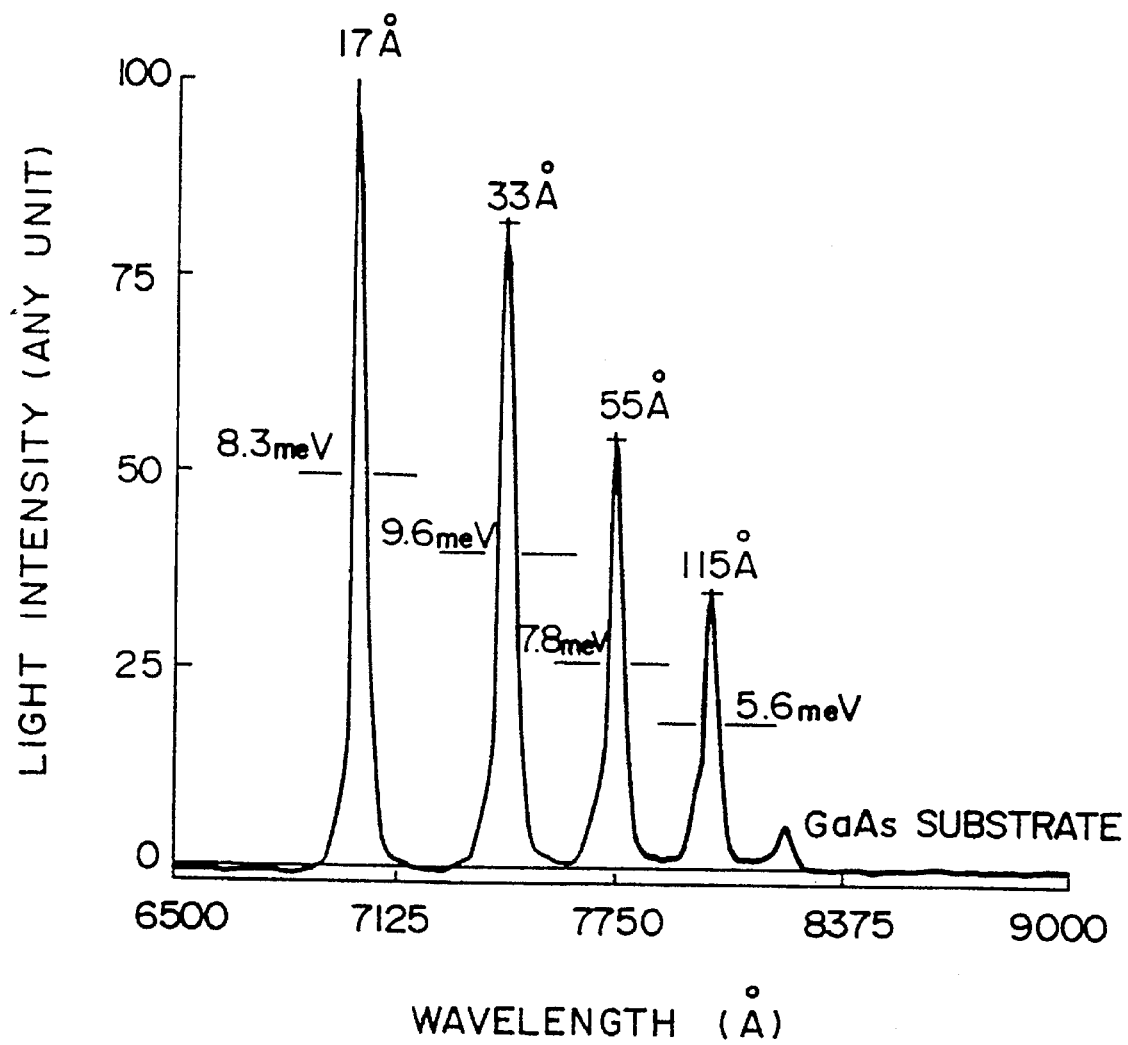
FIG. 9 is a graph of the relationship between the wavelength and the light emission spectrum when the film thickness of a single quantum well is changed to various values in the surface emission type semiconductor laser shown in FIG. 1.

FIG. 9 shows measurements of the photo luminousness spectrum from a single quantum well structure which is grown through the MOVPE method according to the present invention. All measured samples had a single quantum well layer, each with a different film thickness, which was formed on the GaAs single-crystal substrate through the $Al_{0.3}Ga_{0.7}As$ barrier layer having its film thickness of 500 Angstroms. Measurements were carried out by cooling the samples down to the temperature of liquid nitrogen (77K), irradiating an argon laser beam of 300 mW onto the cooled samples and receiving luminous light which was in turn subjected to spectral analysis by a spectroscope. It is observed that as the film thickness of the quantum well decreases, the energy level increases and that a sharp emission spectrum is produced at a shorter wavelength. FIG. 9 shows emission peak wavelengths corresponding to the respective quantum well film thickness (17, 33, 55 and 115 Angstroms from the leftmost peak in FIG. 9) and their full-width at half maximum (8.3, 9.6, 7.8 and meV from the leftmost side in FIG. 9).

Figure 10:
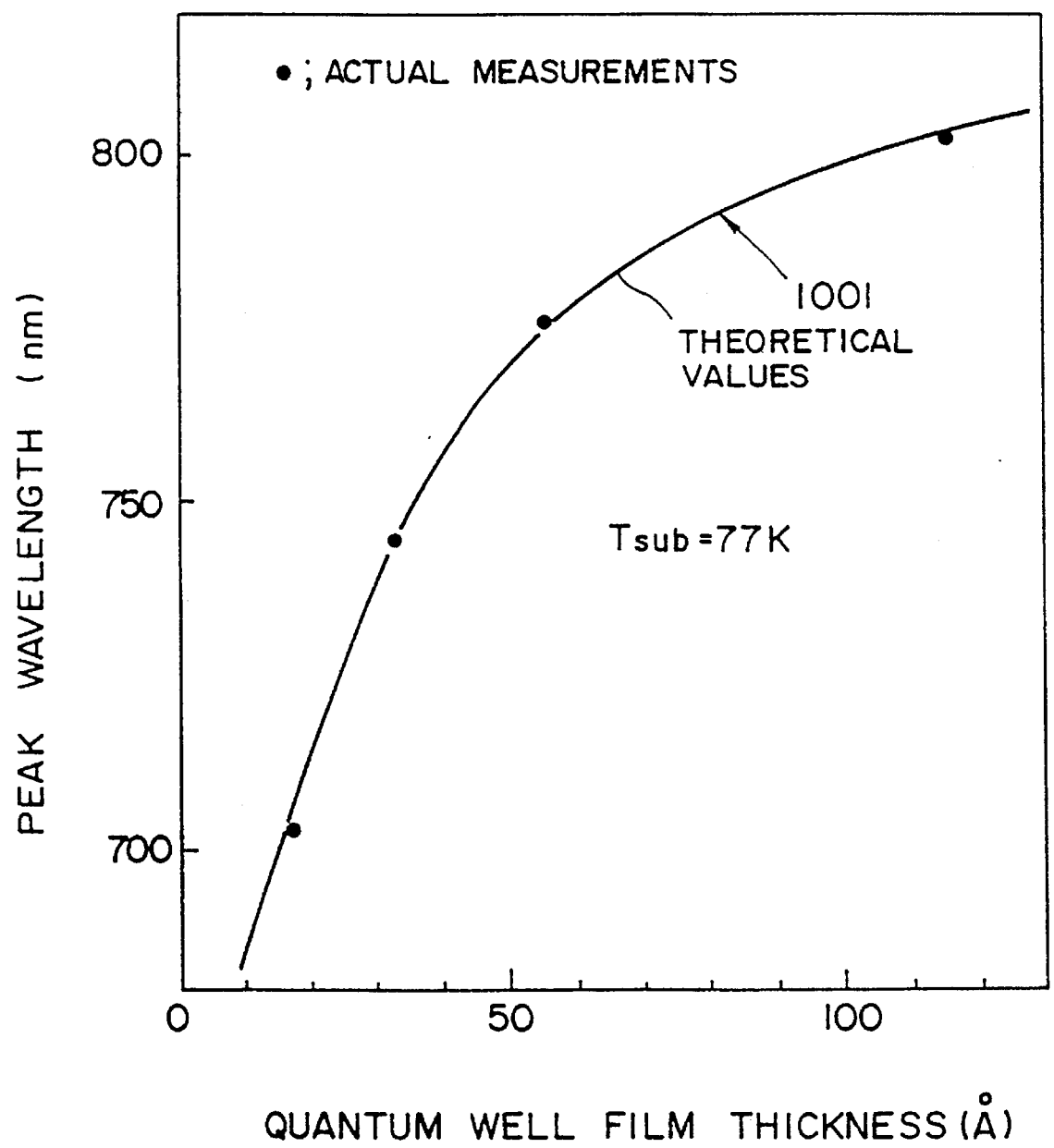
FIG. 10 is a graph of the relationship between the film thickness of the single quantum well and the light emission peak wavelength in the surface emission type semiconductor laser of FIG. 1, showing the theoretical values (solid line) and the actual measurements (dots).

Referring now to FIG. 10, a solid line 1001 shows results determined by theoretically calculating the relationship between the film thickness of the quantum well (horizontal axis) and the corresponding peak wavelength (vertical axis). Dots (black-colored circles) are provided by plotting the measurements shown in FIG. 9. From FIG. 10, it is found that the actual measurements substantially coincide with the theoretical values. This means that the quantum well structure is formed substantially into a theoretical form.

Figure 11:
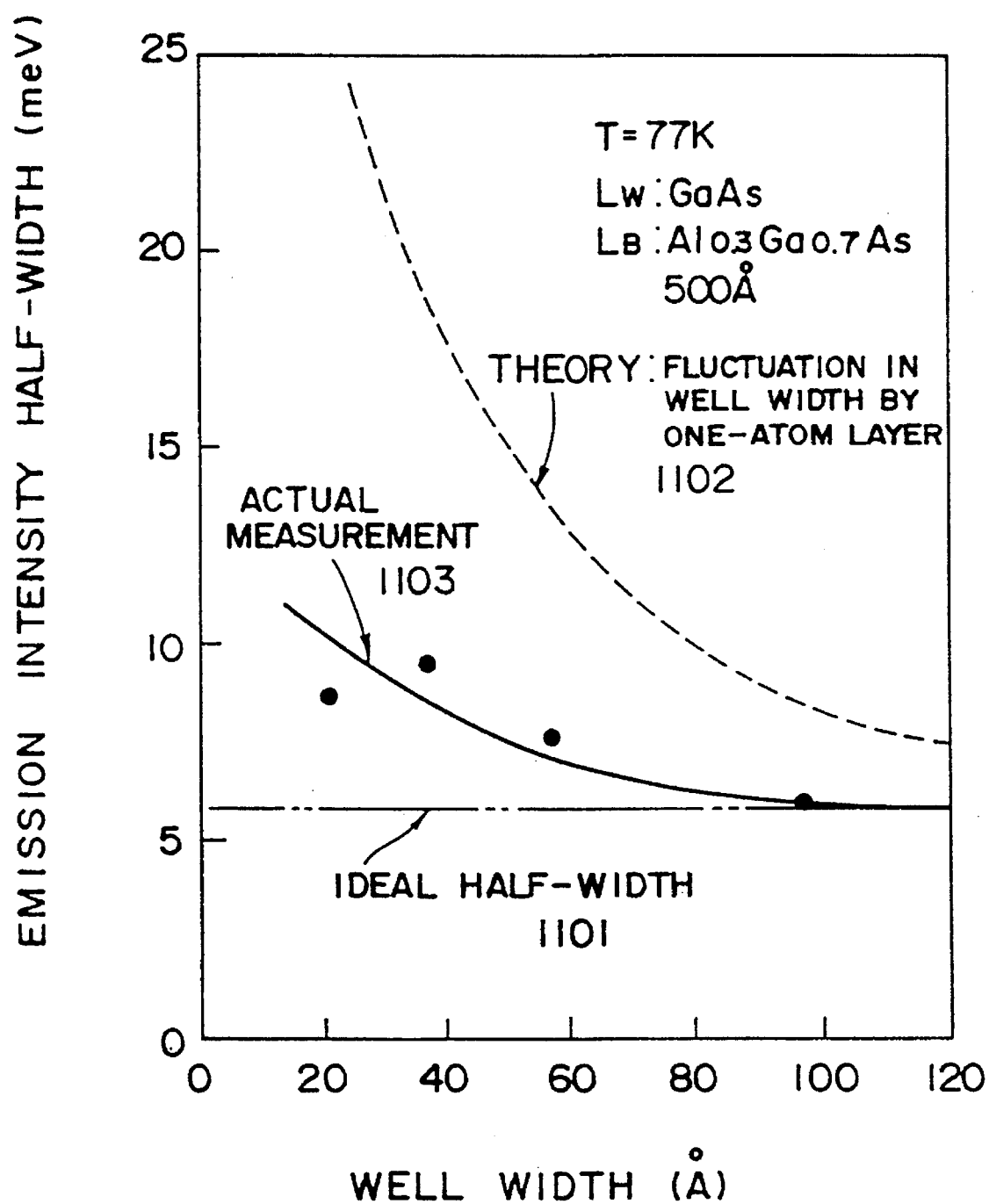
FIG. 11 is a graph of the relationship between the width of the single quantum well and the emission intensity half-width in the surface emission type semiconductor laser of FIG. 1, showing the theoretical values and the actual measurements.

FIG. 11 shows actual measurement results provided by theoretically determining the relationship between the emission intensity half-width and the width of the quantum well. In FIG. 11, a broken line 1101 shows theoretically calculated full-width at half maximum values while another broken line 1102 shows results provided when the spread of the full-width at half maximum relative to the well width is theoretically calculated if the quantum well width includes an irregular one-atom layer. A solid line 1103 and dots indicate actual measurements. As will be apparent from FIG. 11, this embodiment of the present invention provides a substantially ideal quantum well in which the full-width at half maximum is sufficiently narrower than that of the quantum well having a fluctuation of one-atom layer.

Such a quantum well structure having no fluctuation of one-atom layer may be produced by improving the crystal growth device according to the MOVPE method.

As described, if a single quantum well can be produced, a plurality of such single quantum wells may successively be deposited one above another to form a multiple quantum well structure. The quantum well active layer of the surface emission type semiconductor laser requires the injected carriers to be confined within the active layer and to be distributed evenly in the quantum well so as to make the amplification of light.

Figure 12:
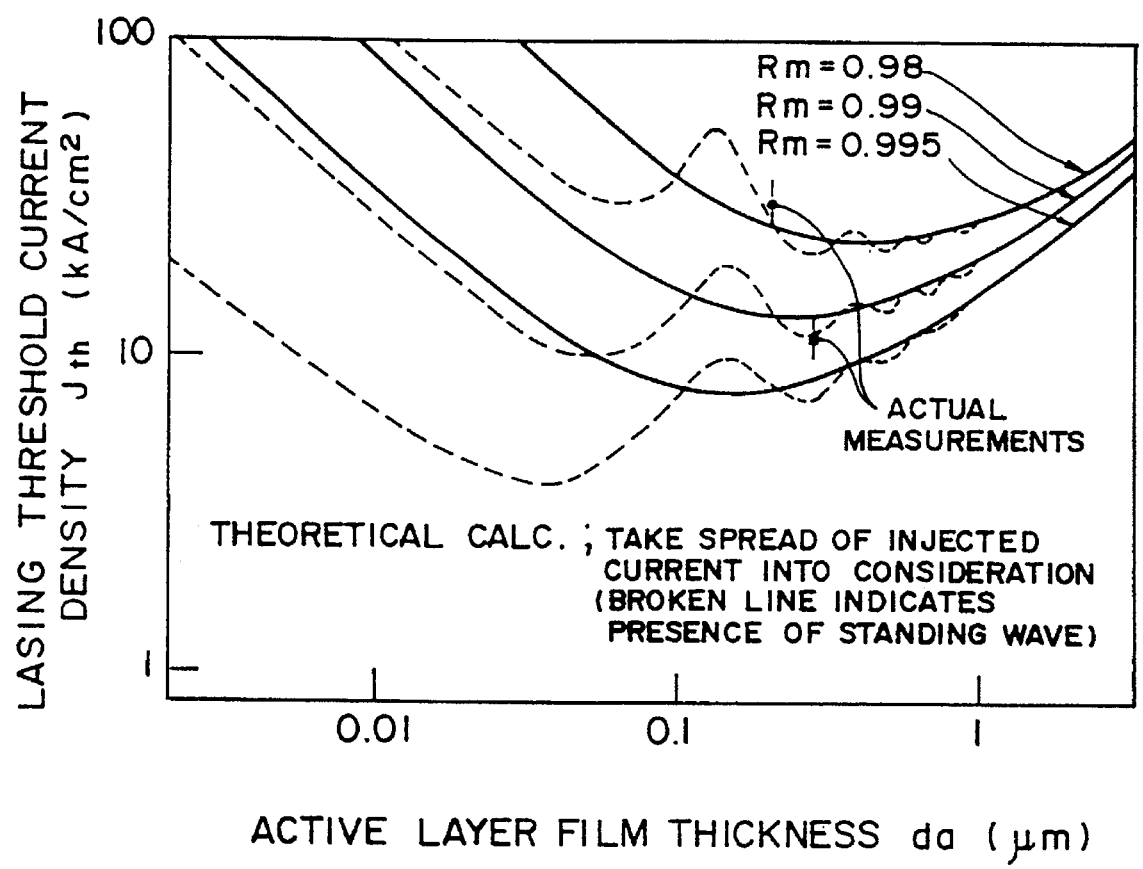
FIG. 12 is a graph of the relationship between the film thickness of the active layer and the threshold current density in the surface emission type semiconductor laser of FIG. 1, showing the theoretical values and the actual measurements.

To accomplish reduction of the threshold current in the surface emission type semiconductor laser, it is further useful to optimize the film thickness of the active layer, taking the standing waves within the resonator into consideration. FIG. 12 shows theoretically calculated variations of the threshold current density $J_{th}$ relative to the entire film thickness of the active layer. FIG. 12 shows variations of the average reflectivity $R_m$ $(=(R_r \cdot R_f)^{1/2})$ of the Fabry-Perot resonator which is formed by the DBR mirror 103 having its reflectivity $R_r$ and the dielectric multilayer film mirror 111 having its reflectivity $R_f$ as shown in FIG. 1. The value $J_{th}$ is represented by the following formula (2).

$$J_{th} = \frac{edB_{eff}}{A_0^2} \left\{ \alpha_{ac} + \alpha_{in} + \alpha_{ex}(1/\xi - 1) + \frac{1}{\xi L} \ln(1/R_m) \right\}^2 \quad \text{Formula (2)}$$

where $e$ is the charge of an electron; $d$ is the film thickness of the active layer; L is the length of the resonator; $\xi$ is a light confinement coefficient; $\alpha_{ac}$ is the loss of light in the active layer; $\alpha_{in}$ is the loss of light with no injected carriers; and $\alpha_{ex}$ is the loss in the resonator portion other than the active layer, and $A_0$ is constant. FIG. 12 shows the relationship between the entire film thickness of the active layer and the threshold current density according to the above theoretical formula. In FIG. 12, solid lines indicate results provided when the presence of standing waves in the resonator is not taken into consideration while broken lines show results provided when the distribution of standing wave waves is taken into consideration. FIG. 12 shows results provided when the average reflectivities $R_m$ are respectively equal to 0.98, 0.99 and 0.995. In FIG. 12, a black-colored circle shows an actual measurement of the surface emission type laser when the film thickness of the active layer is 0.13 μm and the average reflectivity $R_m$ is 0.98 while a black-colored square shows an actual measurement when the film thickness of the active layer is 0.29 μm and the average reflectivity is 0.99. These actual measurements do well coincide with the theoretical values. When the active layer is of a quantum well structure, the threshold current is further reduced. When Da is equal to 8 μm, the value $I_{th}$ actually became equal to 2 mA.

To accomplish further reduction of the threshold current value in the surface emission type semiconductor laser, the active layer should preferably fulfill two requirements:

(1) The active layer is of a quantum well structure which has a sharp well having an evenness (irregularity) equal to or lower than a single atom.

(2) The entire film thickness of the quantum well active layer is set to be the minimum value of the threshold current density ranging between 0.27 to 0.33 μm or 0.65 to 0.75 μm for example (refer to FIG. 12), taking the distribution of standing wave within the resonator into consideration. Since the film thickness of the quantumwell is set depending on the wavelength of the laser oscillation, the entire film thickness of the quantum well active layer may be controlled by repeatedly forming quantum wells and changing the number of wells. For example, if a surface emission type semiconductor laser oscillating at the lasing wavelength of 800 nm is to be produced, a multiple quantum well structure having 21 pairs of quantum wells is preferably formed with the film thickness of the GaAs quantum well active layer being 61 Angstroms and the $Al_{0.3}Ga_{0.7}As$ barrier layer having its film thickness equal to 86 Angstroms.

Figure 47:
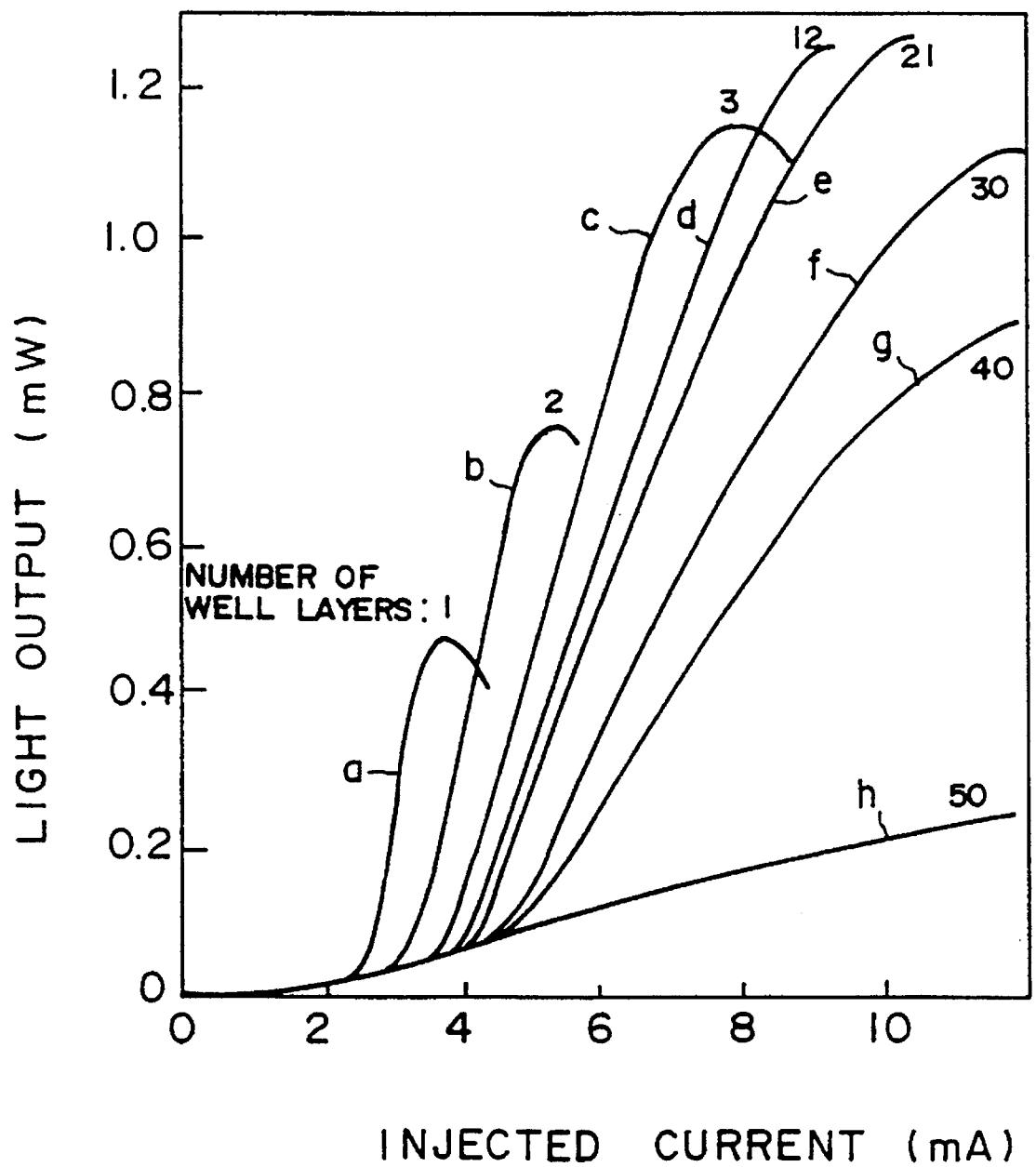
FIG. 47 is a graph illustrating the relationship between the injection current and the light output when the number of the well layers are changed.

Further, the number of the well layers in the active layer will be explained with reference to FIG. 47. FIG. 47 illustrates what influence the well layer numbers have on the I–L characteristics. More precisely, curve lines $a$ to $h$ indicate the I–L characteristics in the case where the number of the well layers in the active layer having predetermined thickness (da) is 1, 2, 3, 12, 21, 30, 40 and 50. The predetermined thickness (da) meets the conditions shown in FIG. 12. The thickness of the active layer indicated by the curve lines $a$ to $e$ is 0.3 μm, and that of the lines $f$ to $h$ is 0.7 μm.

Figure 48:
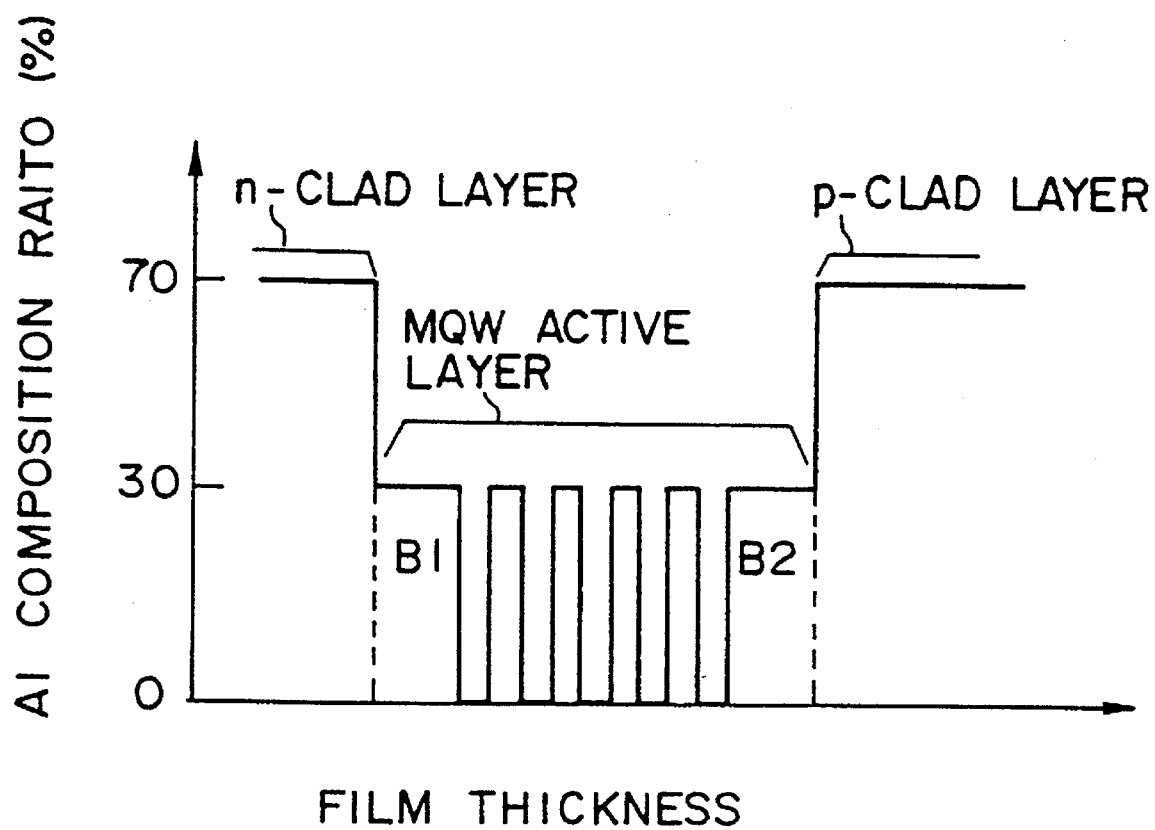
FIG. 48 is a view diagrammatically showing the relationship between the thickness of the well layers and of the clad layers in the active layer and the Al composition.

The total thickness of the well layers in the active layer is relative to the number of the well layers. Thus, by controlling the total thickness of the barrier layers, it is possible to place the active layer thickness at a predetermined value. For example, when the barrier layers with the fixed thickness cannot be formed, as shown in FIG. 48 making the outermost barrier layers B1 and B2 thicker than the remaining barrier layers provides the thickness of the total active layer.

With reference to FIG. 47 it is clear that decreasing the well layer numbers effectively lowers the threshold current, while increasing the numbers magnifies the light output. In other words, the well layer numbers must be between 1 to 40 for obtaining laser lasing, and between 3 to 30 for the light output to be greater than 1 mW. Therefore, in this embodiment the desirable number of the well layers ranges between 3 to 30.

Figure 13:
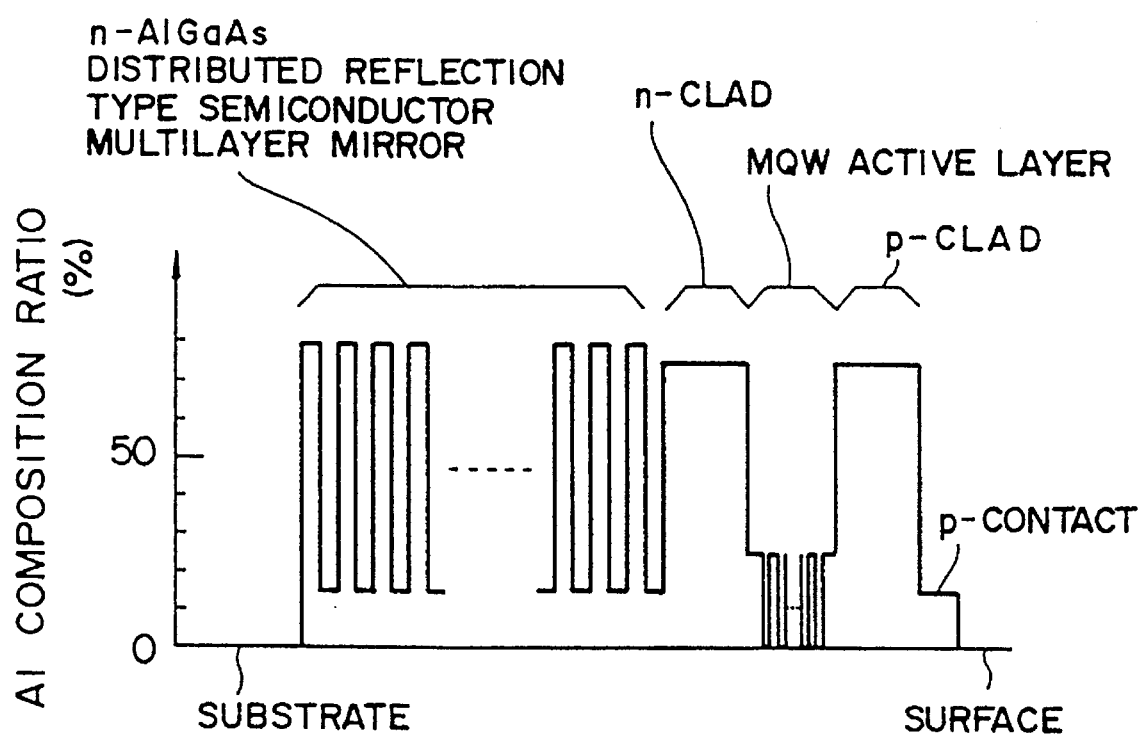
FIG. 13 is a graph showing the Al composition of each of the crystal layers of the surface emission type semiconductor laser shown in FIG. 1.

The influence of the magnitude of the band gap in the clad layers to the lasing characteristics will be described in detail. FIG. 13 shows the Al composition of grown $Al_xGa_{1-x}As$ layers in a surface emission type semiconductor laser wafer which is formed on a GaAs single-crystal substrate through crystal growth. Since AlGaAs has a band gap increasing as the amount of Al in the composition increases, FIG. 13 also represents variations of the band gap. Carriers injected into the active layer will be confined within the band gap of the clad layers. As the confinement of carriers increases, the temperature characteristics of the device are improved. The characteristics of a surface emission type semiconductor laser in FIG. 13 produced to make the Al composition $x$ of the n-type clad layer and second clad layer equal to 0.5 is compared with those of a surface emission type semiconductor laser having the Al composition $x$ equal to 0.7. All samples were produced under the same conditions except the composition of the clad layers. The quantum well active layer was of a multiple quantum well structure comprising 21 pairs of a deposited GaAs quantum well layer having a film thickness of 61 Angstroms and a deposited $Al_{0.3}Ga_{0.7}As$ barrier layer having a film thickness 86 Å. The dielectric multilayer film mirror was formed of 8 pairs of $SiO_x$ and $Ta_2O_5$ and had a reflectivity of 99.0% relative to light having its wavelength of 800 nm. Da and Dw were 8 μm 6 μm, respectively.

Figure 14:
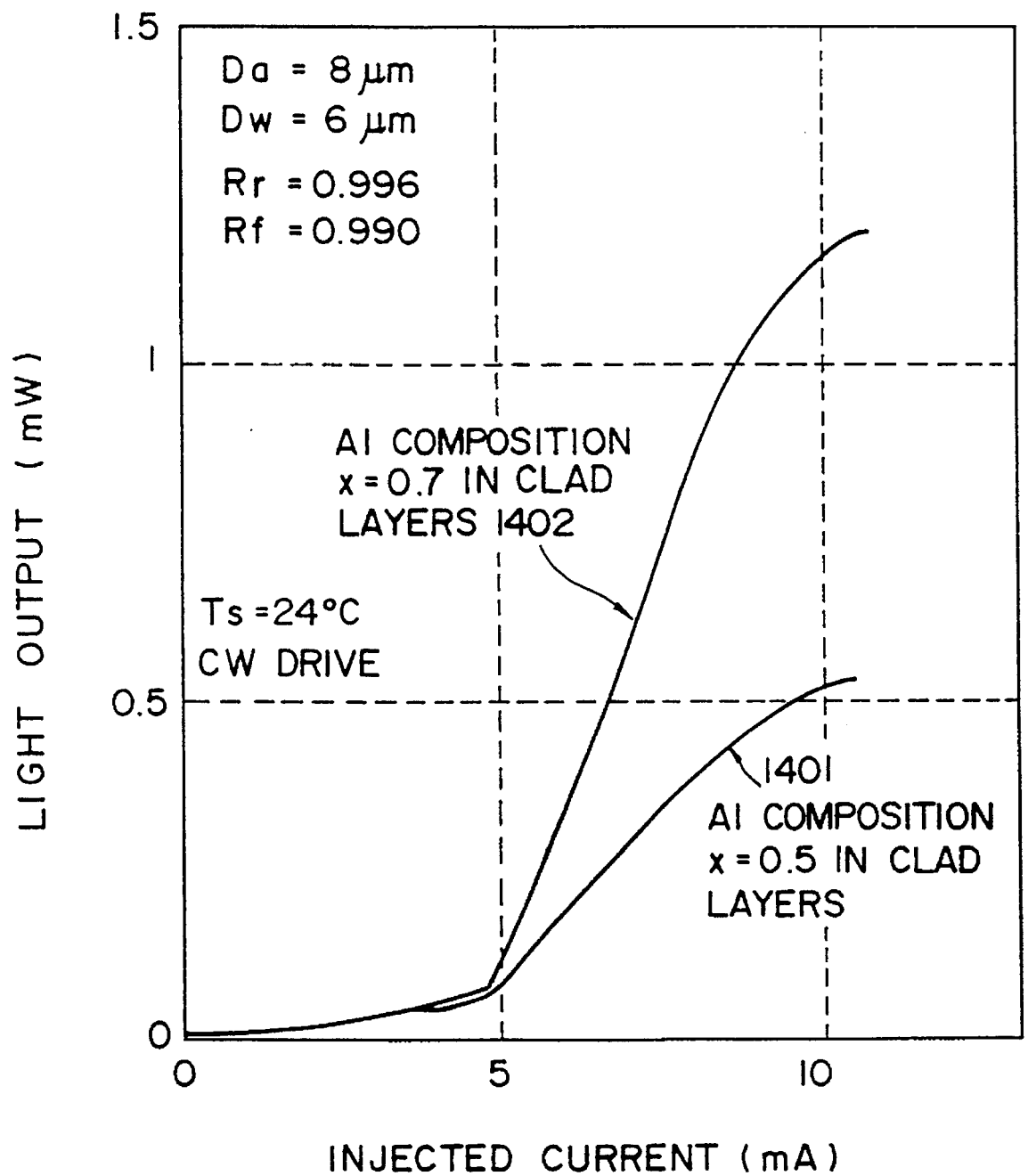
FIG. 14 is a graph of the relationship between the injected current and the light output, with the Al composition in the clad layers as a parameter, in the surface emission type semiconductor laser of FIG. 1.

FIG. 14 shows the I–L characteristics in two types of surface emission type semiconductor lasers. A curve 1401 shows the characteristic of one surface emission type semiconductor laser in which the first and second clad layers have an Al composition of 0.5 while another curve 1402 shows the characteristic of the other surface emission type semiconductor laser in which the first and second clad layers have an Al composition of 0.7. Electric current flowed through both surface emission type semiconductor lasers at room temperature in the continuous drive manner. As will be apparent from FIG. 14, the external differential quantum efficiency is higher in the one surface emission type semiconductor laser having the higher Al composition of the clad layers. Thus, it can emit a laser beam output two times or more larger than that of the other surface emission type semiconductor laser. This means that the injected carriers are effectively confined within the active layer through the potential barriers in the clad layers.

Figure 15:
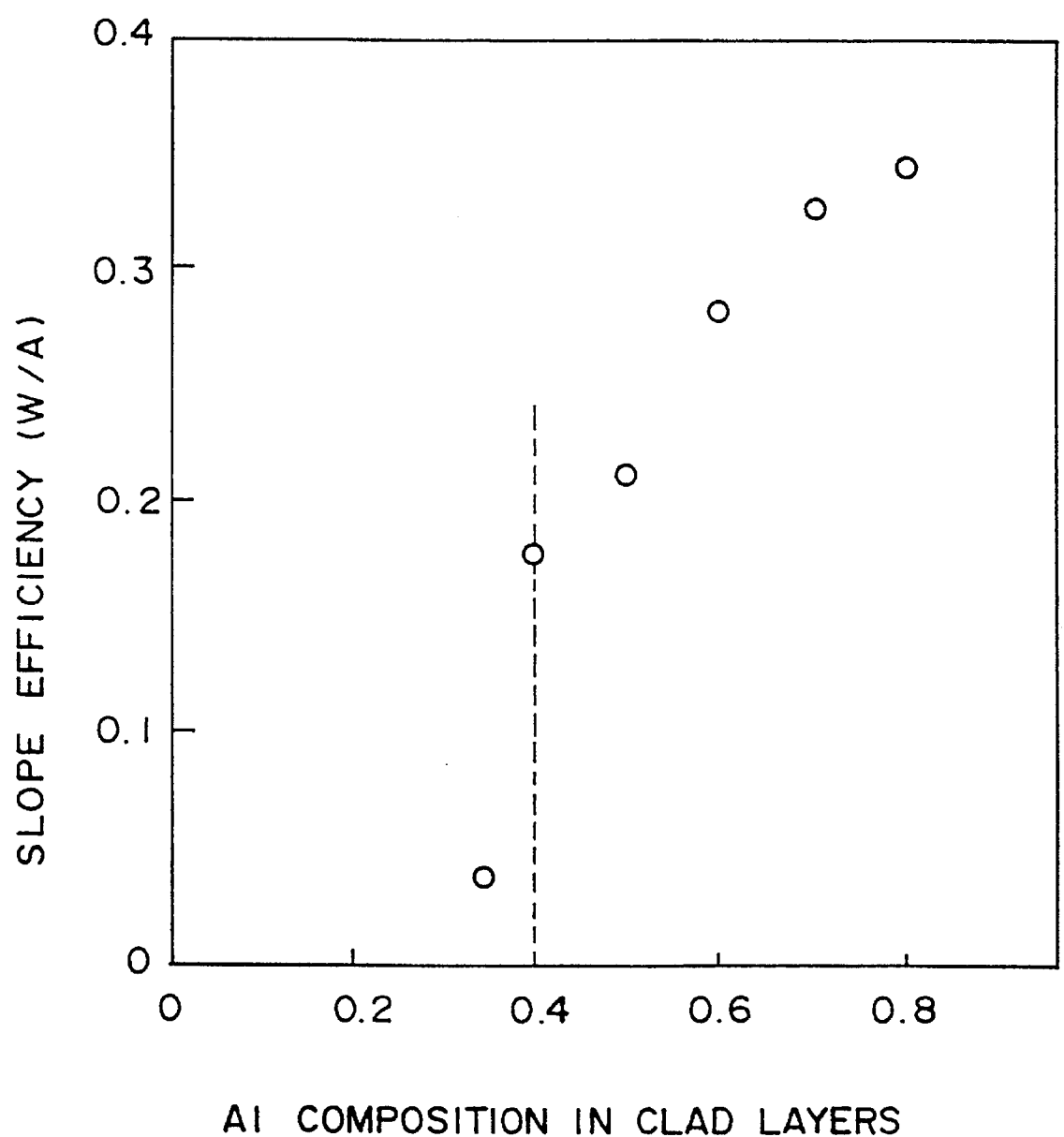
FIG. 15 is a graph of the relationship between the Al composition of the clad layers and the external differential quantum efficiency (slope efficiency) in the surface emission type semiconductor laser of FIG. 1.

The Al composition of the clad layers will further be described with reference to FIG. 15. In FIG. 15, a vertical axis shows values (slope efficiencies) representing the external differential quantum efficiencies (gradients in the I–L characteristics) while a horizontal axis shows the Al composition in the clad layers. As described in connection with FIG. 8, normally, the external differential quantum efficiency should be equal to or higher than 0.1. Thus, the Al composition in the clad layers is preferably equal to or higher than 0.4. The Al composition in the clad layers is more preferably 0.65 and most preferably ranges between 0.7 and 0.8, since when using the surface emission type semiconductor laser as a printer the required light output is higher than 2 mW.

Conditions required to accomplish further reduction of the threshold value will be described in detail. The dielectric multilayer film mirror 111 of FIG. 1 should have a reflectivity ranging between 98.5% and 99.5% relative to the lasing wavelength. If the reflectivity is lower than 98.5%, the lasing threshold current will sharply increase as can be seen from the theoretical calculation of FIG. 12. If the reflectively is higher than 99.5%, it becomes difficult to produce the light output. This will reduce the external differential quantum efficiency. Thus, the dielectric multilayer film mirror 111 is formed after the number of thin film pairs required to provide a reflectivity within the aforementioned range has been determined. It is further important that a dielectric material having little loss through light absorption relative to the lasing wavelength is used to reduce the threshold value and to improve the external differential quantum efficiency.

Figure 16:
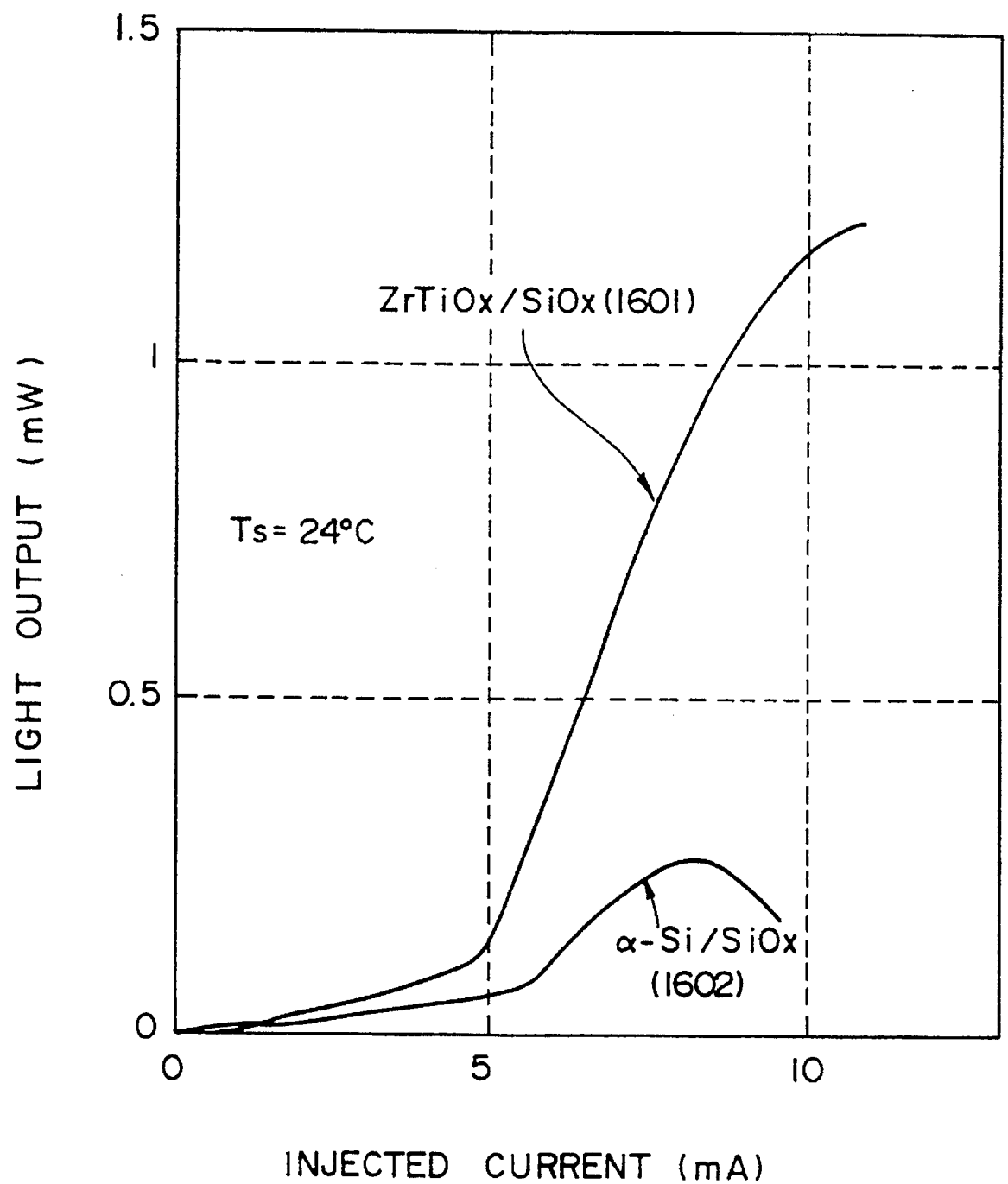
FIG. 16 is a graph of the relationship between the injected current and the light output for two types of the dielectric multilayer film mirror differing in the light absorption coefficient of the respective dielectric material, in the surface emission type semiconductor laser of FIG. 1.

FIG. 16 has a solid line 1602 showing the I–L characteristic of a surface emission type semiconductor laser comprising a dielectric multilayer film mirror formed of amorphous Si and $SiO_x$, and another solid line 1601 showing the I–L characteristic of another surface emission type semiconductor laser comprising a dielectric multilayer film mirror formed of $ZrTiO_x$ and $SiO_x$. More particularly, the surface emission type semiconductor laser having the I–L characteristic shown by the solid line 1601 has a dielectric mirror formed of eight pairs of multilayer $SiO_x/ZrTiO_x$ films with the reflectivity thereof being 99.0%. The other surface emission type semiconductor laser having the I–L characteristic shown by the solid line 1602 has a dielectric mirror formed of four pairs of multilayer $SiO_x$/amorphous Si films with the reflectivity thereof being 98.7%. As will be apparent from FIG. 16, the external differential quantum efficiency and laser light output in one surface emission type semiconductor laser are greatly different from those of the other surface emission type semiconductor laser although their reflectivities are substantially equal to each other. This is because the light absorption coefficient for the wavelength of 800 nm in amorphous Si is 4000 $cm^{-1}$ while the light absorption coefficient for the wavelength of 800 nm in $ZrTiO_x$ is 50 $cm^{-1}$.

Table 1 shows refractive indexes and light absorption coefficients of dielectric films formed through the electron beam deposition method (hereinafter called "EB deposition method"), relative to the wavelength of 800 nm.

TABLE 1

| DIELECTRIC FILM | REFRACTIVE INDEX (800 nm) | LIGHT ABSORPTION COEFFICIENT (800 nm) |
|---|---|---|
| $ZrO_x$ | 2.0 | 50 $cm^{-1}$ |
| $ZrTiO_x$ | 2.0 | 50 $cm^{-1}$ |
| $Ta_2O_5$ | 2.2 | 30 $cm^{-1}$ |
| $TiO_x$ | 2.3 | 25 $cm^{-1}$ |
| $SiO_x$ | 1.45 | ~0 |
| AMORPHOUS Si | 3.4 | 4000 $cm^{-1}$ |

In Table 1, $ZrTiO_x$ is a dielectric thin film material containing Ti in a molar ratio of about 5% relative to Zr in $ZrO_x$. To form a reflecting mirror, the dielectric film must have a film thickness of λ/4n (where n is the refractive index of the dielectric material) relative to the lasing wavelength λ and should be formed by alternately depositing dielectrics of lower and higher refractive indexes. The reflectivity can be increased by increasing the number of deposited layer pairs. If there is too much light absorption loss, however, the reflectivity cannot be increased.

Table 2 shows the film thickness, the number of combined film pairs in the dielectric mirror and the calculated reflectivities at λ=800 nm as well as the reflectivities of the respective dielectric mirrors produced through the EB deposition.

TABLE 2

| DIELECTRIC FILM | THICKNESS | PAIRS | REFLECTIVITY (CALCULATED VALUE) | REFLECTIVITY (ACTUAL MEASUREMENT) |
|---|---|---|---|---|
| $SiOx/ZrOx$ | 1379Å/1000Å | 9 | 99.62% | 99.4% |
| $SiOx/ZrTiOx$ | 1379Å/1000Å | 9 | 99.62% | 99.4% |
| $SiOx/Ta_2O_5$ | 1379Å/909Å | 7 | 99.68% | 99.6% |
| $SiOx/TiOx$ | 1379Å/870Å | 7 | 99.80% | 99.7% |
| $SiOx/a-Si$ | 1379Å/588Å | 4 | 99.00% | 98.7% |

The calculated reflectivities of Table 2 are results when the light absorption coefficients of Table 1 are taken into consideration. As will be apparent from Table 2, with a dielectric material having a relatively large absorption coefficient as a-Si (amorphous silicon) it is difficult to increase the reflectivity. As described, the surface emission type semiconductor laser according to the embodiment of the present invention may decrease the threshold current and increase the emission efficiency by using the dielectric multilayer film mirror formed of a dielectric material which preferably has a light absorption coefficient equal to or lower than 100 $cm^{-1}$ and more preferably 60 $cm^{-1}$ relative to the lasing wavelength.

A surface emission type semiconductor laser having a reduced lasing threshold and an improved efficiency may be accomplished under such further preferable conditions as will be described below.

Figure 17A:
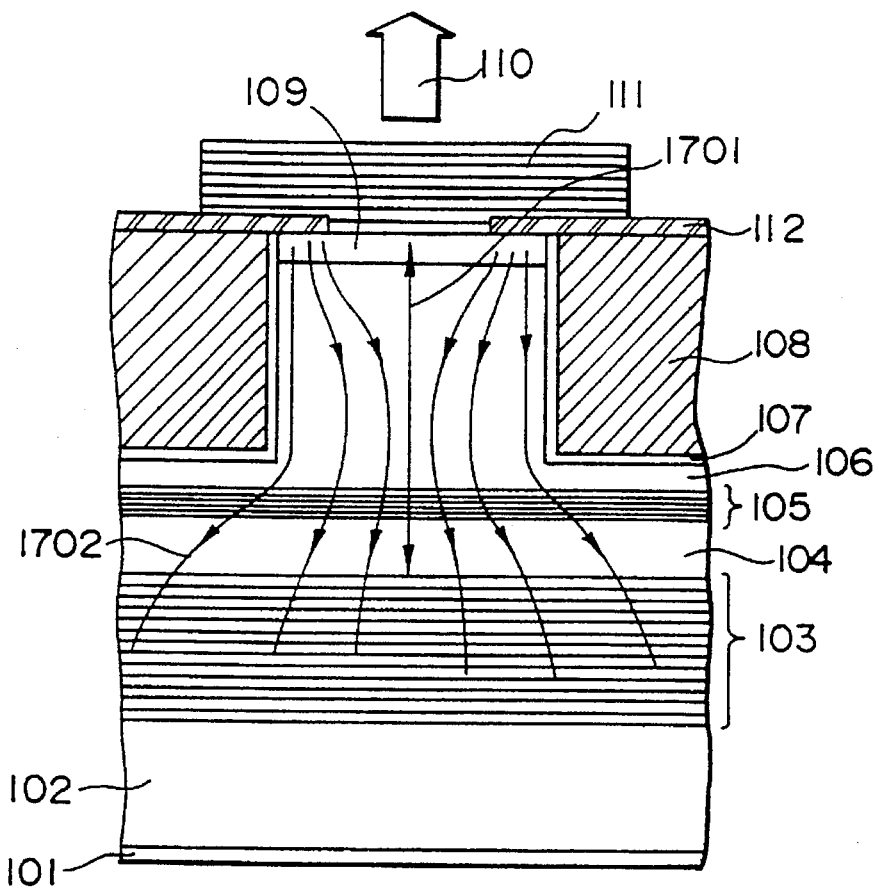
FIG. 17A is a view diagrammatically illustrating the cross-section of the surface emission type semiconductor laser shown in FIG. 1, the resonator length and the flow of injected current.

FIG. 17A diagrammatically shows the cross-section of the surface emission type semiconductor laser constructed according to the embodiment of the present invention and shown in FIG. 1. In FIG. 17A, parts similar to those of FIG. 1 are designated by like reference numerals. 1701 substantially indicates the length of the resonator while 1702 diagrammatically represents the flow of injected current. The surface emission type semiconductor laser includes a Fabry-Perot resonator formed between the dielectric multilayer film mirror 111 and the DBR mirror 103 and may be oscillated at the wavelength of a standing wave in such a resonator. The resonator length 1701 is substantially determined by the film thickness between the dielectric multilayer film mirror 111 and the DBR mirror 103. However, the effective resonator length (hereinafter called "$L_{eff}$") may be longer than the length 1701 since there is some light entering the DBR mirror 103. The effective resonator length $L_{eff}$ can directly be measured by investigating the reflectivity.

Figure 17B:
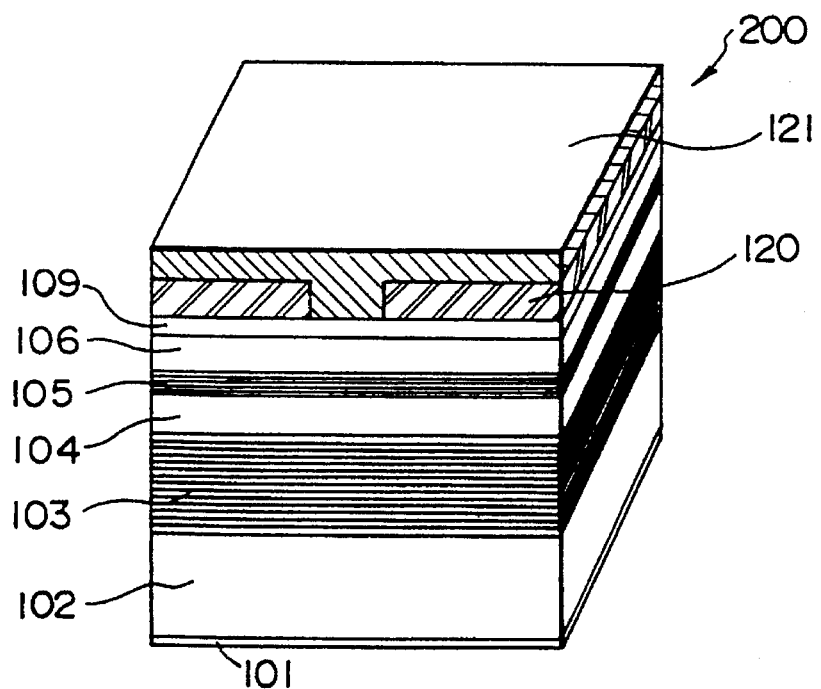
FIG. 17B is a perspective view diagrammatically showing the cross-section of an edge emission type semiconductor laser formed by using part of the semiconductor layer wafer for forming the surface emission type semiconductor laser of FIG. 1.

FIG. 17B shows an edge emission type semiconductor laser formed from a wafer which includes the same semiconductor layers as the surface emission type semiconductor lasers of the present invention as shown in FIGS. 1 and 17A. Such a wafer will be called "semiconductor deposition wafer". The edge emission type semiconductor laser 200 which is a stripe-geometry edge emitting laser may be provided by cutting part of the semiconductor deposition wafer, as shown in FIG. 22A, comprising the DBR mirror 103, first clad layer 104, quantum well active layer 105, second clad layer 106 and contact layer 109 deposited on the substrate 102, forming the insulation layer 120 and upper electrode 121 on the contact layer 109 and forming the lower electrode 101 on the underside of the substrate 102. The edge emission type semiconductor laser is used as a sample that will be used to determine the peak wavelength of a gain spectrum described later. Other types of edge emission type semiconductor lasers such as a stripe-buried edge emitting laser and a mesa-stripe-geometry edge emitting laser may be used.

Figure 18:
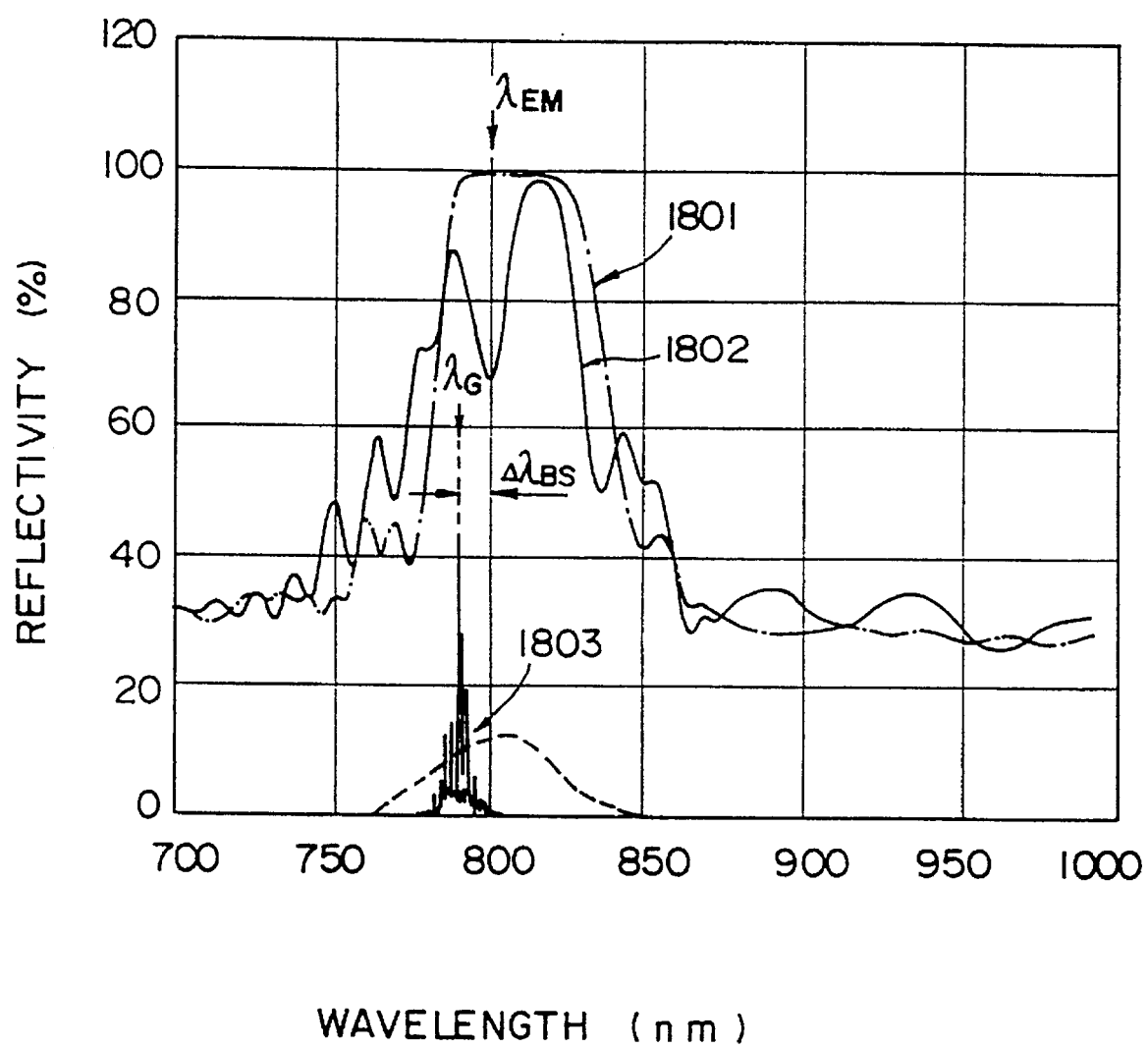
FIG. 18 is a graph showing the reflection spectrum of the DBR mirror and deposited semiconductor layers in the surface emission type semiconductor laser of FIG. 1 and the oscillation spectrum of the edge emission type semiconductor laser.

FIG. 18 shows the reflection spectrum (curve 1801) of the DBR mirror, the reflection spectrum (curve 1802) of the wafer (semiconductor deposition wafer) and the lasing spectrum (curve 1803) of the edge emission type semiconductor laser. In FIG. 18, vertical axes for 1801 and 1802 indicate the reflectivities and a vertical axis for 1803 shows the spectral intensity while a horizontal axis shows the wavelength.

On the curve 1801, the wavelength ranges between 792 nm and 833 nm at such an area that the reflectivity is equal to or higher than 99.2%. The semiconductor deposition wafer is designed such that the lasing wavelength of the surface emission type semiconductor laser becomes equal to 800 nm.

To accomplish reduction of the threshold and improvement of the efficiency in the surface emission type semiconductor laser, the above three types of spectra should preferably fulfill particular conditions.

First Condition

The first condition is that the reflectivity of the DBR mirror should be sufficiently high relative to the lasing wavelength. A peak reflectivity of the DBR mirror can be provided by accurately controlling the film thickness of the semiconductor layers ($Al_{0.8}Ga_{0.2}As/Al_{0.15}Ga_{0.85}As$) which form the DBR mirror and can be raised by increasing the number of semiconductor layer pairs in the DBR mirror. Since it is normal that the film thickness of the crystal layer is not completely uniform in the wafer plane, the reflectivity spectrum in the DBR mirror is distributed over shorter and longer wavelength sides. Unless the reflectivity in the DBR mirror of $Al_{0.8}Ga_{0.2}As/Al_{0.15}Ga_{0.85}As$ is at least equal to or higher than 99.2% at the range of the lasing wavelength ±20 nm, the wafer plane will have an area in which lasing is not produced. Since the DBR mirror is formed by 40 pairs of deposited semiconductor layers in this embodiment, the lasing can be produced with the desired lasing wavelength even if there is a film thickness fluctuation of ±2.5% in the wafer plane, as will be apparent from the curve 1801 in FIG. 18.

The reflectivity of the DBR mirror also varies depending on the doping in each of the semiconductor layers ($Al_{0.8}Ga_{0.2}As/Al_{0.15}Ga_{0.85}As$) forming the DBR mirror. This is because if the doping in each layer increases, loss by light absorption through free carriers is not negligible.

If the mean doping concentration of Se being an n-type dopant becomes higher than $1\times10^{19}$ cm$^{-3}$ in the DBR mirror of $Al_{0.8}Ga_{0.2}As/Al_{0.15}Ga_{0.85}As$, it is difficult to provide a reflectivity equal to or higher than 99.2% at the set wavelength ±20 nm even though the number of semiconductor layer pairs is made equal to 40. It is therefore preferred that the mean doping in each layer is equal to or lower than $1\times10^{19}$ cm$^-$. Table 3 shows the relationship between the mean doping to the DBR mirror and the reflectivity thereof.

TABLE 3

| MEAN DOPING (cm$^{-3}$) | MAX REFLECTIVITY (%) | REFLECTIVITY AT WAVELENGTH ± 20 nm (%) |
|---|---|---|
| $2 \times 10^{19}$ | 99.4 | 98.9 |
| $1 \times 10^{19}$ | 99.6 | 99.2 |
| $5 \times 10^{18}$ | 99.8 | 99.6 |
| $1 \times 10^{18}$ | 99.9 | 99.8 |
| $5 \times 10^{17}$ | 99.9 | 99.9 |

The reduction of doping to the DBR mirror will increase the electrical resistance in the DBR mirror. In the surface emission type semiconductor laser of such a type where the electric current flows through the DBR mirror, it results in an increase of the element resistance. Since the surface emission type laser of this embodiment includes a DBR mirror not etched into a column-like configuration, the drive current will spread through the entire DBR mirror to reduce the influence of the increased resistance in the DBR mirror and to decrease the resistance in the laser element. If the doping to each layer in the DBR mirror becomes lower than $5\times10^{16}$ cm$^{-3}$, the influence to the element resistance is not negligible even in the structure of this embodiment since the resistance in the DBR mirror becomes substantially equal to the contact resistance between the upper contact layer and the electrode. Therefore, the mean doping to each of the layers forming the DBR mirror preferably ranges between $5\times10^{16}$ cm$^{-3}$ and $1\times10^{19}$ cm$^{-3}$ and more preferably between $5\times10^{17}$ cm$^{-1}$ and $5\times10^{18}$ cm$^{-3}$ in view of the freedom of lasing wavelength for producing surface emission type semiconductor lasers having different lasing wavelengths from a single substrate.

It is further desirable that the DBR mirror of this embodiment has the following arrangement with respect to the doping. The DBR mirror desirably has a higher carrier concentration at the interface area between a first layer (with higher aluminum concentration) and a second layer (with lower aluminum concentration) having a band gap narrower than and a refractive index different from those of the first layer, in comparison with the carrier concentration in other areas of the DBR mirror. The "carrier concentration" refers to the concentration of electrons or positive holes which are generated by doping of impurities and such concentration may be varied by changing the amount of doping. More particularly, the maximum carrier concentration at the interface area is preferably equal to or more than 1.1 times but equal to or less than 100 times of the minimum carrier concentration at areas other than the interface. The maximum carrier concentration at the interface area is preferably equal to or smaller than $5\times10^{20}$ cm$^{-3}$.

When a higher carrier concentration is provided to the hetero-interface between the first and second layers which form the DBR mirror, the tunnel conduction of electrons and positive holes can be increased to improve the discontinuous band structure, thereby reducing the resistance in the DBR mirror. Such a higher carrier concentration will not reduce the mirror reflectivity since the distribution of mirror reflectivity is not greatly influenced by the carrier concentration.

On production of the DBR mirror, the carrier concentration can be selectively increased at only the interface area through any one of various methods, such as a method of varying the dopant material through passage of time, a method of irradiating ultraviolet rays onto the surface being grown at a given timing, a method of varying the ratio of V-group to III-group materials through passage of time and so on.

The DBR mirror will further be described in more detail with reference to experimental data.

Figure 35:
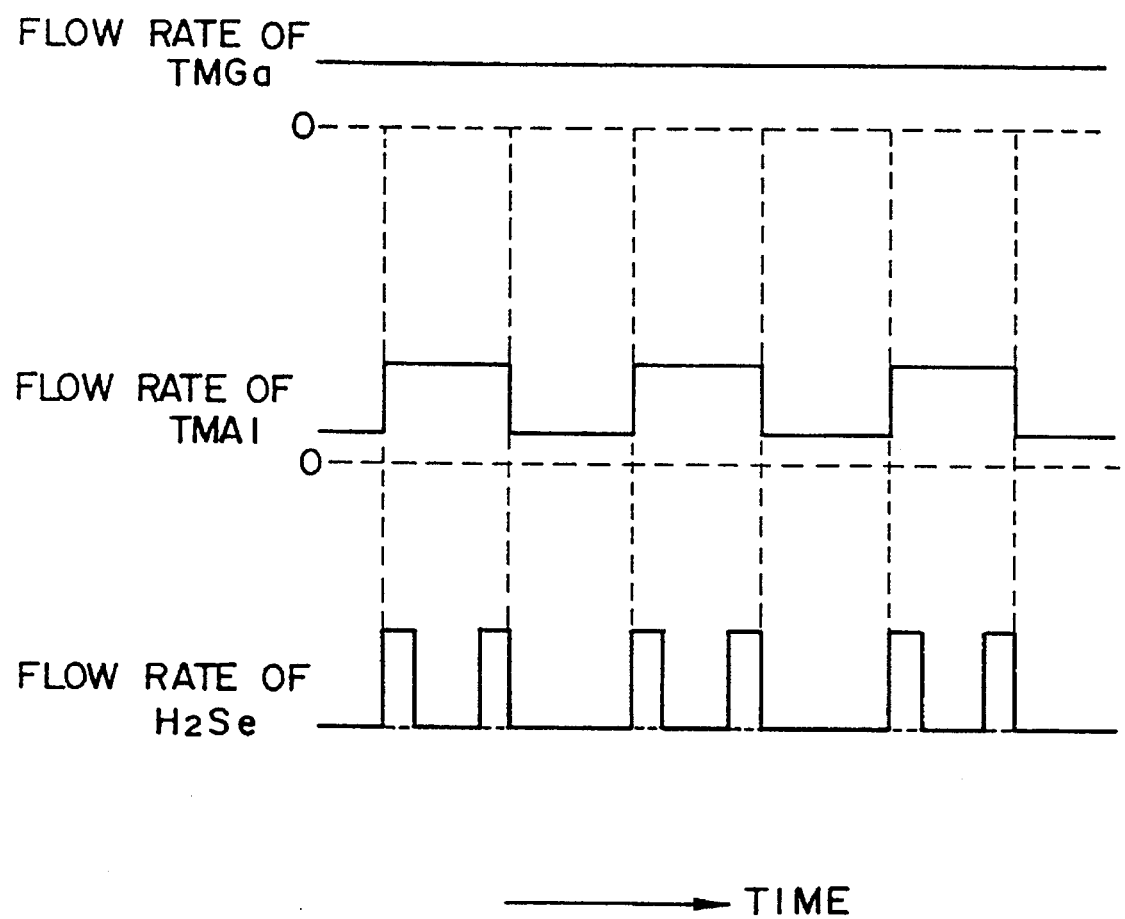
FIG. 35 is a timing chart illustrating variations of the flow rates of TMGa, TMAl and $H_2Se$ when the DBR mirror is formed in the surface emission type semiconductor laser of FIG. 1.

First of all, a process of growing the DBR mirror will be described. FIG. 35 is a timing chart illustrating variations of the flow rate of TMGa and TMAl being DBR mirror materials and variations of the flow rate of H$_2$Se being an n-type dopant material. In this example, since TMGa is supplied constantly, a growing part of a higher flow rate of TMAl forms an n-type Al$_{0.8}$Ga$_{0.2}$As layer and another growing part of a lower flow rate of TMAl forms an n-type Al$_{0.15}$Ga$_{0.85}$As layer. The thickness of each layer is controlled to be equal to one-fourth of a 800 nm wavelength of light which propagates through the layers. The part of a higher flow rate of dopant H$_2$Se indicates a growing part into which n-type carriers are to be doped at higher concentration while the part of a lower flow rate of dopant H$_2$Se indicates another growing part into which n-type carriers are to be doped at lower concentration. In an MOVPE device, the amount of dopant to a given interface is controlled by switching a higher H$_2$Se flow rate to a lower H$_2$Se flow rate and vice versa through a computer-controlled valve. In this embodiment, the area containing a high concentration of dopant Se is formed near both edges of the area which is grown with high TMAl flow rate or the n-type Al$_{0.8}$Ga$_{0.2}$As layer, and the concentration of Se is controlled to drop sharply at the interface area which is grown with low TMAl flow rate or n-type Al$_{0.15}$Ga$_{0.85}$As layer.

Figure 36:
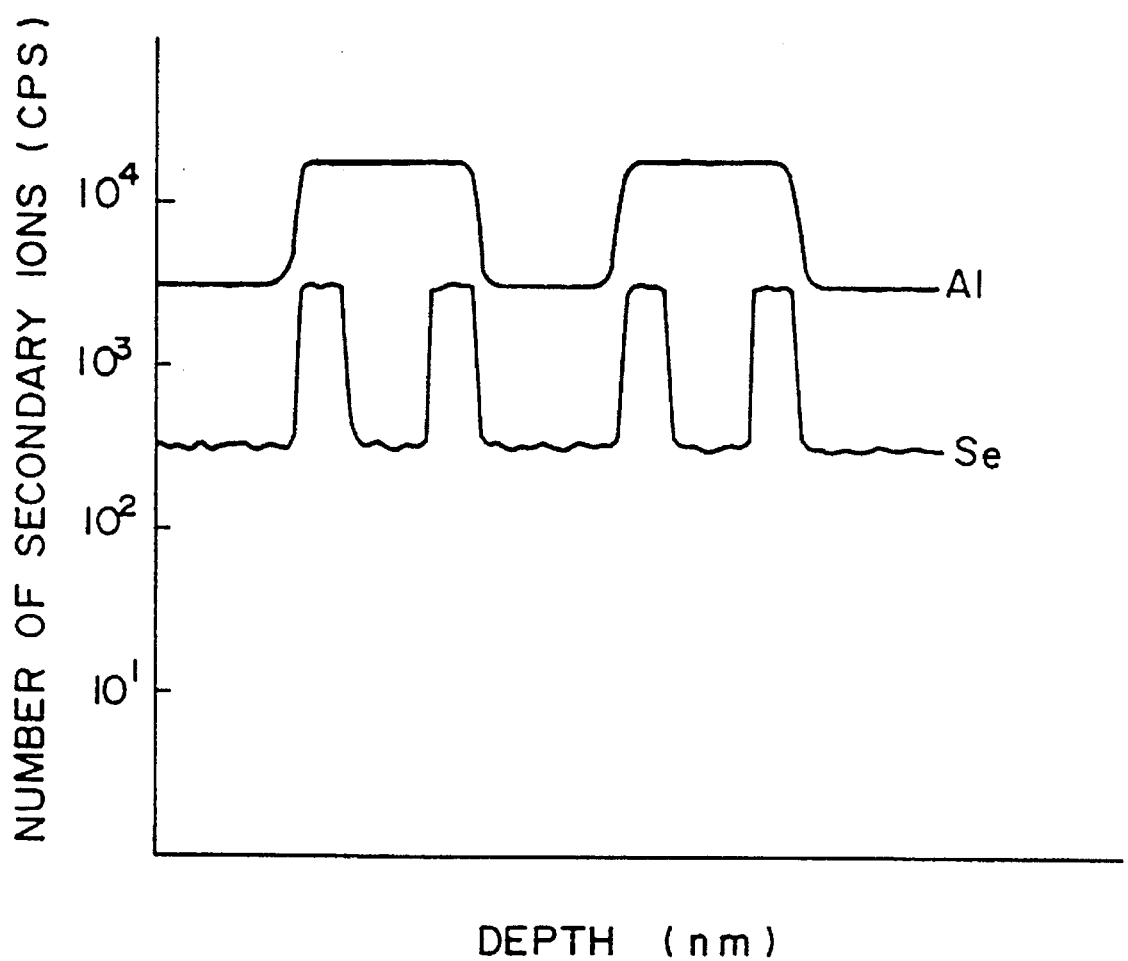
FIG. 36 is a graph showing results when part of the DBR mirror in the surface emission type semiconductor laser of FIG. 1 is estimated through the SIMS method.

A part of the resulting DBR mirror is estimated by the SIMS (Secondary Ion Mass Spectral Analysis) method as shown in FIG. 36. In this figure, a vertical axis indicates the number of secondary ions in Al and Se which corresponds to the amount of atoms and the number of carriers contained in the layers while a horizontal axis represents the depth in the direction of film thickness in part of the DBR mirror.

In comparison between FIGS. 35 and 36, it is found that the concentration of Se sharply increases at the interface area of the second layer (n-type Al$_{0.15}$Ga$_{0.85}$As) and located within the first layer (n-type Al$_{0.8}$Ga$_{0.2}$As), thereby performing the desired doping.

Figure 37A:
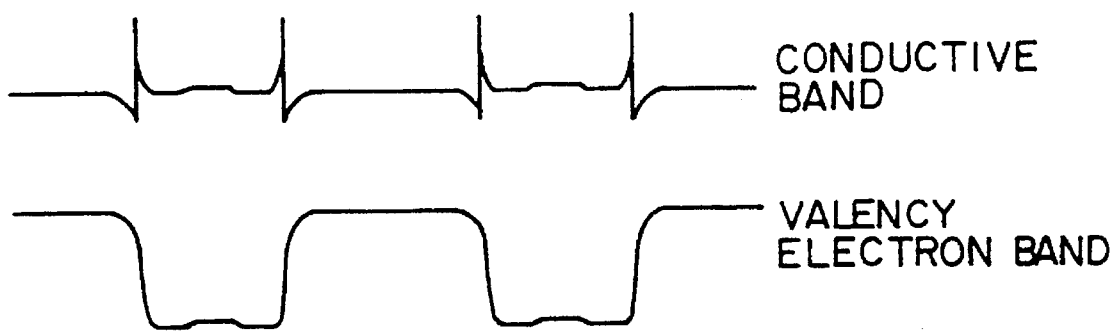
FIG. 37A is a graph showing variations of bands when the concentration of Se of the n-type $Al_{0.7}Ga_{0.3}As$ layer in the DBR mirror is sharply increased adjacent the interface to the $Al_{0.1}Ga_{0.9}As$ layer.
Figure 37B:
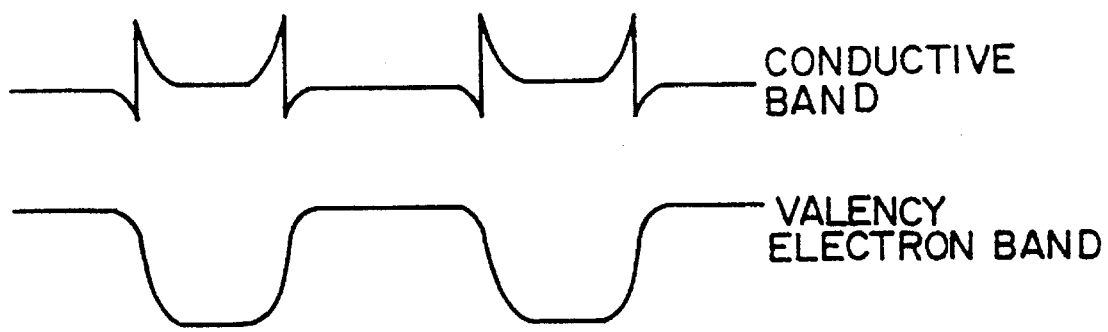
FIG. 37B is a graph showing variations of bands when Se is constantly supplied.

The function of this embodiment will be described with reference to FIG. 37 diagrammatically showing energy bands in the DBR mirror. FIG. 37A shows a case where in this embodiment, the Se concentration is steeply increased at the interface area between the first and second layers while FIG. 37B shows another case where this embodiment is carried out as described except that H$_2$Se is supplied constantly at a lower concentration. In comparison between both cases, it is understood that since the carrier concentration is increased at the interface area in this embodiment, the barrier in the conduction band is thinned to make the tunnel conduction of electrons easier and to reduce the electrical resistance in the direction perpendicular to the multilayer film. Since such an increase of carrier concentration through the doping is restricted to the interface area, the quality of the film will not substantially be degraded by the increased doping concentration.

The carrier concentration at the interface area may be increased by a method of irradiating ultraviolet light or the like alternatively to the control of doping.

Figure 38:
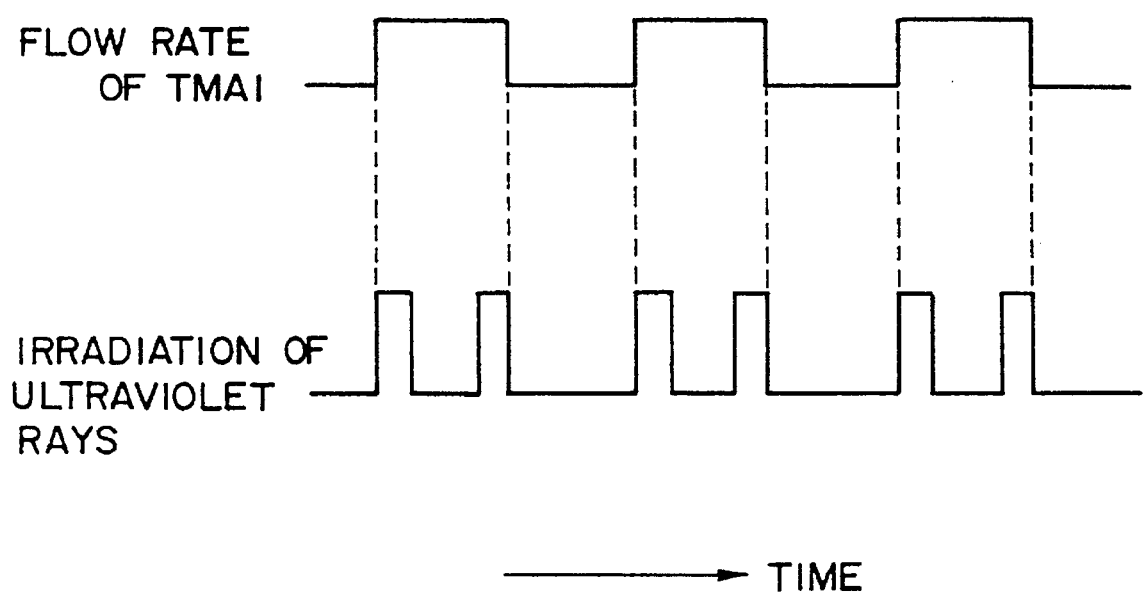
FIG. 38 is a timing chart illustrating variations in the flow rate of TMAl and irradiation dose of ultraviolet light in the process of making the DBR mirror of the surface emission type semiconductor laser of FIG. 1.

More particularly, ultraviolet light is irradiated onto a growing area in which the carrier concentration is to be increased. FIG. 38 is a timing chart illustrating the change of TMAl flow rate and the light irradiation during growth of the DBR mirror. A growing area of higher TMAl flow rate forms the first layer (n-type Al$_{0.8}$Ga$_{0.2}$As layer) while another growing area of lower TMAl flow rate forms the second layer (n-type Al$_{0.15}$Ga$_{0.85}$As layer). The thickness in each layer is controlled to be equal to one-fourth of an 800 nm wavelength of light propagating through the layers. In this embodiment, further, the irradiation with ultraviolet lights is preformed at the growing area of higher TMAl flow rate, that is, at the area of the first layer adjacent to the second layer. As for the n-type dopant tetramethylsilane (TMSi) is used in place of H$_2$Se.

Figure 39:
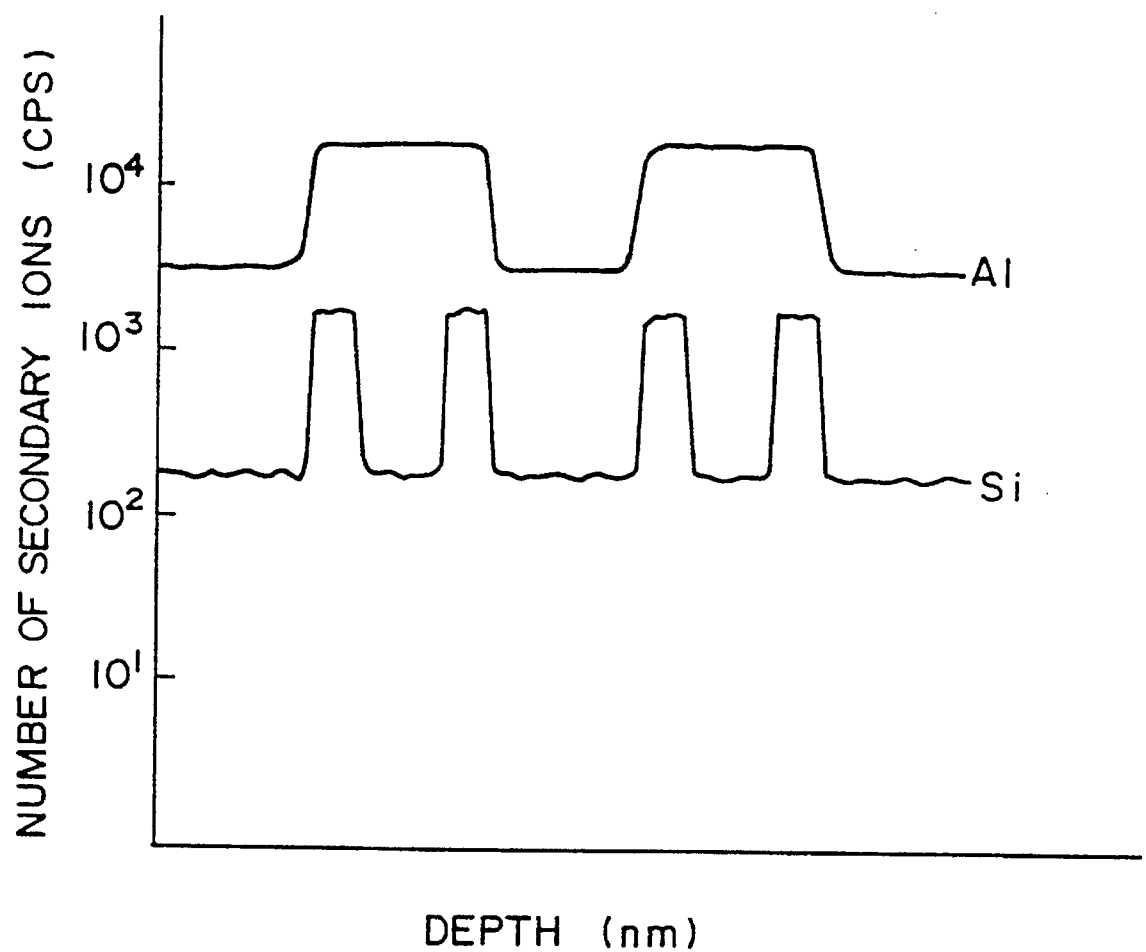
FIG. 39 is a graph showing results when part of the DBR mirror in the surface emission type semiconductor laser of FIG. 1 is estimated through the SIMS method.

A part of the resulting DBR mirror is estimated by the SIMS (Secondary Ion Mass Spectral Analysis) method as shown in FIG. 39. In this figure, a vertical axis indicates the number of secondary ions in Al and Si which corresponds to the amount of atoms and the number of carriers, respectively, contained in the layers while a horizontal axis represents the depth in the direction of film thickness in part of the DBR mirror.

From comparison between FIGS. 38 and 39, it is found that the concentration of Si steeply increases in the ultraviolet light irradiated layer portions to provide a layer of higher carrier concentration at the interfaces to the adjoining layers. This is because TMSi used as doping material can easily be optically decomposed by ultraviolet light since it is extremely thermally stable with little decomposition but has an absorption band in the ultraviolet region. With irradiation of ultraviolet rays, therefore, the Si concentration in the growing layers will steeply increases to provide a substantially increased supply of n-type doping material in comparison with the case where ultraviolet light is not irradiated. As with the aforementioned Se dopant, the increase of carrier concentration at the area adjacent to the interface between the layers forming the DBR mirror will reduce the barrier wall in the conduction band to promote the tunnel conduction, thereby reducing the electrical resistance in the direction perpendicular to the multilayer film. Furthermore, the quality of the film will not substantially be degraded through the high doping concentration since the carrier concentration is only increased at the interface area between the layers through doping and since the irradiation of light contributes to an improvement of the film quality.

In the aforementioned interface doping, dopant materials that may be used include S, Se, Te, Zn, C, Be, Mg, Ca in addition to Se and Si. If any material having a low doping efficiency with respect to GaAs materials such as Te or Mg is used, the flow rate of AsH$_3$ being a V-group material can be controlled at a site to be doped with a higher concentration to change the proportion of V-group to III-group materials (V/III), thereby controlling the doping efficiency.

A further possibility of controlling the carrier concentration at the hetero-interface is to increase of the carrier concentration at the interface area in the layer of smaller band gap rather than in the layer of larger band gap. Alternately, the carrier concentration may be increased at the interface areas in both the layers of smaller and larger band gaps. When the relationship between the distribution of carrier concentration, the reflectivity of the multilayer film, the electrical resistance in the direction perpendicular to the multilayer film and the crystallinity of the multilayer film is carefully studied, it is found that the thickness of the area to be increased in carrier concentration to the interface area is preferably within one-third of the thickness of the first layer with the larger band gap plus the thickness of the second layer with the smaller band gap. If the thickness of the higher carrier concentration area is larger than one-third of the combined thickness, it is found that the crystallinity is degraded. To reduce the resistance in the DBR mirror, it is desirable that the higher concentration doping is instantaneously switched to the lower concentration doping and vice versa. However, it is found that such a switching might slightly degrade the crystallinity depending on the doping material. In such a case, it is desirable that the supply of doping material is continuously changed from a level for doping any area other than the interface area of another level for doping the interface area. In other words, the amount of doping material may be changed in a linear, quadratic or cubic function of time over a time within one-half of the time of doping at the interface area prior to the doping with a given doping concentration. This can restrain reduction of the crystallinity.

Second Condition

The second condition is that the effective resonator length should be an integer multiple of one-half of the lasing wavelength in the resonator since the wavelength of the standing wave in the aforementioned resonator length becomes the lasing wavelength of the surface emission type semiconductor laser (hereinafter called "mode resonance condition"). From the curve 1802 in FIG. 18, it is understood that there is a clear dip in the spectrum at a wavelength $\lambda_{EM}$. This dip indicates presence of a standing wave at wavelength $\lambda_{EM}$ in the semiconductor layers formed on the DBR mirror and that light having the wavelength $\lambda_{EM}$ is absorbed resonantly. If the reflectivity spectrum in the semiconductor deposition wafer forming the surface emission type semiconductor laser is measured, therefore, the effective resonator length $L_{eff}$ can directly be determined. The aforementioned mode resonance condition means the wavelength $\lambda_{EM}$ is contained in the high reflectivity band (peak) of the reflectivity spectrum of the DBR mirror as shown by the curve 1801.

Third Condition

The third condition means that the peak wavelength of the gain spectrum of the active layer should be located on the shorter wavelength side of the wavelength $\lambda_{EM}$ of the standing wave under the aforementioned mode resonance condition. Curve 1803 in FIG. 18 shows measurements of the lasing spectrum from an edge emission type semiconductor laser 200 (see FIG. 17B) which is produced from the same semiconductor deposition wafer as providing the spectrum shown by the curve 1802. The surface emission type semiconductor laser indicated by curve 1802 and the edge emission type semiconductor laser 200 are formed by the same semiconductor layers which are the n-type clad layers, active layers and p-type clad layers. Therefore, the curve 1803 shows the gain spectrum of the active layer of the edge emission type semiconductor laser and that of the surface emission type semiconductor laser. The peak wavelength of the gain spectrum is shown by $\lambda_G$ in FIG. 18. The difference between the wavelengths $\lambda_{EM}$ and $\lambda_G$ is shown by $\Delta\lambda_{BS}$. The third condition of this embodiment is that $\lambda_G$ is necessarily on the shorter wavelength side of $\lambda_{EM}$ and also that the difference $\Delta\lambda_{BS}$ is equal to or smaller than 20 nm.

The third condition is a particularly preferable feature for a surface emission type semiconductor laser of the present invention. The reason will be described below.

Figure 19A:
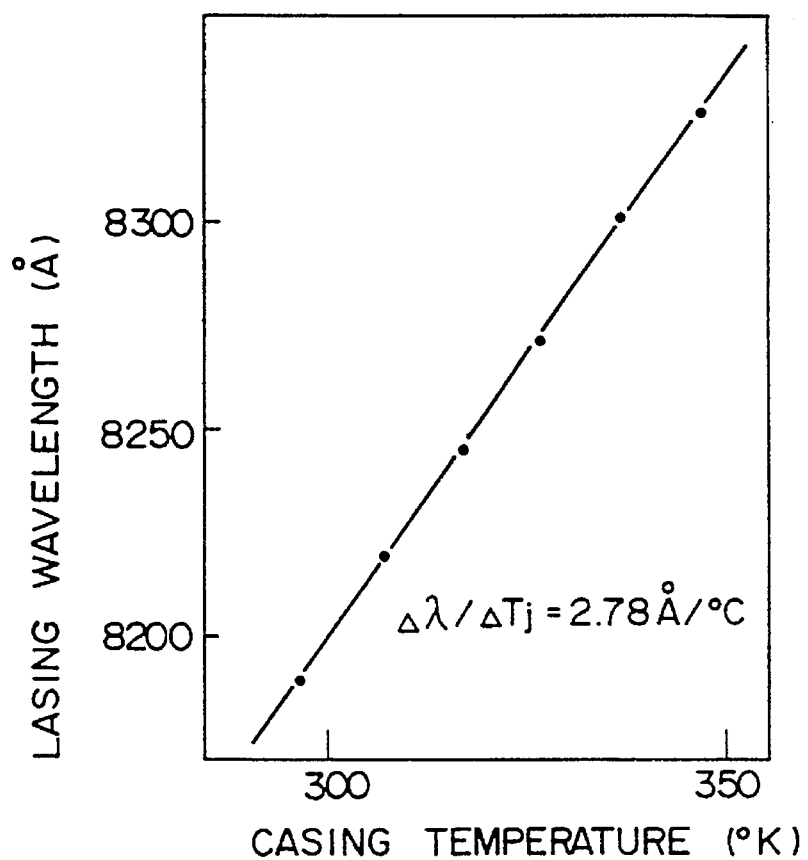
FIG. 19A is a graph of the relationship between the lasing wavelength and the casing temperature in the edge emission type semiconductor laser formed by using the semiconductor layer deposition wafer for forming the surface emission type semiconductor laser of FIG. 1.
Figure 19B:
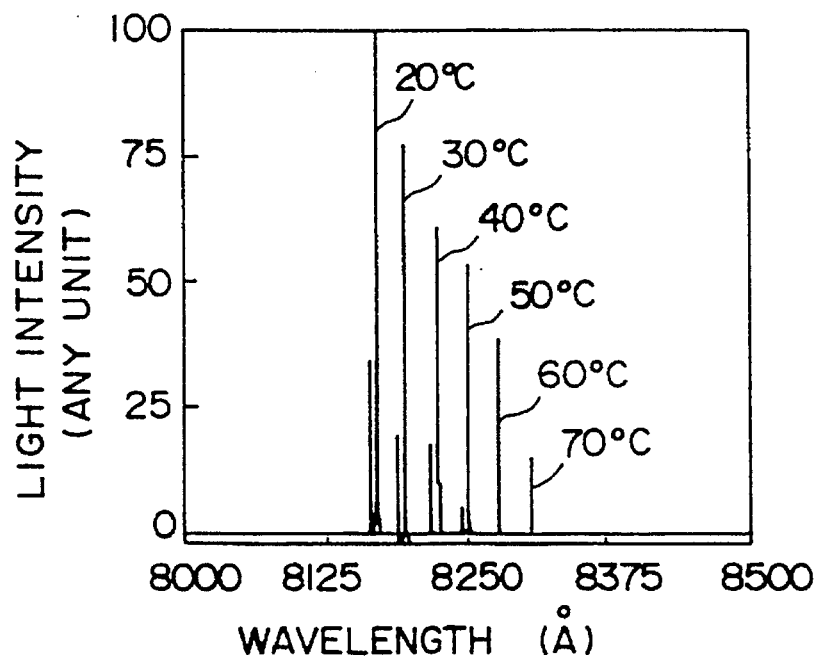
FIG. 19B is a graph of the relationship between the oscillation spectrum and the casing temperature in the edge emission type semiconductor laser formed by using the semiconductor layer deposition wafer for forming the surface emission type semiconductor laser of FIG. 1.

FIG. 19A shows the relationship between the lasing wavelength of the edge emission type semiconductor laser 200 and the casing temperature while FIG. 19B shows measurements used to deduce FIG. 19A. It may be believed that the casing temperature indicates the temperature of a package in which the laser is mounted and is substantially the same temperature as that of the laser.

As will be apparent from FIG. 19A, the lasing wavelength is substantially linearly shifted to the longer wavelength side as the temperature rises. The rate of change $\Delta\lambda/\Delta T$ is 2.78 Å/°C. This is because the peak wavelength of the gain spectrum is shifted to the longer wavelength side due to rise of the temperature.

Figure 20A:
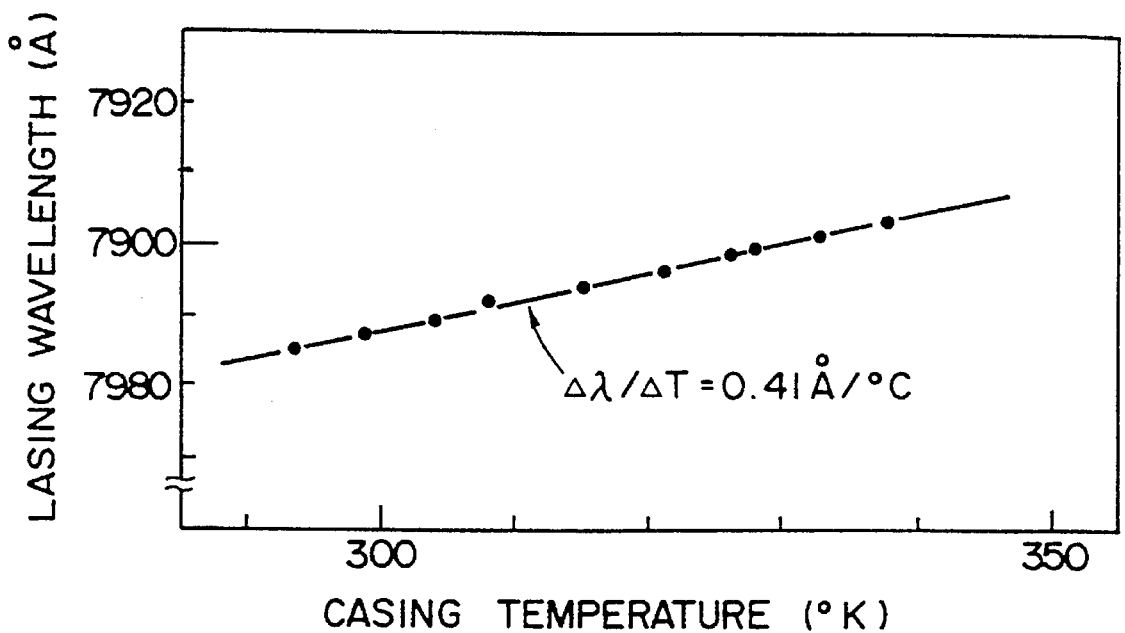
FIG. 20A is a graph of the relationship between the lasing wavelength and the casing temperature in the surface emission type semiconductor laser shown in FIG. 1.

FIG. 20A shows the relationship between the lasing wavelength and the casing temperature in the surface emission type semiconductor laser. As in the edge emission type semiconductor laser, the lasing wavelength is substantially linearly shifted to the longer wavelength side in response to rise of the temperature. This is because the refractive index in the semiconductor forming the resonator is changed on rise of the temperature since, as described, the lasing wavelength of the surface emission type semiconductor laser is determined depending on the effective resonator length. The rate of change $\Delta\lambda/\Delta T$ is 0.41 Å/°C. which is about one-seventh of that of the edge emission type semiconductor laser. In the surface emission type semiconductor laser, therefore, the peak wavelength of the gain spectrum will be moved to the longer wavelength side at a rate larger than that of the lasing wavelength depending on a change of the refractive index in response to rise of the temperature.

Figure 20B:
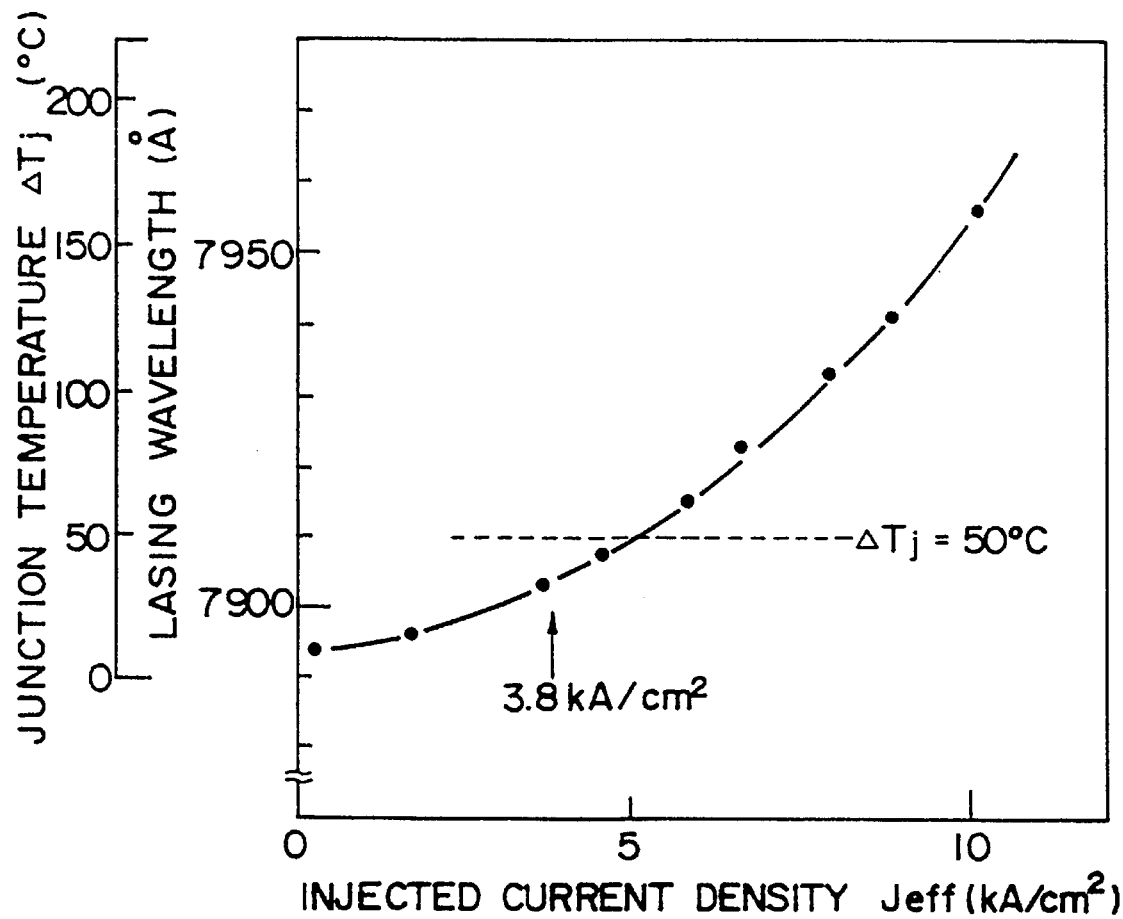
FIG. 20B is a graph of the relationship between the injected current density, lasing wavelength and junction temperature rise in the surface emission type semiconductor laser of FIG. 1.

FIG. 20B shows how the junction temperature and lasing wavelength of the surface emission type semiconductor laser increase depending on the injected direct current. As will be apparent from FIG. 20B, the junction temperature increases in proportion to the square of the injected current density. Thus, as with the rise of the casing temperature, peak wavelength and lasing wavelength of the gain spectrum will be shifted to the longer wavelength side in response to injection of the current. Also in such a case, the peak wavelength of the gain spectrum is shifted to the longer wavelength side at a rate larger than that of the lasing wavelength. To create the lasing and to reduce the threshold current for improving the efficiency of injection of the current, therefore, it is required that the peak wavelength of the gain spectrum has previously been set to be shorter than the lasing wavelength determined by the effective resonator length. Such a previously set wavelength difference $\Delta\lambda_{BS}$ will be called "gain offset". This is because if the peak wavelength of the gain spectrum is on the longer wavelength side of the lasing wavelength, the peak wavelength of the gain spectrum will be shifted further to the longer wavelength side in response to injection of the current to reduce the gain required for the lasing. If the peak wavelength of the gain spectrum is initially set to be excessively shorter than the lasing wavelength, the gain at the lasing wavelength will be too small to produce the lasing even when the peak wavelength of the gain spectrum is shifted to the longer wavelength side in response to injection of the current.

Experiments revealed that if the gain offset $\Delta\lambda_{BS}$ is larger than 20 nm, the lasing will not be produced and that if the gain offset $\Delta\lambda_{BS}$ is smaller than 5 nm, the light output will immediately be saturated. It is therefore desirable that the gain offset $\Delta\lambda_{BS}$ ranges between 5 nm and 20 nm.

Figure 21:
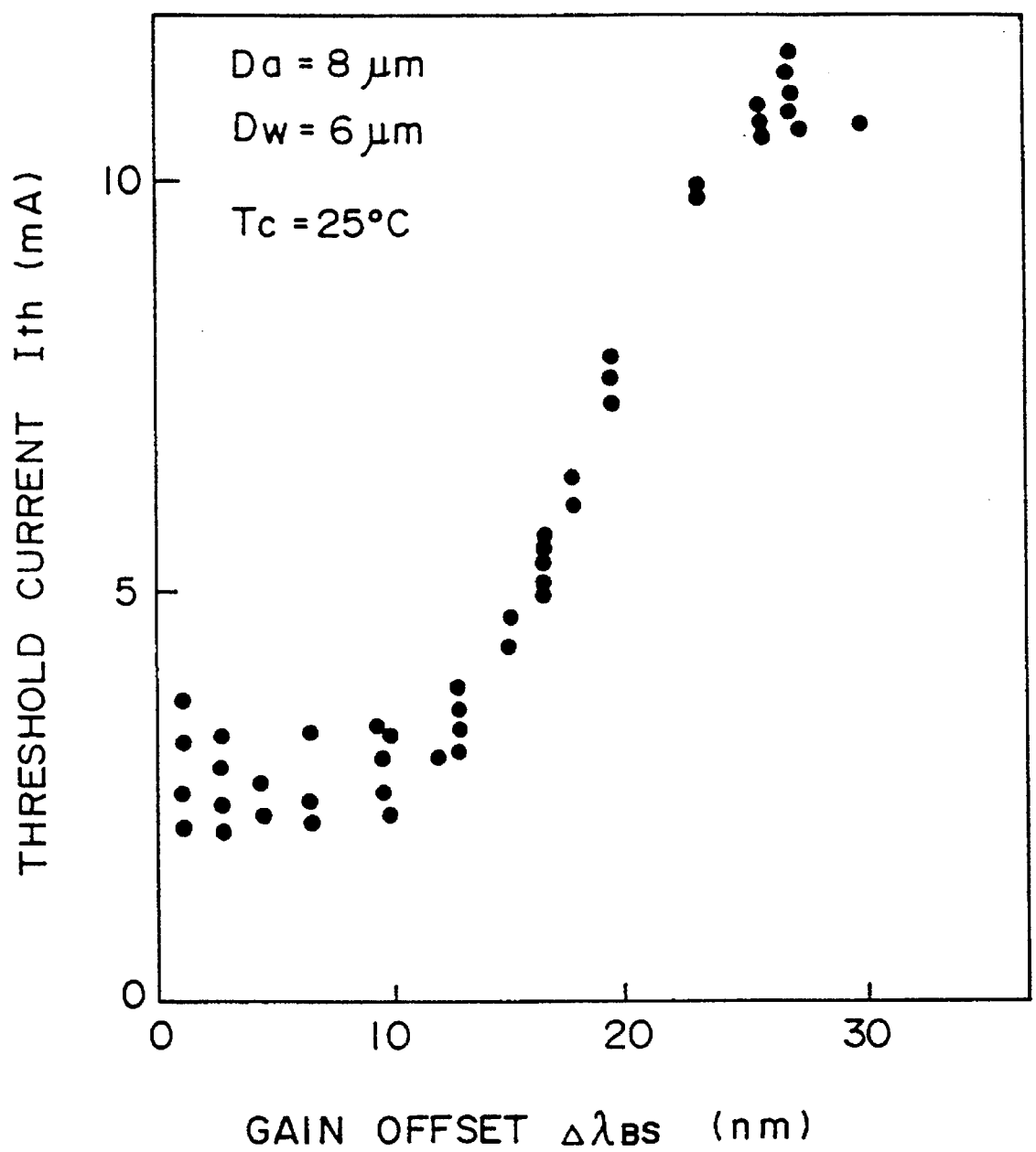
FIG. 21 is a graph of the relationship between the gain offset $\Delta\lambda_{BS}$ and threshold current in the surface emission type semiconductor laser of FIG. 1.

The numerical range of the gain offset $\Delta\lambda_{BS}$ will be described in more detail with reference to FIG. 21. In this figure, a vertical axis indicates the threshold current while a horizontal axis shows the gain offset $\Delta\lambda_{BS}$. If the diameter Da of the resonator portion is 8 µm in this embodiment, the threshold current bringing the current density to the maximum level or 10 kA/cm$^2$ is equal to 5 mA. Taking such a threshold current into consideration, it is understood from FIG. 21 that the gain offset $\Delta\lambda_{BS}$ being the maximum level at which the surface emission type semiconductor laser can continuously be driven is equal to about 20 nm. It is further understood from FIG. 21 that when the gain offset $\Delta\lambda_{BS}$ is smaller than about 5 nm, the threshold current increases to saturate the light output immediately. Thus, the gain offset $\Delta\lambda_{BS}$ is preferably between 5 nm and 20 nm, more preferably between 5 nm and 15 nm and most preferably between 10 nm and 15 nm. FIG. 21 shows data obtained when the resonator diameter Da and opening diameter Dw are set at particular values. Even if the values Da and Dw are changed, the third condition will not substantially differ since the lasing threshold current density is substantially invariable within the range of Da and Dw determined by this embodiment.

Further, when the temperature of the surface emission type semiconductor laser is varied, as described, the peak wavelength of the gain spectrum of the surface emission type semiconductor laser is changed. Therefore, the foregoing $\lambda_G$ needs to be measured at around a practical operation temperature of the surface emission type semiconductor laser.

Figure 24A:
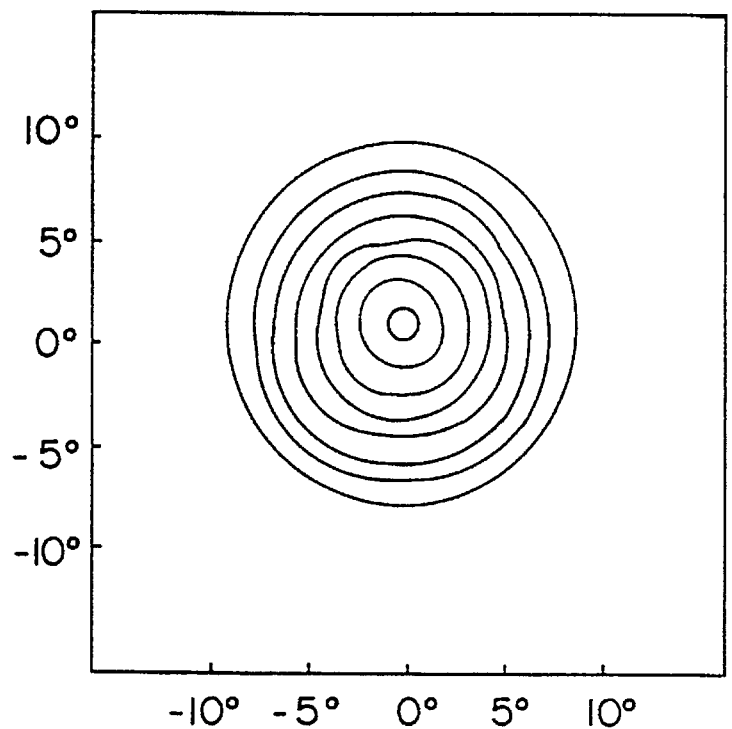
FIG. 24A is a contour plan view of the far field pattern intensity of lasing light when the resonator diameter Da is equal to 8 μm and the light exit port diameter Dw is 6 μm in the surface emission type semiconductor laser of FIG. 1.
Figure 24B:
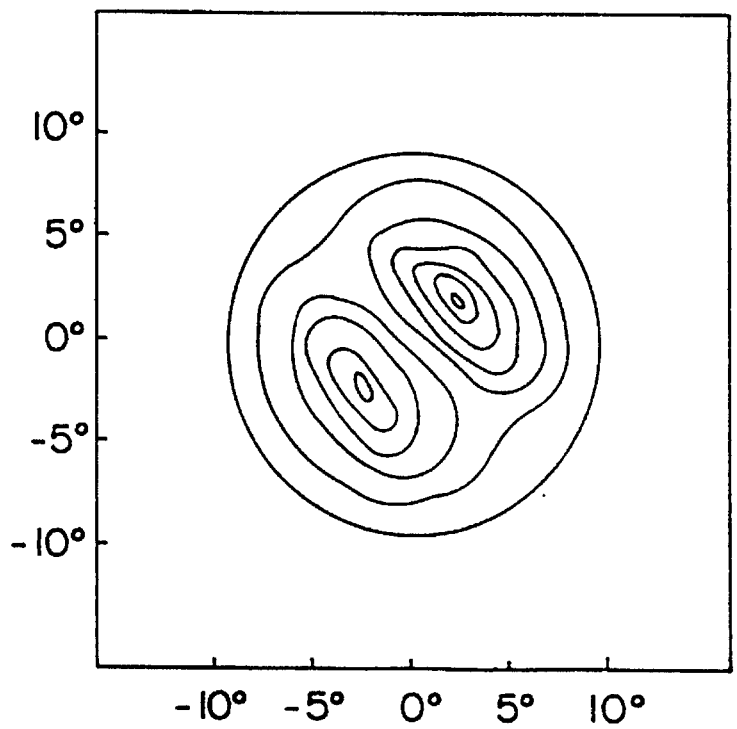
FIG. 24B is a contour plan view of the far field pattern intensity of lasing light when Da is equal to 13 μm and Dw is equal to 10 μm.

In the aforementioned conditions with respect to the spectrum, the surface emission type semiconductor laser requires that the lasing is produced in the basic transverse mode and also invariable with an increase of the injected current. If the lasing is produced at a higher-order transverse mode, the radiated beam will be of a complicated structure rather than a single-peak structure. This is not practical since a spread image will be formed by optically condensing such a spread beam. FIGS. 24A and 24B show measurements of the transverse mode characteristics of the laser light from the surface emission type semiconductor laser of the present invention. FIG. 24A is contour plan view of the far-field pattern of the emitted light from a surface emission type semiconductor laser in which Da=8 µm and Dw=6 µm. In such a case, the contour lines show the distribution according to emission angle from the surface emission type semiconductor laser. FIG. 24B shows the contour plan view of the far-field pattern of the emitted light from a surface emission type semiconductor laser in which Da=13 µm and Dw=10 µm, which is obtained in the same manner as in FIG. 24A. In FIG. 24A, the laser beam is formed into a completely circular cross-section having its full width at half maximum at a radiation angle of eight degrees. This means that the lasing is made according to the basic transverse mode. On the contrary, the contour plan view of the far-field pattern shown in FIG. 24B provides a laser beam of twin-peak cross-section and indicates that the lasing is made according to a higher-order transverse mode.

As will be apparent from FIGS. 24A and 24B, the characteristics of the laser in the transverse mode highly depend on the resonator and opening diameters (Da and Dw). As described, the emitted light must be in the basic transverse mode. It is thus preferred that the diameter of the resonator portion is within a predetermined range. The output of the oscillated light is advantageous to provide an increased light output since as the magnitude of the resonator increases, the light power density decreases at the exit plane. It is therefore preferred that the magnitude of the resonator is not too small. Table 4 shows the relationship between the size of Da and Dw and the laser light output.

TABLE 4

| RESONATOR DIAMETER (Da) (µm) | OPENING DIAMETER (Dw) (µm) | TRANSVERSE MODE | MAX LIGHT OUTPUT (mW) |
|---|---|---|---|
| 5 | 3 | BASIC | 0.3 |
| 6 | 4 | BASIC | 0.5 |
| 7 | 5 | BASIC | 0.9 |
| 8 | 6 | BASIC | 1.5 |
| 10 | 8 | BASIC | 2.3 |
| 12 | 8 | BASIC | 2.0 |
| 12 | 10 | HIGH | 3.0 |
| 16 | 14 | HIGH | 4.0 |

As will be apparent from Table 4, the order of the transverse mode becomes higher when the diameter Da of the resonator portion 114 exceeds 12 µm and the diameter Dw of the opening 113 exceeds 10 µm. Thus, the emitted light will be of a multi-peak structure rather than a single-peak structure. when Da is equal to or smaller than 6 µm and Dw is equal to or smaller than 4 µm, the maximum light output is about 0.5 mW. If Da and Dw are respectively equal to 12 µm and 8 µm and when the injected current increases, the transverse mode will be shifted to a higher-order mode with a relatively low current to produce an unstable light output (which will be called "kinking"). In this embodiment, therefore, the basic transverse mode lasing requires that Da is between 6 µm and 12 µm and Dw is between 4 µm and 8 µm. It is further preferable that Da is between 7 µm and 10 µm and Dw is between 5 µm and 7 µm.

How the film thickness of the second clad layer 106 in the resonator portion of FIG. 1 influences the lasing threshold will be described with reference to experiments. As shown in FIG. 17, in the surface emission type semiconductor laser of the present invention, current is injected into the active layer 105 through the ring-shaped upper electrode 112. The lasing occurs at the area adjacent to the center of the resonator in which the maximum gain is attained. This is because the light reciprocating in the interior of the resonator accomplishes the maximum gain at the area adjacent to the center of the resonator since the loss of light increases on the upper electrode and resonator interface at the periphery of the resonator. Since the injected current spreads and flows from the upper electrode into the active layer through the second clad layer, a non-uniform distribution of current density may occur in the interior of the resonator. For the injected current to provide an injected carrier density at the center of the resonator sufficient for lasing, therefore, the film thickness in the second clad layer must properly be selected. If the injected carrier density is insufficient, the threshold current will increase.

Figure 25B:
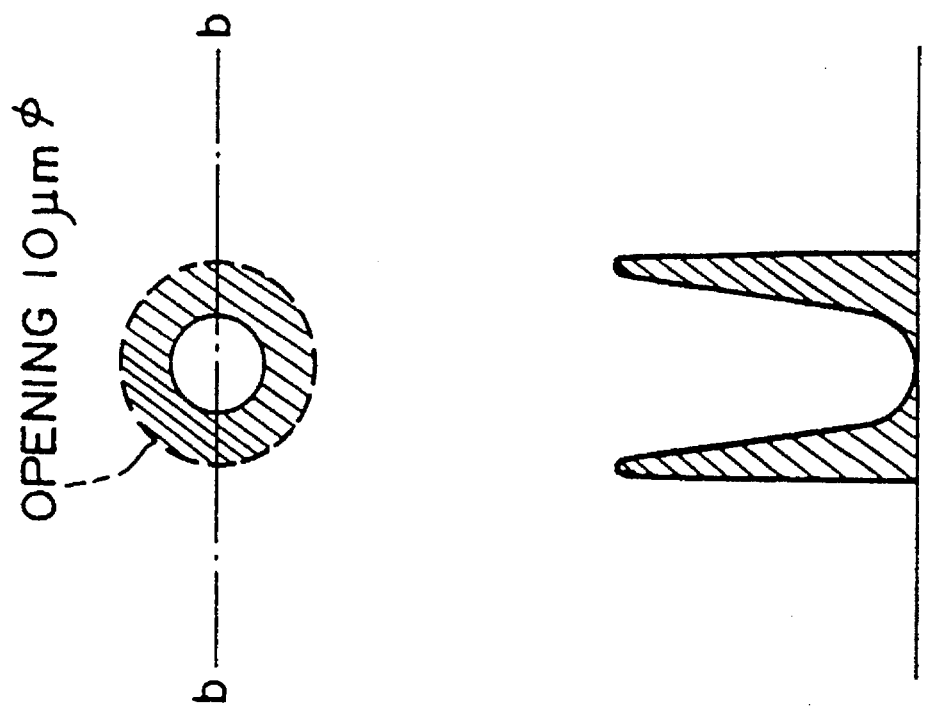
FIG. 25B is a view illustrating an emitted light image at a near field and a distribution of light intensity on a line b—b when the film thickness of the p-type clad layer is equal to 0.3 μm in the surface emission type semiconductor laser of FIG. 1.
Figure 25A:
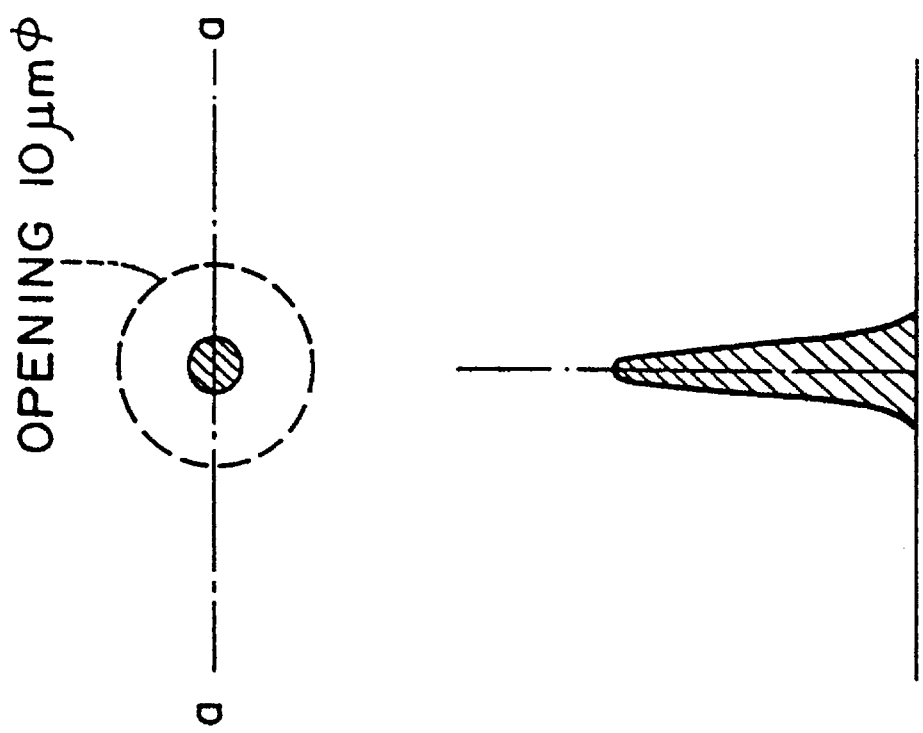
FIG. 25A is a view illustrating an emitted light near-field pattern and a distribution of light intensity on a line a-a when the film thickness of the p-type clad layer is equal to 1.0 μm in the surface emission type semiconductor laser of FIG. 1.

FIG. 25A shows a light emission near-field pattern (NFP) in the laser of this embodiment when the film thickness of the second clad layer 106 is 1.0 µm while FIG. 25B shows a spontaneous emission near-field pattern when the film thickness of the second clad layer 106 is 0.3 µm. The lower parts of these figures show the light intensities along lines a—a and b—b, respectively. FIG. 25A the shows near-field pattern of laser emission. FIG. 25B shows the near-field of spontaneous light emission. As will be apparent from FIG. 25B, the density of injected carriers becomes non-uniform when the film thickness of the second clad layer is too small. In this case, the injected carriers are more distributed at a location corresponding to the upper electrode 112 (contact metal). After all, the injected carriers will recombine and emit at the area adjacent to the upper electrode such that the injected carrier density will not increase at the area adjacent to the center of the resonator. Thus, the light output will be thermally saturated before it reaches the lasing threshold. On the contrary, if the second clad layer 106 has a sufficient film thickness as in FIG. 25A, a uniform density of injected carriers can be attained within the resonator to provide the maximum gain at the area adjacent to the center of the resonator, thereby accomplishing the lasing.

Figure 26:
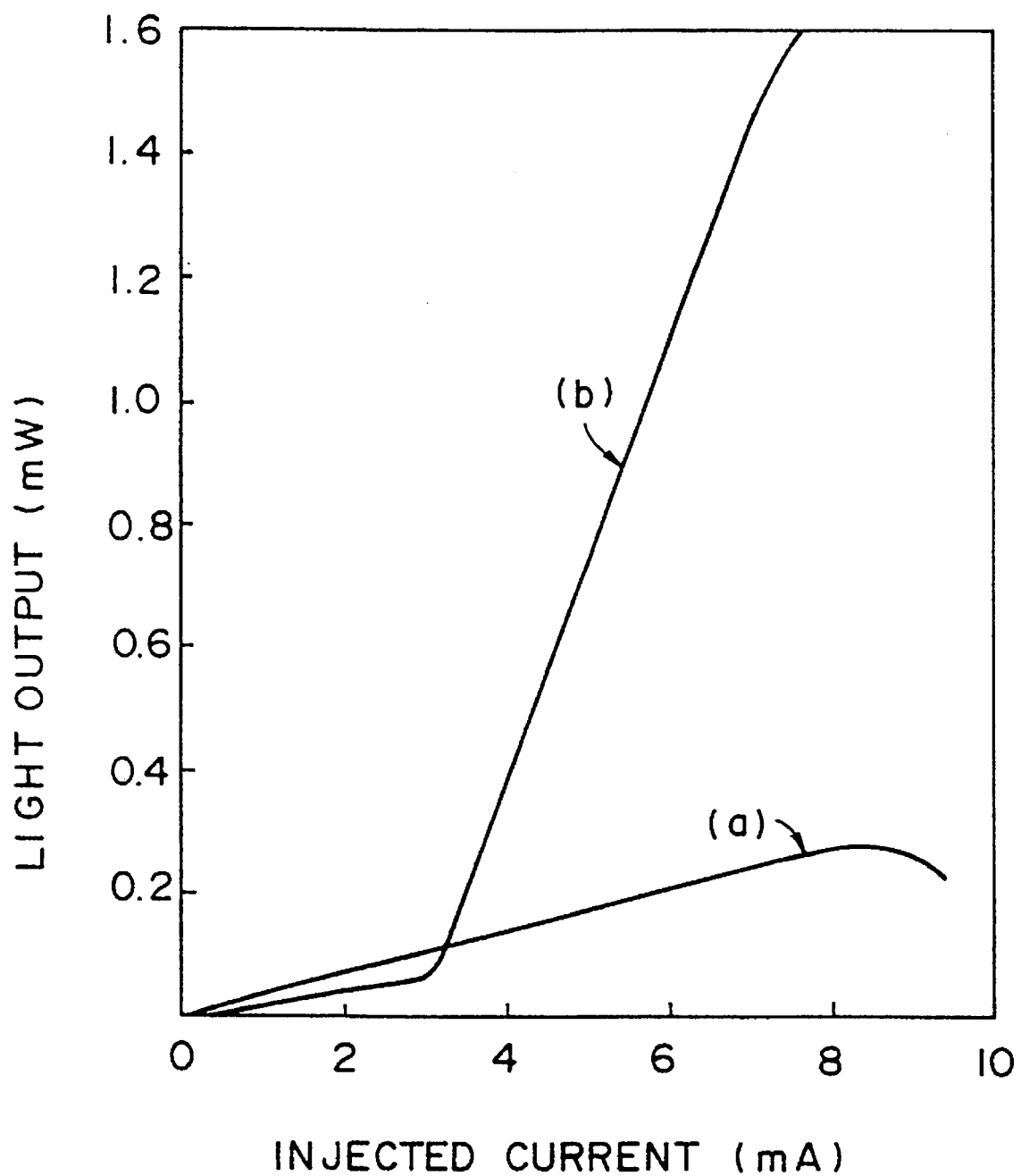
FIG. 26 is a graph illustrating the influence of the film thickness of the p-type clad layer to the relationship between the injected current and the light output in the surface emission type semiconductor laser of FIG. 1.

If the film thickness of the second clad layer is too small in the surface emission type semiconductor laser of the present invention, therefore, the injected carriers may be non-uniformly distributed to increase the lasing threshold current, so that the lasing may not be attained. FIG. 26 shows measurements of the I–L characteristic when the film thickness of the second clad layer 106 is 0.3 µm and 2.0 µm, respectively. A curve (a) shows the case when the film thickness is 0.3 µm, in which even if the injected current increases, only spontaneous emission occurs but no lasing, with the light output being saturated. On the contrary, a curve (b) shows another case where the film thickness is 2.0 µm, in which the lasing is initiated with the threshold current of 3 mA, with the slope efficiency of 0.35 W/A providing the lasing at the maximum light output of 1.5 mW.

Figure 27:
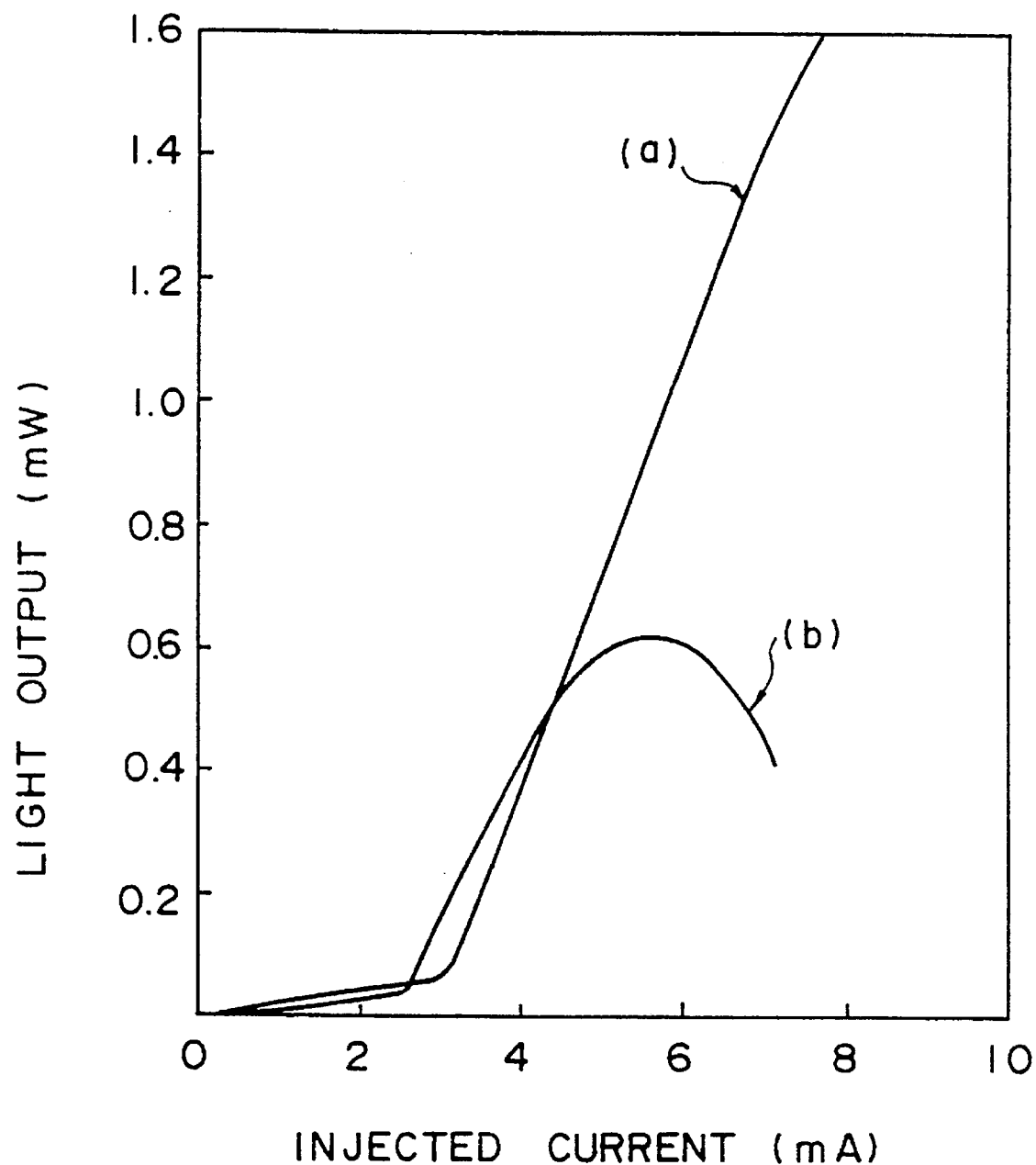
FIG. 27 is another graph illustrating the influence of the film thickness of the p-type clad layer to the relationship between the injected current and the light output in the surface emission type semiconductor laser of FIG. 1.

If the film thickness of the second clad layer is too thick, however, the element resistance in the device increases to increase the power consumption, resulting in thermal saturation of the light output at lower injection of current. Furthermore, it raises a problem in that the crystal growth requires a prolonged time period, resulting in reduction of the wafer manufacturing efficiency. In this embodiment, the element resistance exceeds 100Ω to reduce the maximum level of the light output when the film thickness of the second clad layer is equal to or larger than 3.5 µm. FIG. 27 shows the I–L characteristics when the film thickness of the second clad layer is 2.0 µm (curve (a)) and 4.0 µm (curve (b)). As will be apparent from FIG. 27, the resistance in the second clad layer increases if the film thickness thereof is too thick. As the injected current increases, the temperature of the element increases to cause the light output to be thermally saturated at a lower current level.

Thus, the appropriate thickness of the second clad layer in the resonator portion(s) is preferably between 0.8 µm and 3.5 µm and more preferably between 1.0 µm and 2.5 µm.

To distribute the injected carriers uniformly in the second clad layer and to accomplish a uniform injected carrier density in the active layer, it is also effective to reduce the resistivity in the second clad layer. Even if the film thickness of the clad layer is thinner, the resistivity may be reduced to provide better diffusion of the injected carriers, thereby providing an effect similar to an increase of the film thickness in the second clad layer. Table 5 shows resistivity and diffusion lengths of the injected carriers when the thickness of the $Al_{0.7}Ga_{0.3}As$ forming the second clad layer is 1 µm.

TABLE 5

| SPECIFIC RESISTANCE ($\Omega \cdot cm$) | DIFFUSION LENGTH (µm) |
| --- | --- |
| 1.0 | 7 |
| $2.0 \times 10^{-1}$ | 8 |
| $1.0 \times 10^{-1}$ | 9 |
| $1.0 \times 10^{-2}$ | 14 |
| $7.0 \times 10^{-3}$ | 16 |

When the diameter Dw of the opening in the surface emission type laser is equal to about 8 µm, it is preferred that the diffusion length of the injected carriers is similar to the diameter. Taking such a relationship into consideration, it is found from Table 5 that the resistivity is preferably equal to or smaller than $2\times10^{-1}$ Ω·cm. If the resistivity of the second clad layer is made smaller than $7\times10^{-3}$ Ω·cm through an increased doping as in the DBR mirror, however, the light absorption from free carriers introduced by the doping is not negligible, resulting in reduction of the emission efficiency. It is therefore preferred that the resistivity of the second clad layer is between $7\times10^{-3}$Ω·cm and $1\times10^{-1}$ Ω·cm.

It is more preferred that the preferred ranges of both the thickness and resistivity in the second clad layer are fulfilled.

A method of producing a surface emission type semiconductor laser having a reduced threshold current and an improved external differential quantum efficiency will be described in detail. As described, the crystal growing technique is one of the most important factors in the surface emission type semiconductor laser of the present invention since the DBR mirror layer and multiple quantum well structure are formed through crystal growth. Such a crystal growing technique requires:

(1) The hetero-interface is sharp, namely in the order of an atom layer.

(2) The film thickness is substantially uniform over a wide area.

(3) The reproducibility of film-thickness, composition and doping efficiency is high.

Particularly, the sharpness of the interface of item (1) is important to improve the characteristics of the surface emission type semiconductor laser. Methods of ensuring the sharpness of the interface in the compound semiconductor crystal growing technique include the molecular beam epitaxy (MBE) method and the metal-organic vapor phase epitaxy (MOVPE) method. The liquid phase epitaxy (LPE) method enables high purity crystals to be grown, but is not suitable for use in production of the surface emission type semiconductor laser since it is difficult to accomplish the required sharpness of the hetero-interface on growth from liquid phase to solid phase. On the contrary, the MBE and MOVPE methods can theoretically provide the sharpness of the interface in the order of an atom layer since the crystal is grown from a molecular beam or vapor phase to solid phase.

However, the MBE method cannot increase the growth speed since the crystal is formed from a molecular beam and can only provide a relatively slow growth speed as in the order of 0.1 to 1 Angstroms/second. Therefore, the MBE method is not suitable for use in such crystal growth that requires an epitaxial layer thickness of about few microns as in the surface emission type semiconductor laser. In the MBE method, furthermore, it is difficult to grow a crystal with uniformity and high quality in an increased area from the structural limitation. Moreover, the number of continuous crystal growth steps is limited from the limitation of charged material. This results in limitation of the throughput of crystal growth, leading to difficulty of the mass-production of substrates.

On the contrary, the MOVPE method used in this embodiment can provide the same sharpness of the hetero-interface in the order of an atom layer as the MBE method, as described in connection with the relationship between the film thickness of the quantum well structure and the peak wavelength (see FIG. 10). Such a vapor phase growth can provide a growth speed between 0.1 Angstroms/second and several tens Angstroms/second by changing the supply of material.

Figure 28:
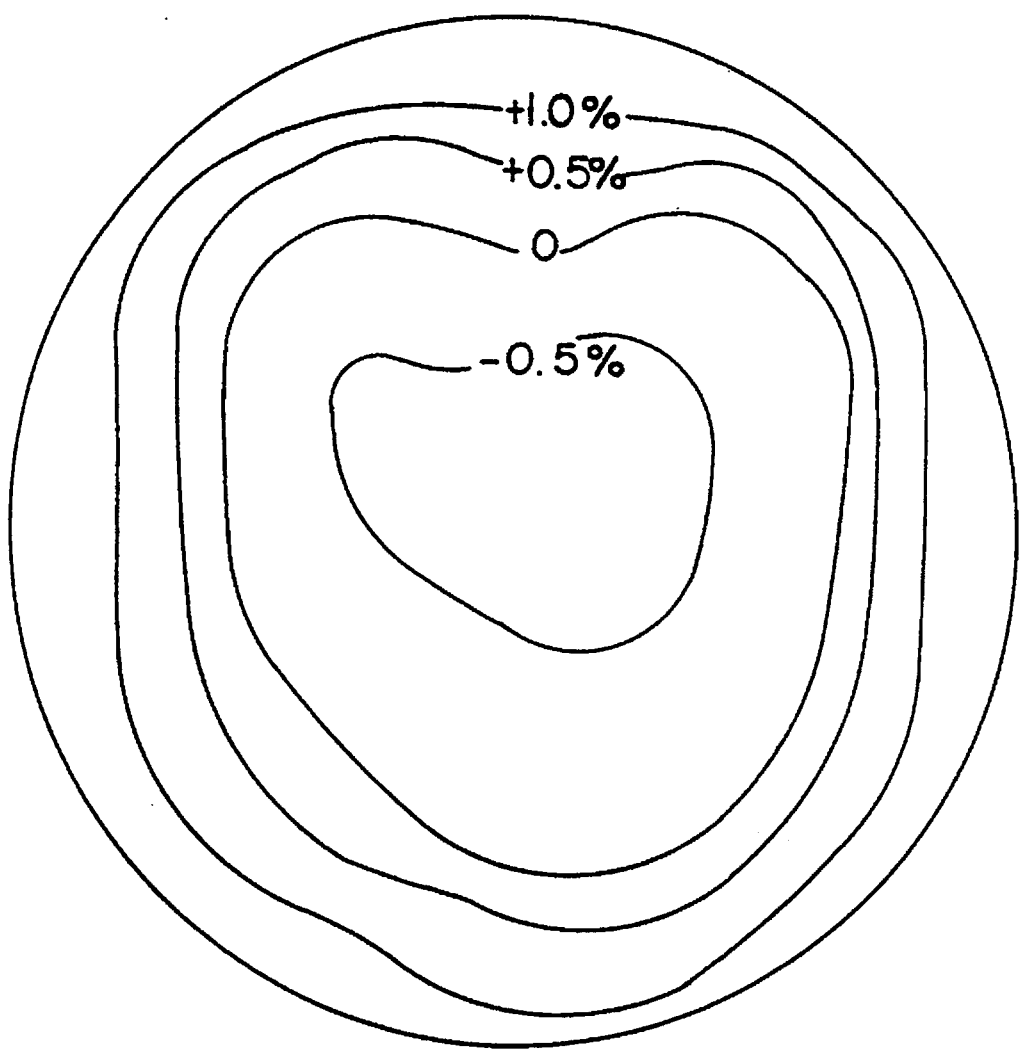
FIG. 28 is a view showing the distribution of film thickness in a semiconductor deposition wafer provided by the process of making the surface emission type semiconductor laser according to the first embodiment of the present invention.

As to the uniformity of the film thickness of the above item (2), film thickness tolerance of ±2% could be provided over substantially 75% of the area in a substrate having a diameter of 3 inches by optimizing the configuration of the reaction tube in the crystal growing device, as shown in FIG. 28.

As to the item (3), the film thickness, composition and doping efficiency can be improved in reproducibility since the MBE and MOVPE methods theoretically well control the crystal growth.

For the above reasons, the MOVPE method is preferably used to grow the crystal for accomplishing the surface emission type semiconductor laser of the present invention.

When the MOVPE method is combined with the following process, the epitaxial layer can be formed with improved reproducibility and controllability.

Figure 29:
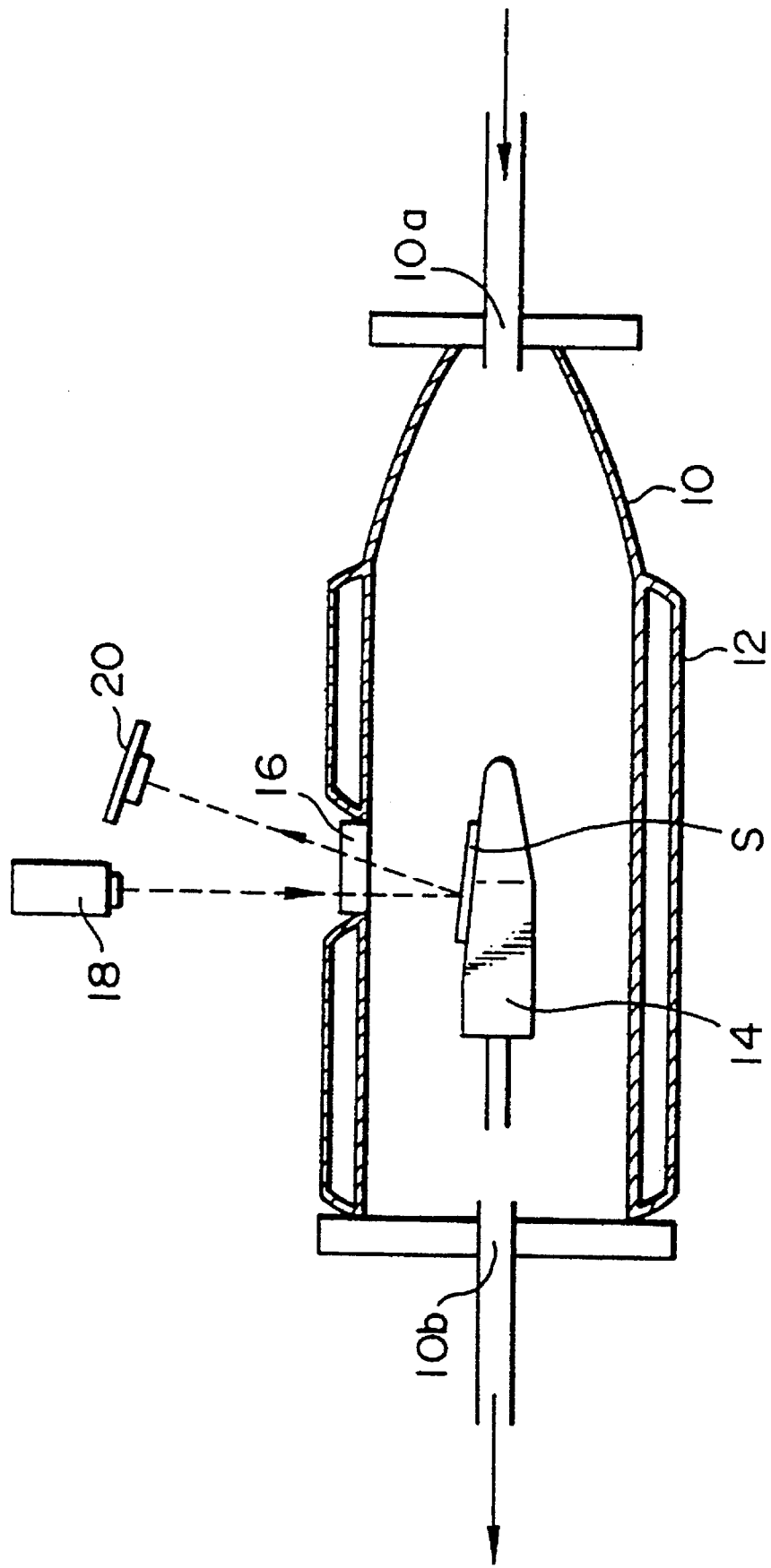
FIG. 29 is a cross-sectional view diagrammatically showing the MOVPE apparatus used on forming the DBR mirror in the surface emission type semiconductor laser of FIG. 1.

FIG. 29 shows a film forming apparatus to which the MOVPE method is applied and which can measure the reflectivity of the epitaxial layer at all times during the crystal growth. The film forming apparatus in the form of an MOVPE system which uses a transverse water-cooled reaction tube is characterized in that a water-cooled tube portion above the growth substrate may be omitted and a window provided through which light is transmitted from the outside of the reaction tube onto the growth substrate.

The MOVPE apparatus comprises a reaction tube 10 having gas supply and exhaust portions 10a, 10b and a cooling section 12 mounted around the reaction tube 10, in which water flows to cool the reaction tube 10. In the reaction tube 10, there is a susceptor 14 on which a substrate S is to be placed. A window 16 is formed in the wall of the reaction tube 10 at the side opposite to the susceptor 14 side on which the substrate S is placed. A light source 18 and photosensor 20 are disposed above the window 16. Light from the light source 18 is transmitted to the substrate S on the susceptor 14 through the window 16. The reflective light is returned to the photosensor through the window 16.

The light from the light source 18 enters the substrate S in a direction substantially perpendicular to the plane of the substrate (5 degrees maximum). When the reflective light is measured by the photosensor 20, the varying reflectivity of the epitaxial layer can be determined while the epitaxial layer is growing on the substrate S.

In this embodiment, the light source 18 is in the form of a semiconductor laser having a lasing wavelength of 800 nm to provide a central lasing wavelength of 800 nm to the DBR mirror. However, the light source 18 may be replaced by any other suitable means such as a semiconductor laser having another wavelength different from that of wavelength of 800 nm or a wavelength variable light source using a spectroscope or the like. This allows to measure the reflectivity at any wavelength.

From the aforementioned relationship between the reflectivity of the DBR mirror and the emission characteristics of the surface emission type semiconductor laser (see FIG. 18), it is desired that the DBR mirror has its reflectivity equal to or higher than 99.5% at a given wavelength. To meet such a requirement, the thickness of each of the layers forming the DBR mirror must be equal to $\lambda/4n$ where $\lambda$ is the given wavelength and n is the refractive index at the given wavelength.

In the prior art, the film thickness of each layer is controlled by changing the crystal growth speed and time. However, the prior art has some problems. The first problem resides in the fact that the speed of crystal growth should be maintained invariable. If the growth speed varies, it becomes difficult to provide a reflectivity equal to or higher than 99.5% even if the number of layer pairs in the DBR mirror is increased. The second problem resides in the fact that the refractive index n of the semiconductor layer functioning as a factor for determining its film thickness varies depending on wavelength. Thus, the refractive index must be accurately measured in each layer for a given wavelength. Such measurement is very difficult. The third problem is that since the reflectivity is measured in a wafer removed from the reaction tube after the crystal growth therein has been terminated, the reflectivity can be measured only for the structure above the DBR mirror. The reflectivity of only the DBR mirror cannot be measured at all.

These problems can be overcome by growing the epitaxial layer through the MOVPE method while measuring the reflectivity at the same time. The mechanism will be described below.

Figure 30:
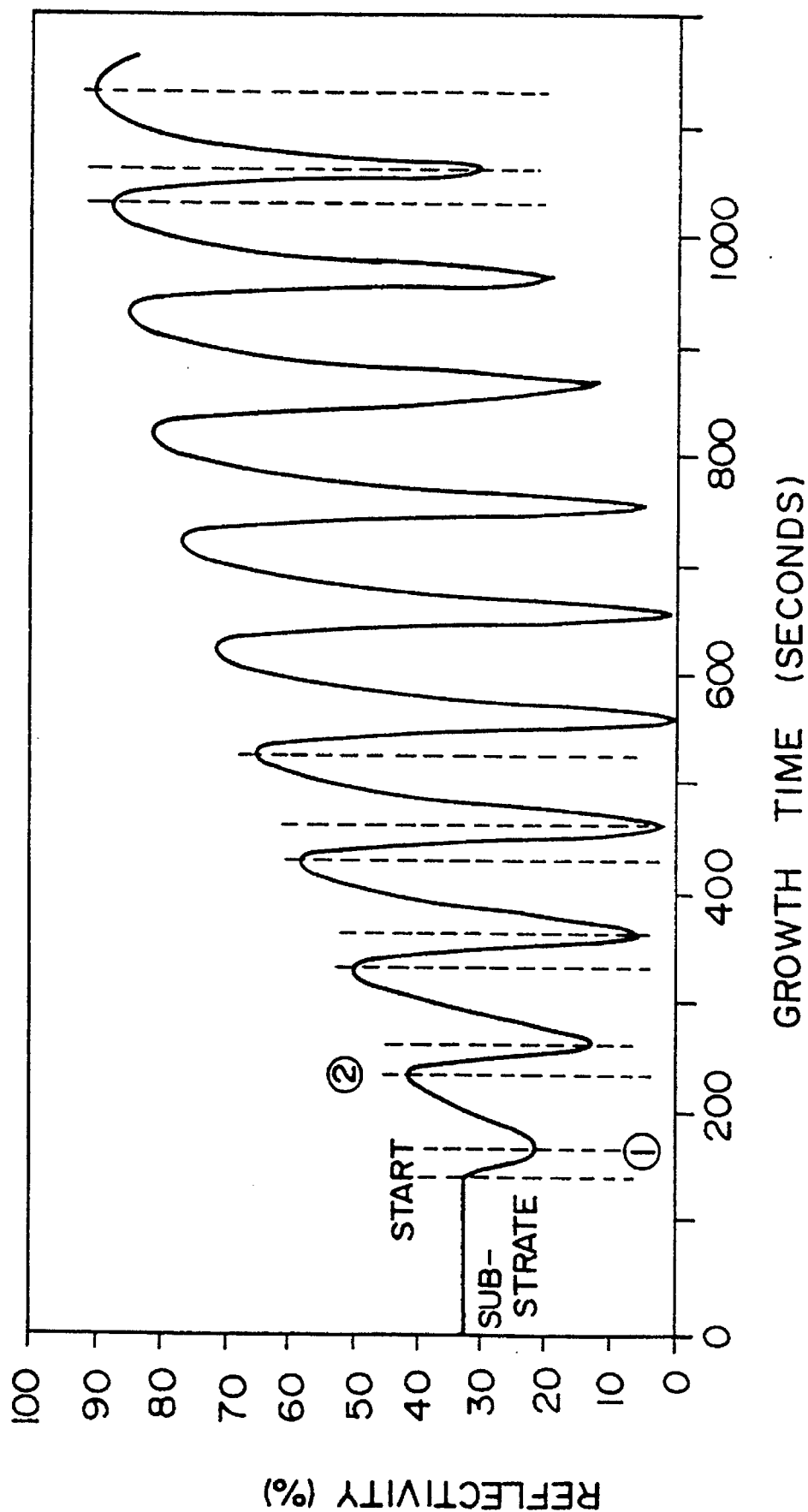
FIG. 30 is a graph of the relationship between the growth time of the epitaxial layer and the reflectivity in the process of forming the DBR mirror in the surface emission type semiconductor laser of FIG. 1.

FIG. 30 shows the reflectivity in the epitaxial layer versus time in a process of forming a DBR mirror 103 for the surface emission type semiconductor laser of this embodiment through the MOVPE film forming device shown in FIG. 29.

As will be apparent from FIG. 30, a layer of $Al_{0.8}Ga_{0.2}As$ having a lower refractive index $n_1$ is first deposited on a substrate of GaAs. As the film thickness increases, the reflectivity decreases. As the film thickness reaches $\lambda/4n_1$, there is a minimum point 1. Such a minimum point is monitored to switch the process to a mode in which a layer of $Al_{0.15}Ga_{0.85}As$ having a higher refractive index $n_2$ is deposited. As the film thickness in the $Al_{0.15}Ga_{0.85}As$ layer increases, the reflectivity increases. When the film thickness becomes $\lambda/4n_2$, the process reaches a maximum point 2. At this maximum point 2, the process is again switched to deposit a layer of $Al_{0.8}Ga_{0.2}As$ having the lower refractive index. Such a process is repeated. Thus, the reflectivity in the DBR mirror repeatedly increases and decreases and finally reaches the maximum level as a whole.

The profile of reflectivity does not depend on the speed and time of crystal growth and depends on the film thickness and the refractive index of each layer. If the Al composition of a layer is changed at the maximum and minimum point (first-order differentiated value=0) in the profile of reflectivity and when epitaxial layers having different refractive indexes are alternately grown and deposited, the DBR mirror can include layers each having a thickness in agreement with the theoretical thickness ($\lambda/4n$). If a semiconductor laser having a given lasing wavelength is used as a source of input light for measuring the reflectivity, the $\lambda$ value can be precisely set. Thus, the refractive index n can be also determined from the film thickness of each layer.

Since the reflectivity of the DBR mirror itself can be measured during the crystal growth, the number of layer pairs in the DBR mirror can be changed during formation of the layers. Further, the structure can be optimized.

Since the film thickness of each of the layers above the DBR mirror can also be controlled based on the growth speed of each layer of the DBR mirror obtained from the reflectivity measurement during the DBR mirror film formation, the crystal growth substrate can be produced with improved reproducibility and throughput, in comparison with the prior art film forming method which can not measure the growth speed of crystalization. In fact, the growth method of this embodiment could controllably provide DBR mirrors each having the necessary reflectivity equal to or higher than 99.5%.

The aforementioned method of monitoring the layer reflectivity to control the film thickness of the crystal layer may similarly be applied to any other suitable film forming process such as the MBE method in addition to the MOVPE method.

Another embodiment of the present invention in which the aforementioned reflectivity monitoring method is used in a process of forming a column-like resonator portion through the RIBE method will be described.

As described, the resonator portion 114 is produced by etching through the RIBE method since this method allows the resonator portion 114 to have its vertical sidewalls without damage of the surface. In such a formation of the column-like resonator portion, it is important to control the depth of etching, that is, the remaining film thickness t of the second clad layer 106. The reason why the remaining film thickness must be controlled to provide a predetermined thickness has already been described.

A process of measuring the remaining film thickness while performing the dry etching through the RIBE method will be described more particularly.

Figure 31:
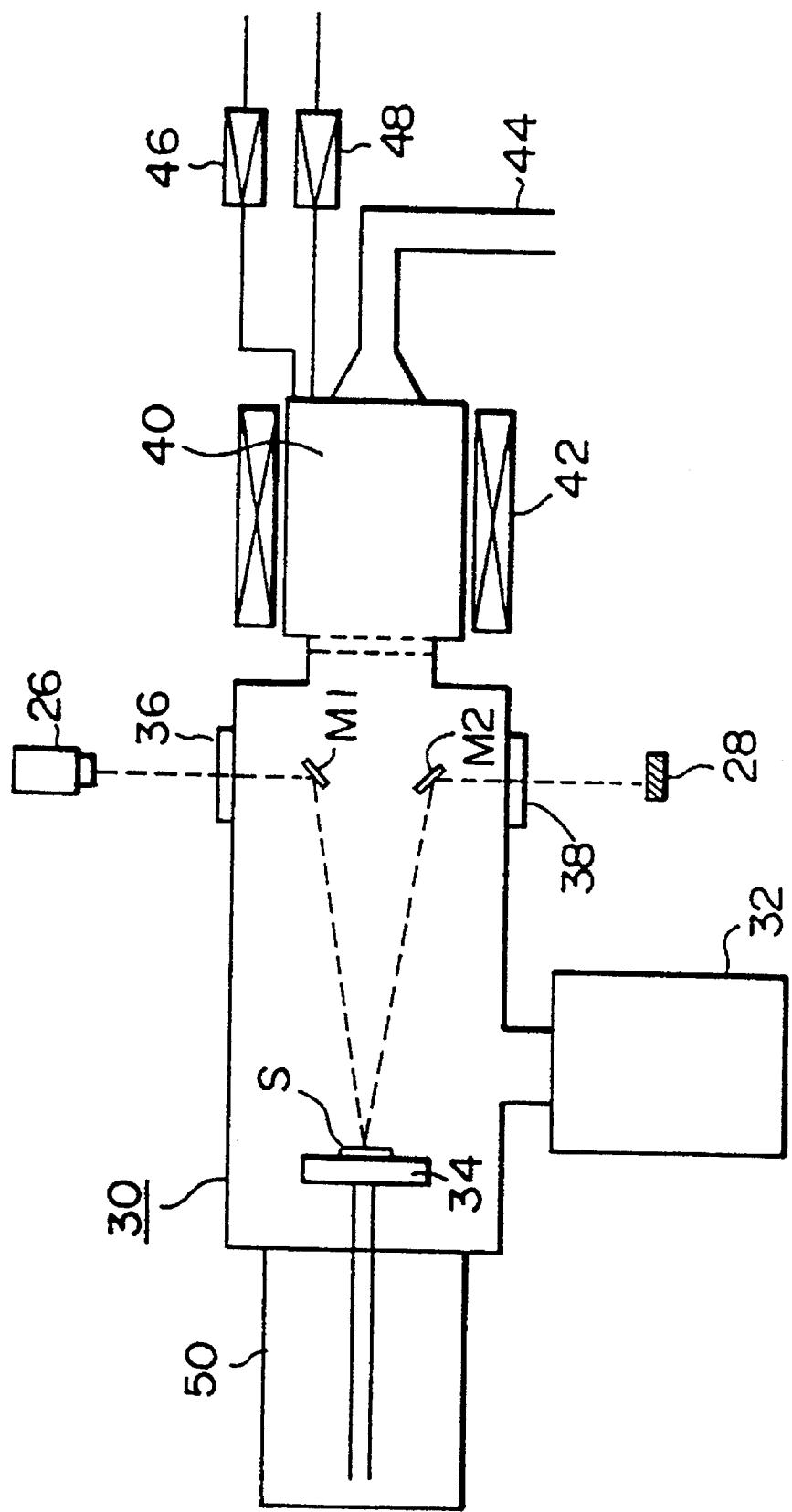
FIG. 31 is a cross-sectional view diagrammatically showing the RIBE apparatus used in the process of making the surface emission type semiconductor laser of FIG. 1.

FIG. 31 schematically shows one example of an RIBE apparatus which can measure the reflectivity of an epitaxial layer while etching is being performed.

The RIBE device comprises an etching chamber 30 communicating with a plasma chamber 40 and a vacuum pump 32 functioning as exhaust means. The etching chamber 30 includes a holder 34 on which a substrate S is to be placed at a position opposite to the plasma chamber 40. The holder 34 can move forward and rearward through a load and lock chamber 50. The sidewall of the etching chamber 30 on the side of the plasma chamber 40 includes windows 36 and 38 which are positioned opposite to each other. A pair of reflecting mirrors M1 and M2 are located within the etching chamber 30 on a line connecting the windows 36 and 38. A light source 26 having a desired wavelength is located outside one window 36 while a photosensor 28 is located outside the other window 38. The plasma chamber 40 is connected to a microwave introducing section 44 and gas supply sections 46 and 48 for supplying a reactive gas into the plasma chamber 40. A magnet 42 is located around the outside of the plasma chamber 40. As for the light source 26, light with a desired wavelength such as light through a spectroscope may be used.

The RIBE device can not only etch a crystal layer formed on the substrate S through any conventional method, but also monitor the reflectivity or reflectivity spectrum of the crystal layer on the substrate S by irradiating light from the light source 26 through the window 36 and reflecting mirror M onto the substrate S and then measuring the reflective light by the photosensor 28 through the reflecting mirror M2 and window 38.

A process of measuring the remaining film thickness t in the second clad layer during the etching will more particularly be described with reference to FIGS. 32A–32C.

Figure 32C:
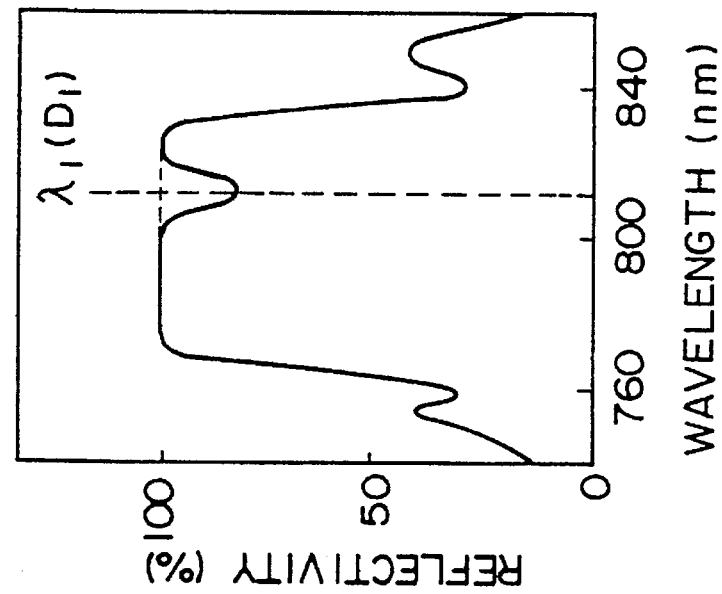
FIG. 32A–32C are graphs showing variations of the reflectivity spectrum in the RIBE process.
Figure 32B:
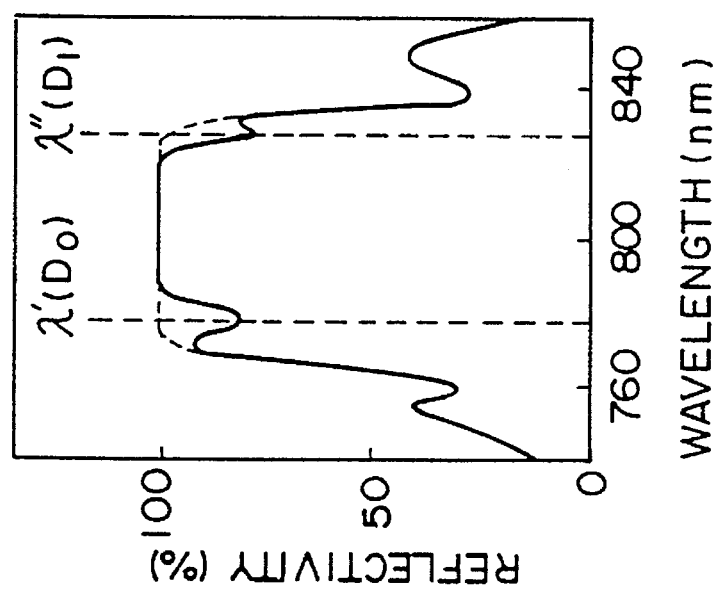
Figure 32A:
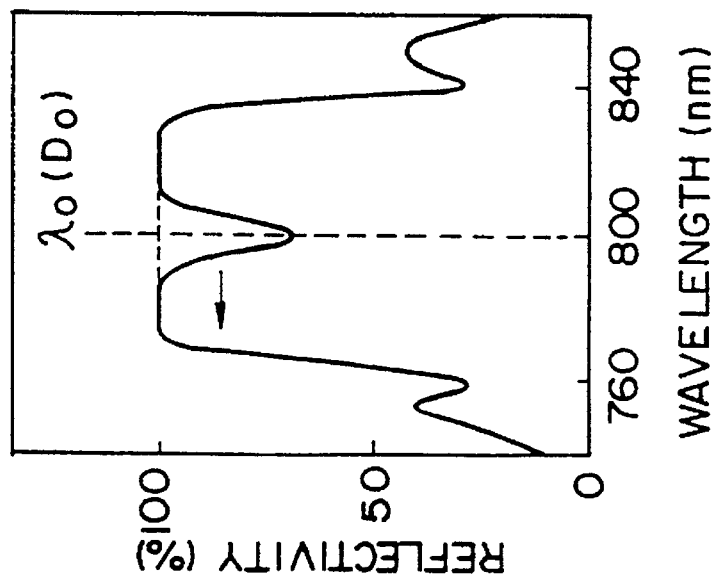

The epitaxial crystal layer structure forming the resonator before etching (shown in FIG. 22A) exhibits such a reflection spectrum as shown in FIG. 32A. This spectrum is equivalent to the spectrum 1802 as shown in FIG. 18, and is characterized in that the reflectivity decreases at the wavelength $\lambda_0$, meaning dip ($D_0$) is present.

The wavelength $\lambda_0$ of this dip $D_0$ corresponds to the total film thickness of the crystal layers above the DBR mirror. As the film thickness is reduced through the etching, the dip $D_0$ moves to the shorter wavelength side to provide a wavelength $\lambda'$ (see FIG. 32B).

Furthermore, a second dip D1 (which has a wavelength of $\lambda''$) is produced on the longer wavelength side and then moves to the wavelength $\lambda 1$ on the shorter wavelength side (see FIG. 32C). As the etching is further continued, a new dip is again produced on the longer wavelength side. Such movement and occurrence of the dips are repeated. If it is assumed that the a-th dip from the state before the etching has a wavelength $\lambda a$, the amount of etching $\Delta a$ is represented by the following formula (3):

$$\Delta a = \frac{1}{n}\left(\Theta + \frac{m}{2}\right)\lambda 0 - \left(\Theta + \frac{m-a}{2}\right)\lambda a$$

where $m = \frac{\lambda'' + 2\Theta(\lambda' - \lambda'')}{\lambda'' - \lambda'}$    Formula (3)

where $\Theta$ is a constant depending on the structure and equal to ½ or ¼ in this embodiment and n is the mean refractive index in the epitaxial layer.

Even if a dip is shifted to the shorter wavelength side out of a higher reflectivity band through the etching, another dip corresponding to the next longitudinal mode will be produced on the longer wavelength side and then further move to the shorter wavelength side. Therefore, the amount and speed of etching can be controlled by measuring the number of dips existing in the higher reflectivity band and their movement during the etching. In such a manner, the resonator portion 114 can precisely be produced with a predetermined film thickness t left in the second clad layer.

Since the level and shape of the reflection spectrum can be simultaneously monitored during the etching, the estimation for contaminant and damage on the surface can be carried out during the etching. Results of such an estimation can be fed back to the etching conditions.

A process of etching a layer of $SiO_2$ through the RIE method by use of the reflectivity monitoring means will be described.

In the process of producing the surface emission type semiconductor laser shown in FIG. 1, the p-type contact layer 109 on the resonator surface is covered with the surface protective $SiO_2$ layer I (see FIG. 22B) before the ring-like upper electrode 112 is formed on the laser beam exit side. To form the upper electrode, however, the $SiO_2$ layer must completely be etched. If the etching is carried out beyond necessity, the contact layer will also be etched to damage it or to change the resonator length relating to the lasing wavelength.

It is therefore important to control the etching of the $SiO_2$ layer. In this embodiment, therefore, the RIE device for etching the $SiO_2$ layer is used with a process of measuring the reflectivity in the epitaxial crystal layer to determine the amount of etching during the etching step.

Figure 33:
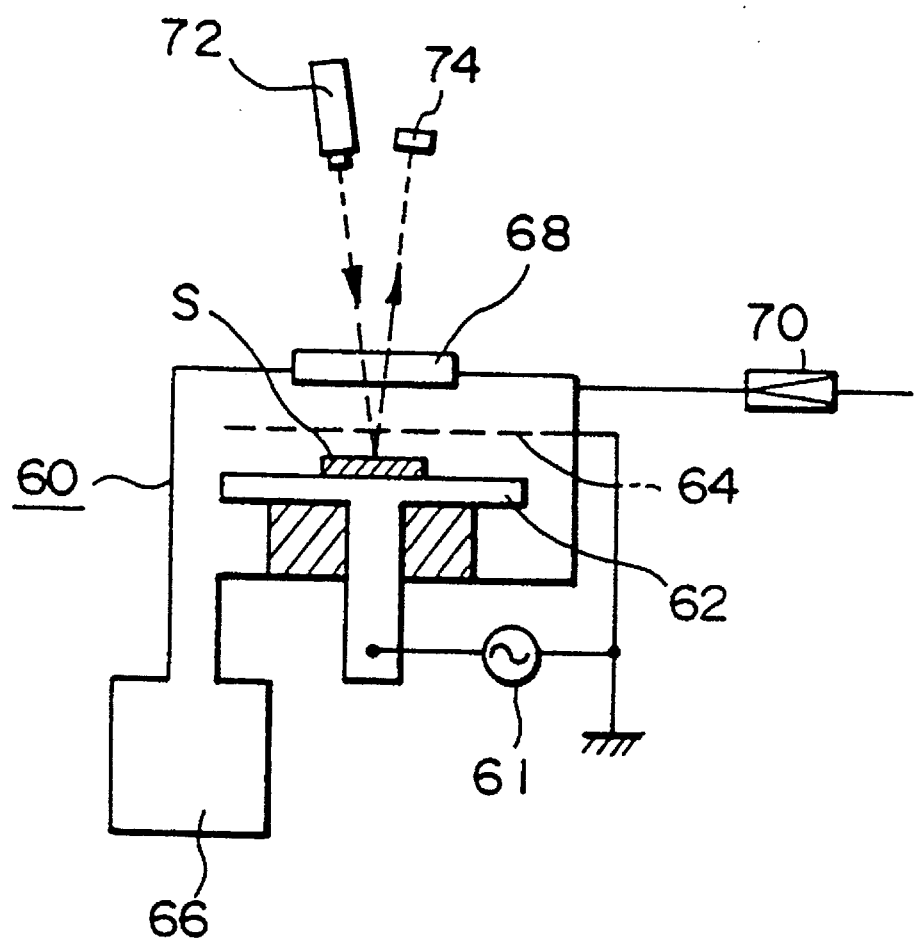
FIG. 33 is a cross-sectional view diagrammatically showing the RIE apparatus used in a process of etching the surface emission type semiconductor laser of FIG. 1.

FIG. 33 schematically shows a parallel flat plate type RIE device using the reflectivity measuring means. The RIE device comprises an etching chamber 60 in which there are a placement electrode 62 and a mesh-like counterpart electrode 64. The placement electrode 62 is connected to an RF oscillator 61. The etching chamber 60 is connected to a gas supply section 70 and a vacuum exhaust pump 66. The wall of the etching chamber 60 opposite to the placement electrode 62 includes a window 68 formed therethrough. A light source 72 and photosensor 74 are located outside the window 68. Light with a desired wavelength from the light source 72 is transmitted onto a substrate S through the window 68. The reflective light from the substrate S enters the photosensor 74 through the window 68. The RIE device not only etches the $SiO_2$ layer through the conventional mechanism, but also monitors the reflectivity or reflectivity spectrum on the etched surface by sensing the reflective light.

Figure 34:
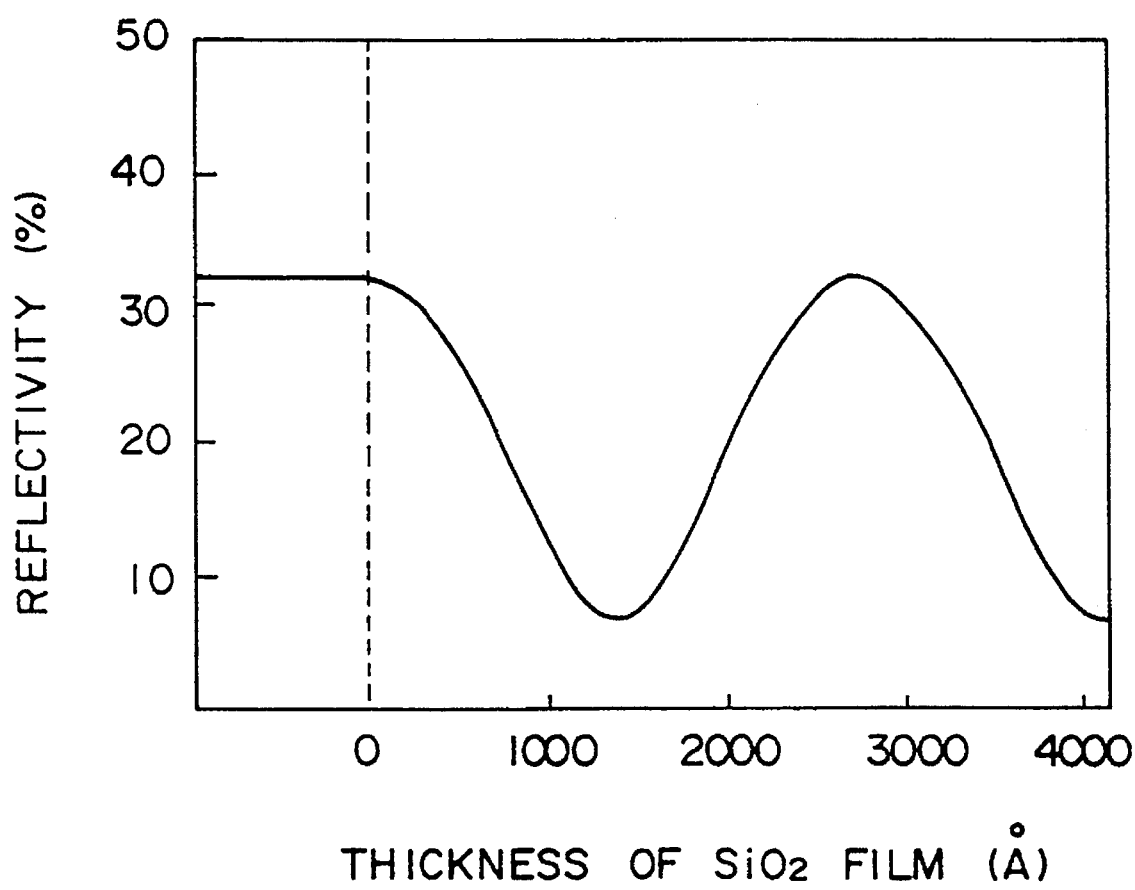
FIG. 34 is a graph of the relationship between the film thickness of $SiO_2$ layer and the reflectivity in the case the RIE apparatus shown in FIG. 33 is used.

FIG. 34 shows variations of the reflectivity for light of 800 nm when the $SiO_2$ layer is on the p-type contact layer 109. In FIG. 34, a horizontal axis indicates the film thickness of the $SiO_2$ layer while a vertical axis shows the reflectivity. As shown, the reflectivity varies depending on the remaining film thickness in the SiO₂ layer. Each time the remaining film thickness becomes an integer multiple of λ/4n, the reflectivity reaches a maximum or minimum. It is assumed herein that $\lambda$ is the wavelength of the measuring light and n is the refractive index in the SiO₂ layer. Thus, the SiO₂ layer can completely be etched by measuring the reflectivity and monitoring the reflectivity curve during the RIE etching.

After the SiO₂ layer has completely been etched, the dip in the reflectivity may be measured to determine the resonator length by using any suitable light source for measuring the reflectivity during RIE, such as light passed through a spectroscope or a laser beam of variable wavelength, which irradiates light having a wavelength ranging between 700 and 900 nm. More particularly, as the RIE etching is carried out while measuring the dip in the reflectivity, the amount of etching can be determined accurately to control the resonator length in accordance with the aforementioned formula 3. The reason why the RIE method is used is that the etching can be carried out in the same apparatus after the SiO₂ layer for protecting the p-type contact layer 109 has completely been etched and that the resonator length can more easily be controlled since the RIE method can be performed at a speed lower than that of the RIBE method. At this time, the etching conditions used are etching pressure of 2 Pa, RF power of 70 W and CHF₃ for the etching gas. Further, when the resonator length of the epitaxially grown films is changed extensively, the RIE method may be performed after the completion of the foregoing step.

As described, the surface emission type semiconductor laser of the present invention can be preferably accomplished by providing a predetermined relationship between the higher reflectivity band of the DBR mirror, the lasing wavelength determined by the resonator length and the gain offset. Even if such a relationship is not established after the epitaxial growth, however, the RIE monitoring the reflectivity may be used to etch the contact layer so as to adjust the resonator length precisely to a desired length and to produce a high-precision device with improved yield. This is because while the contact layer is required for measuring the gain spectrum of the active layer or the lasing spectrum of the edge emission type semiconductor laser, etching the contact layer of the surface emission type semiconductor laser does not change the gain spectrum which is determined by the p-type and n-type clad layers and active layer. In other words, etching the contact layer enables $\lambda_{EM}$ to be adjusted without changing $\lambda_G$.

By using the etching process monitoring the reflectivity, resonator portions having different lengths may precisely be produced on the same substrate. Thus, a single substrate may be used to produce a plurality of surface emission type semiconductor lasers having different lasing wave lengths.
(Second Embodiment)

Figure 40A:
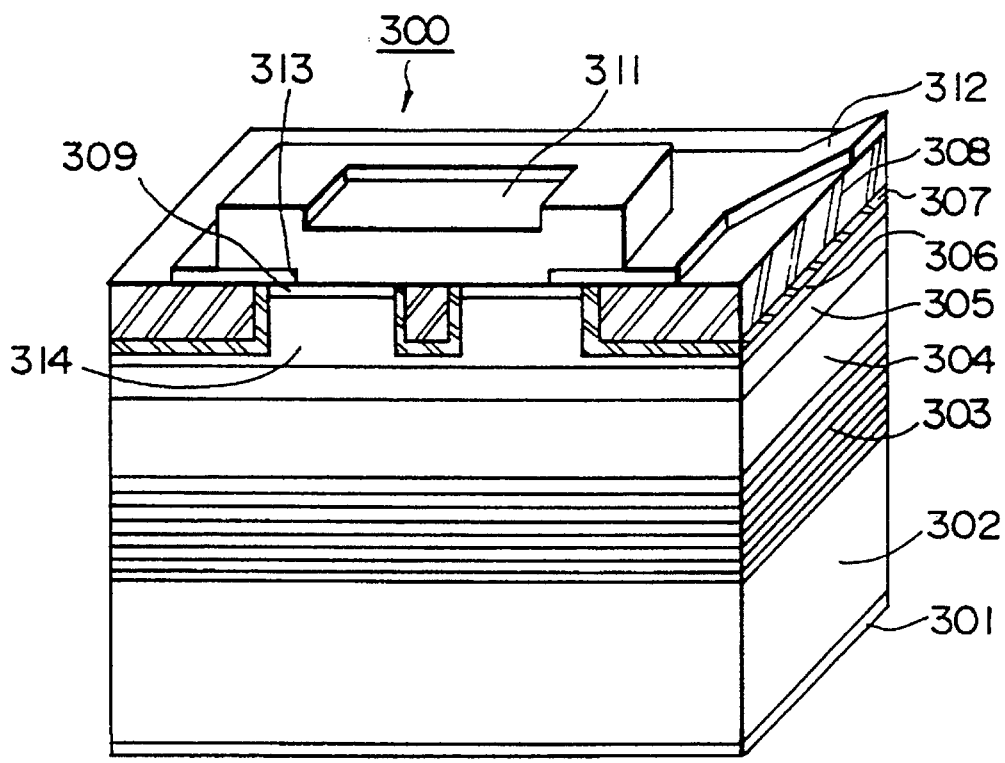
FIG. 40A is a perspective view diagrammatically showing the cross-section of a surface emission type semiconductor laser constructed in accordance with the second embodiment of the present invention.
Figure 40B:
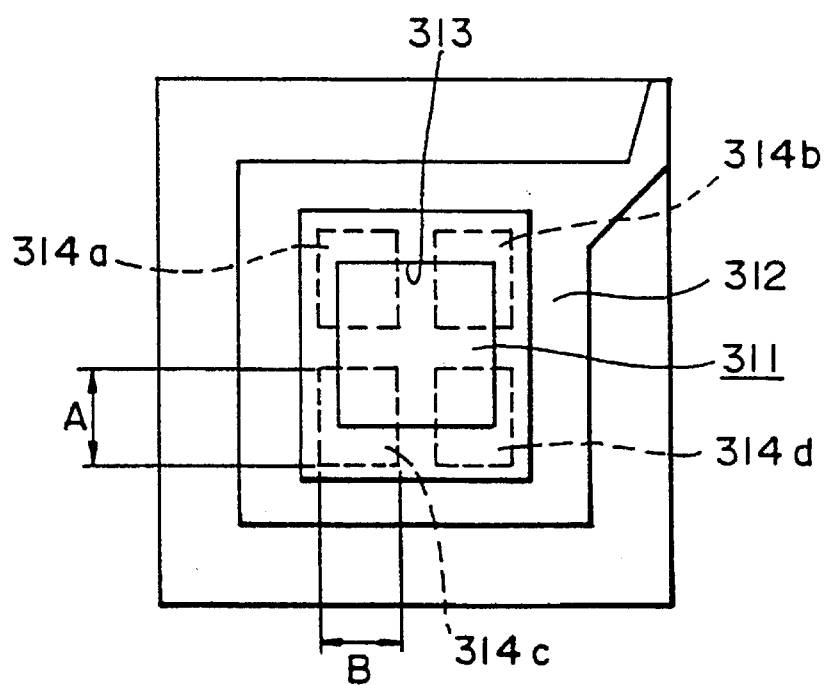
FIG. 40B is a plan view of the semiconductor laser shown in FIG. 40A as viewed from the side of light exit.

FIG. 40A is a perspective view diagrammatically showing the cross-section of the light emitting portion in a surface emission type semiconductor laser constructed according to the second embodiment of the present invention while FIG. 40B is a plan view of the laser shown in FIG. 40A.

According to the second embodiment, the surface emission type semiconductor laser 300 is characterized by that an optical resonator includes a plurality of column-like resonator portions. Parts and their functions other than the column-like resonator portions are basically similar to those of the first embodiment, and will not be further described, therefore.

The semiconductor laser 300 comprises a substrate 302 of n-type GaAs, a DBR mirror 303 including 40 pairs of n-type $Al_{0.8}Ga_{0.2}As$ and n-type $Al_{0.15}Ga_{0.85}As$ layers alternately deposited one above another and having a reflectivity of 99.5% or more for light having a wavelength of about 800 nm, an n-type clad layer of $Al_{0.7}Ga_{0.3}As$ 304, a quantum well active layer 305 including an n⁻-type GaAs well layer and an n⁻-type $Al_{0.3}Ga_{0.7}A$ barrier layer, said well layer formed of 21 layers, a p-type clad layer of $Al_{0.7}Ga_{0.3}As$ 306 and a p⁺-type contact layer of $Al_{0.15}Ga_{0.85}As$ 309, all of which layers are sequentially deposited on the substrate 302. The p-type $Al_{0.7}Ga_{0.3}As$ clad layer 306 is etched to its middle to form a plurality of column-like resonator portions 314 each having a rectangular cross-section. The column-like resonator portions 314 are buried by a first insulation layer 307 of silicon oxide film ($SiO_x$) such as $SiO_2$ and a second insulation layer 308 formed on the first insulation layer 307.

Such a type of semiconductor laser can produce light beams synchronized in phase from the resonator portions since the transverse modes in the separated resonator portions are electromagnetically coupled.

As shown in FIG. 40B, each of the column-like resonator portions 314 (314a–314d) forming an optical resonator is of a rectangular cross-section having longer and shorter sides parallel to the sides of the semiconductor substrate 302, the shorter sides of the resonator portions 314a–314d being parallel to one another. In the surface emission type semiconductor laser, the plane of polarization of the laser beam emitted from each of the column-like resonator portions 314 is parallel to the shorter sides of that resonator portion. Because the shorter sides of each of the column-like resonator portions 314 are parallel to each other, the planes of polarization in the laser beams from the resonator portions are aligned with one another.

The material used to form the first and second insulation layers 307, 308 may be any light transmission material such as $SiO_x$ or $SiN_x$. Thus, the buried insulation layers may be substantially transparent for the laser emission wavelength. In addition to the light beams from the column-like resonator portions 314, the light leaking into the buried insulation layers can also contribute to the effective light output to spread the emission spot.

The relationship between the longer and shorter sides of the resonator portions 314 will be described in detail.

When it is assumed that the lengths of the longer and shorter sides in each column-like resonator portion 314 are respectively A and B, it is preferred that B<A<2B. If the length A is equal to or longer than 2B, the cross-sectional configuration of the emitted light beam becomes rectangular rather than circular or regularly polygonal. This provides two or more emission spots from one exit port. Since the volume of the resonator increases, furthermore, the lasing threshold current also increases.

It is further preferable that each side of the rectangular cross-section is in 1.1×B≦A≦1.5×B. If the length of the longer sides is smaller than 1.1×B, the polarization plane cannot be effectively controlled. In order to keep the lasing threshold current low, it is desirable that A≦1.5×B.

The semiconductor laser 300 of the second embodiment may be produced by the same process as that of the first embodiment except that a different mask is used to form the column-like resonator portions 314. Namely, the same process as in FIGS. 22A–22C and FIGS. 23D–23F may be used except that a mask used to form the column-like resonator portions 314 corresponds to the plan configuration thereof.

Figure 41A:
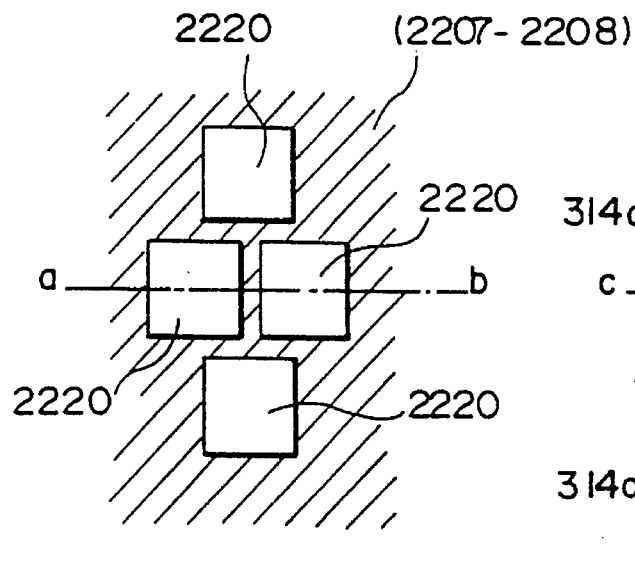
FIG. 41A is a view showing the configuration of a resonator portion of a surface emission type semiconductor laser constructed in accordance with the prior art as viewed from the side of light exit.
Figure 41C:
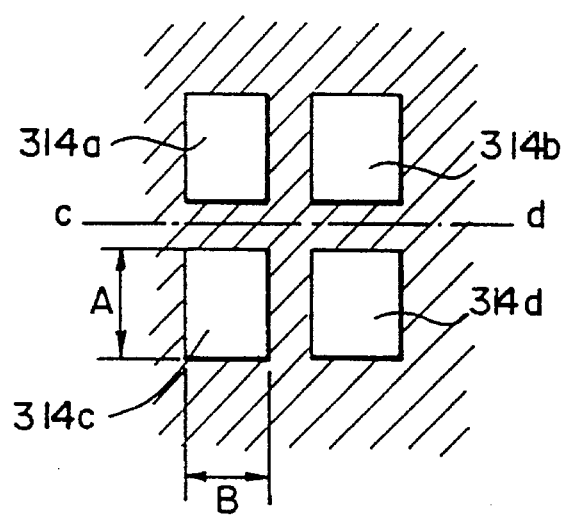
FIG. 41C is a view showing the configuration of a resonator on the side of light exit in the second embodiment.
Figure 41B:
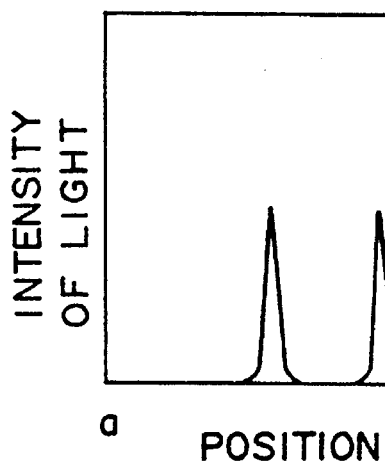
FIG. 41B is a graph showing the distribution of intensity of an emission image at a near field in the laser of FIG. 41A.
Figure 45:
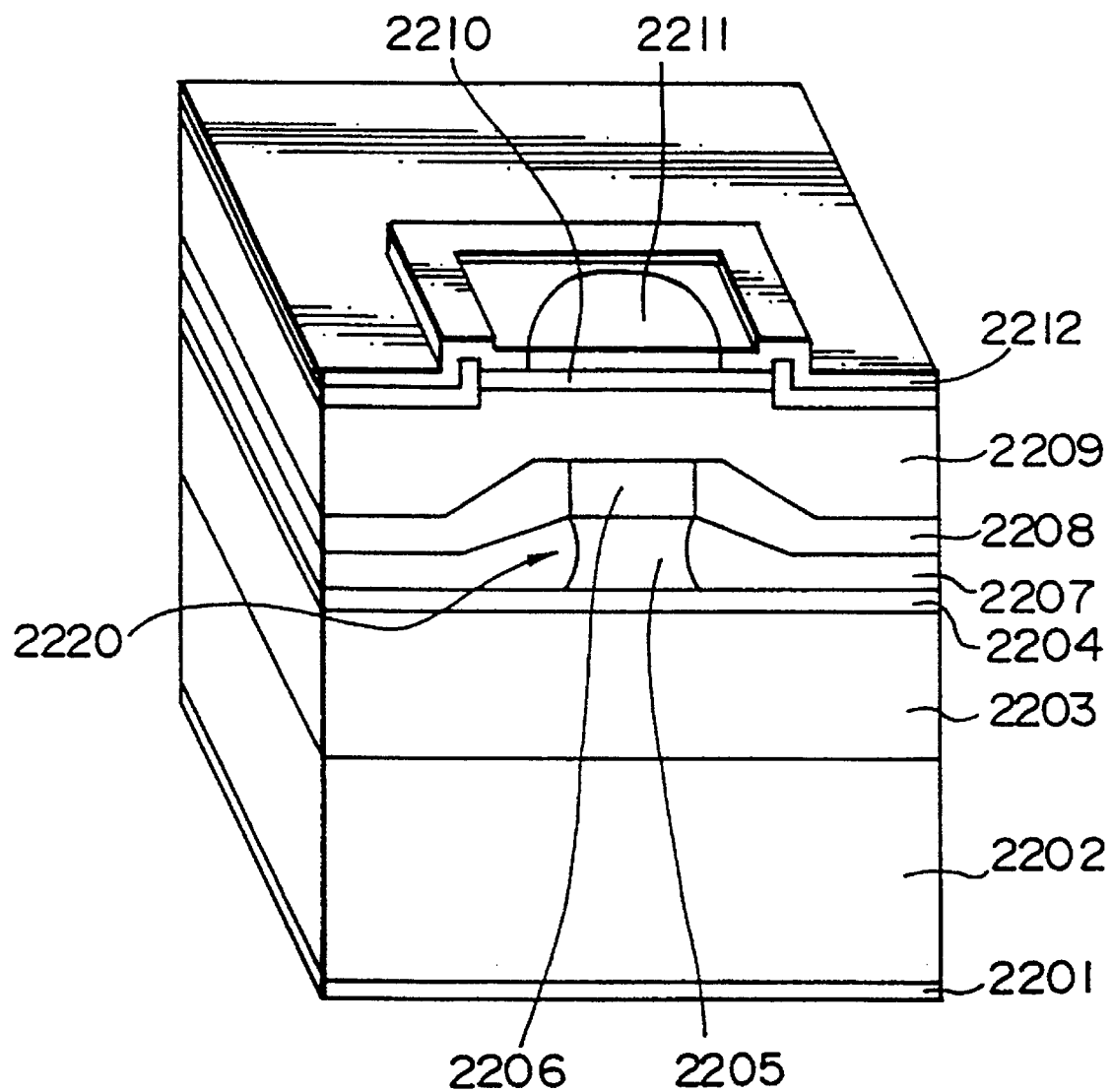
FIG. 45 is a perspective view showing another surface emission type semiconductor laser constructed in accordance with the prior art.

FIGS. 41A–41D show the light exit side forms and profiles of the NFP laser emission intensity in the surface emission type semiconductor lasers according to the prior art and the second embodiment. FIG. 41A shows a case where the resonators in the prior art surface emission type semiconductor laser shown in FIG. 45 are located close to one another, namely by a distance of 5 μm, sufficient to bury them in n-p junction type epitaxial layers of GaAlAs 2207 and 2208. The laser exit plane includes a dielectric multilayer film mirror and a p-type ohmic electrode (upper electrode), but these components are omitted to show the configuration of the resonators. FIG. 41B shows the distribution of the NFP intensity along a line a–b in FIG. 41A. Even if a plurality of emission parts 2220 are located close to one another by a distance enabling the burying step in the surface emission type semiconductor laser of the prior art, a plurality of emission spots will appear without lateral leakage of light. This provides a multi-peak NFP including two or more emission spots.

Figure 41D:
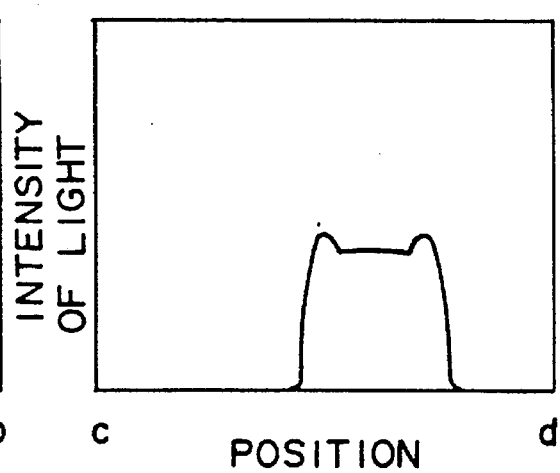
FIG. 41D is a graph showing a distribution of intensity of an emission image at a near field in the laser of FIG. 41C.

FIG. 41C shows the configuration of the surface emission type semiconductor laser according to the second embodiment in which separation grooves are buried by the buried insulation layer. In the case the buried insulation layer is formed through the vapor growth process, the minimum width in the separation grooves may be controlled to about 1 μm. FIG. 41D shows the NFP intensity along a line c–d in FIG. 41C. Since light is emitted from not only the column-like resonator portions but also the separation grooves, the spread of emission can be judged from the NFP. Since the laser beams from the column-like resonator portions 314a–314d are synchronized in phase with one another, the light output is increased to provide a beam having an angle of radiation which is equal to or smaller than 5 degree.

Figure 42A:
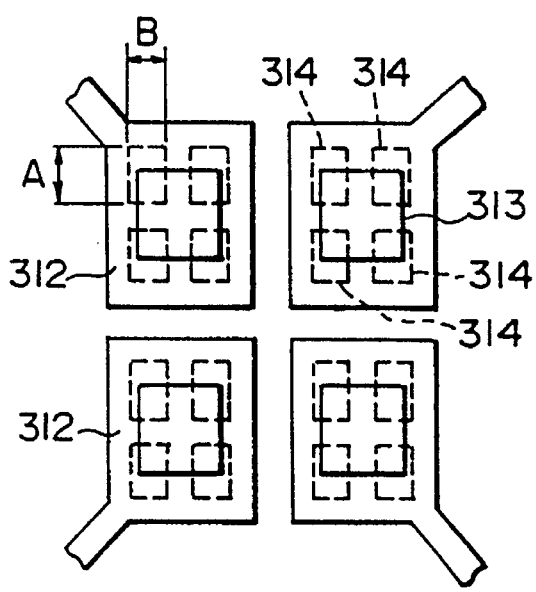
FIG. 42A is a view showing a plurality of optical resonators arranged in the surface emission type semiconductor laser according to the second embodiment.

FIG. 42A–42D show a case where four optical resonators each having four resonator portions 314 formed according to the second embodiment are disposed on a semiconductor substrate 302. In FIG. 42A, each of the optical resonators includes an electrode 312 having a single light exit port 313 which is formed therein at a position opposite to and overlapping all four resonator portions 314. Each of the four resonator portions 314 of one optical resonator is of rectangular cross-section which has the shorter sides B parallel to each other. The planes of polarization in the laser beams from the four light exit ports 313 will be aligned parallel to the shorter sides of the column-like resonator portions.

Figure 42B:
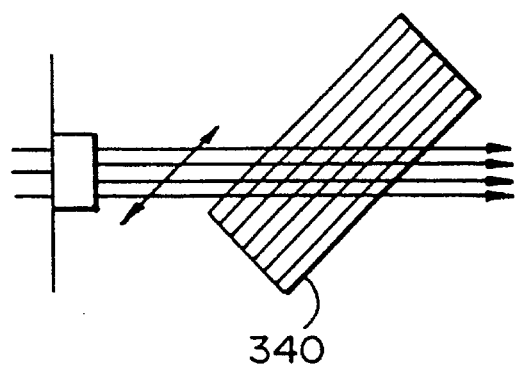
FIG. 42B is a view illustrating the laser beams from the optical resonators of FIG. 42A which pass through a polarizing filter.

A state when four laser beams from the semiconductor laser including the four optical resonators pass through a polarizing filter 340 is shown in FIG. 42B. Since the four laser beams are aligned with one another with respect to the plane of polarization, all the laser beams can pass through the polarizing filter 340.

Figure 42C:
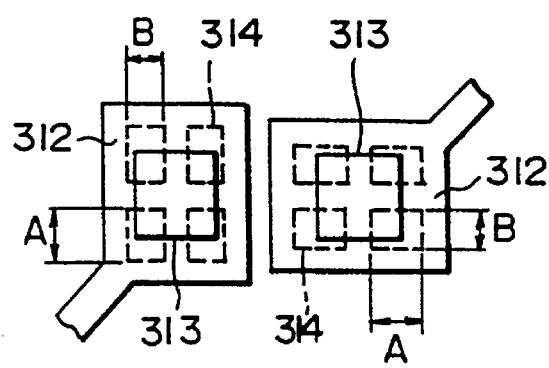
FIG. 42C is a view showing a plurality of optical resonators arranged such that the directions of the shorter sides of rectangular resonators are different from one another in the surface emission type semiconductor laser of the second embodiment.
Figure 42D:
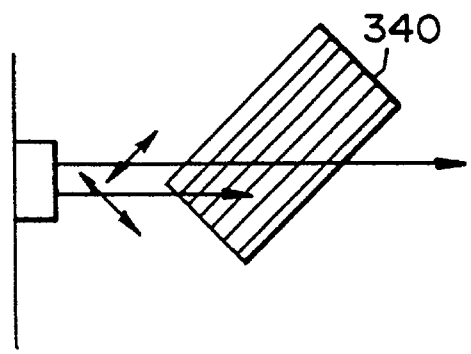
FIG. 42D is a view showing the laser beams from the optical resonators of FIG. 42C which pass through a polarizing filter.

FIG. 42C shows a case where the shorter sides of the cross-sections of the column-like resonator portions 314 are differently aligned from one another between two optical resonators, for example, the shorter sides extending in the respective directions perpendicular to each other. In such a case, one laser beam can pass through the polarizing filter 340 while the other laser beam cannot pass through the polarizing filter 340, as can be seen from FIG. 42D. This may preferably be applied to the field of optical communication since only a laser beam having a plane of polarization in a particular direction can selectively pass through the polarizing filter.

Figure 43A:
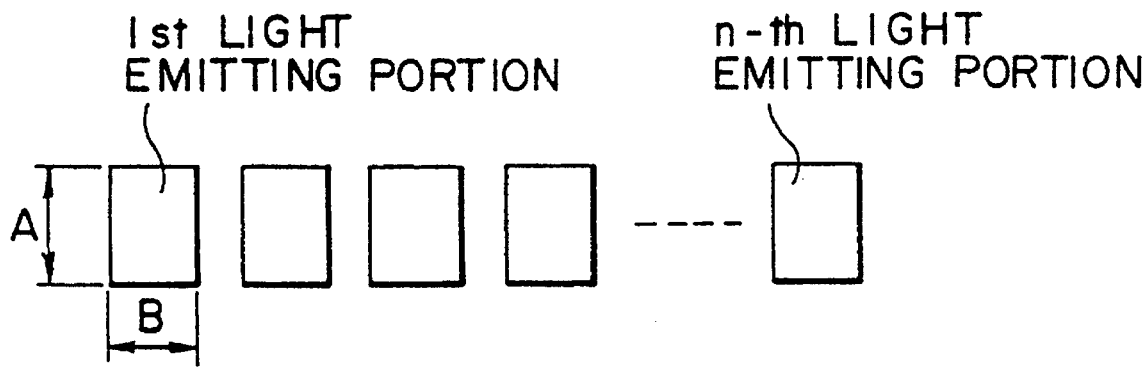
FIGS. 43A–43C are views showing rectangular resonator portions having shorter and longer sides which are arranged on a two-dimensional plane parallel to the substrate in a transverse and/or longitudinal array.
Figure 43B:
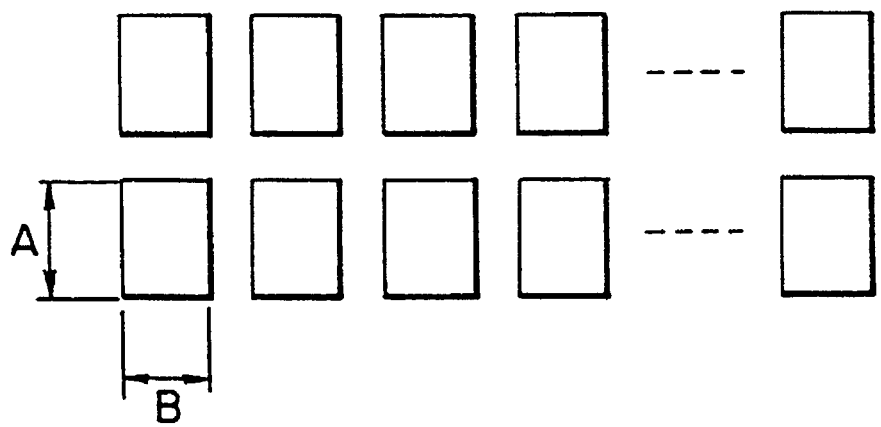
Figure 43C:
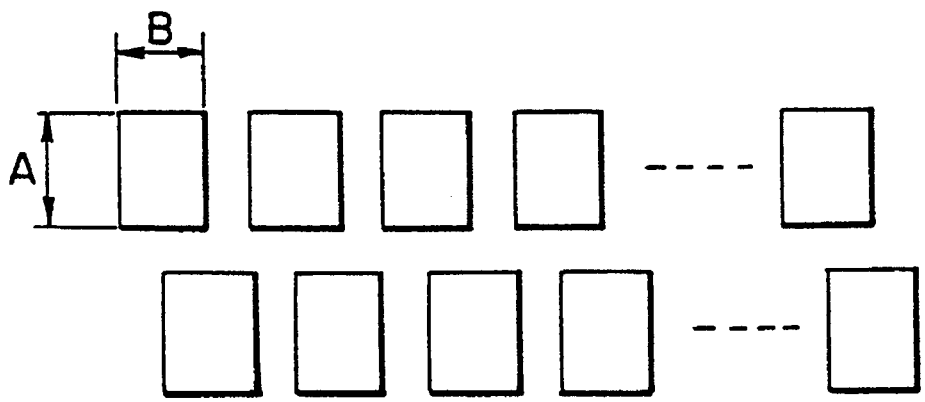

While the second .embodiment has been described with respect to four resonator portions, the number and arrangement of resonator portions may be selected voluntarily. For example, the resonator portions may be arranged equidistantly in transverse and/or longitudinal lines on a two-dimensional plane parallel to the plane of the substrate, as shown in FIGS. 43A–43C. By providing n resonators arranged in a line, a line beam can be obtained.

Figure 44A:
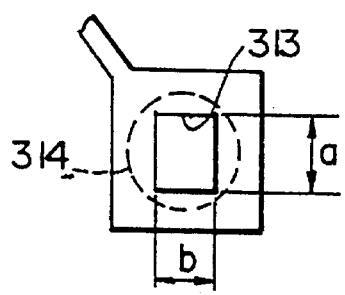
FIGS. 44A–44D are views showing resonators which can control the plane of polarization in the laser beam by providing rectangular light exit ports.

Although further the second embodiment has been described as having a rectangular cross-section of the column-like resonator portions to control the plane of polarization in the emitted laser beam, the laser beams having their planes of polarization aligned may similarly be emitted by providing a rectangular opening in a light exit port 313 formed in a light exit electrode 312. Although the cross-sectional form of each column-like resonator portion 314 is circular in the embodiment shown in FIG. 44A, the opening in the light exit port 313 formed in the electrode is of a rectangular configuration having longer sides $\underline{a}$ and shorter sides $\underline{b}$. In such a case, the plane of polarization in the emitted laser beam will be aligned with the direction of the shorter sides $\underline{b}$ in the rectangular light exit port 313.

Figure 44B:
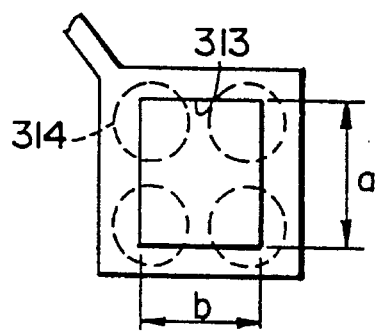
Figure 44C:
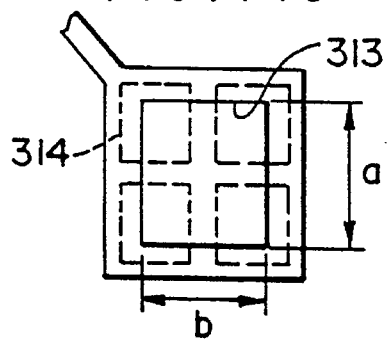
Figure 44D:
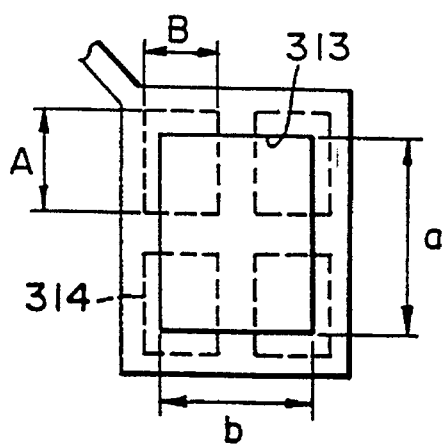

The rectangular light exit port is more convenient in manufacturing than the rectangular cross-section of each column-like resonator portion itself of the optical resonator. Where a plurality of column-like resonator portions are used to form an optical resonator, at least some column-like resonator portions may not be formed into a rectangular cross-section from the positional relationship between the column-like resonator portions. In such a case, it is effective that the light exit port is formed into a rectangular configuration to determine the plane of polarization. FIGS. 44B and 44C show a case where each of four column-like resonator portions 314 is of a circular or regularly polygonal cross-section and a rectangular light exit port 313 is formed at an area opposite to all the column-like resonator portions. FIG. 44D shows another case where each of four column-like resonator portions 314 is of a rectangular cross-section and a rectangular light exit port 313 is formed at an area opposite to all the column-like resonator portions. The shorter sides (B) of the rectangular column-like resonator portions are parallel to the shorter sides (b) of the light exit port.

When the light exit port has a rectangular configuration and it is assumed that the longer and shorter sides are respectively $\underline{a}$ and $\underline{b}$ in the light exit port, their relationship is preferably b<a<2×b and more preferably $1.1 \times b \leq a \leq 1.5 \times b$. The reason is that if the ratio of b/a is higher, the ratio of B/A for every side in the column-like resonator portions of the optical resonator must correspondingly be higher. This will shift the lengths A and B out of the preferred range.

Figure 44E:
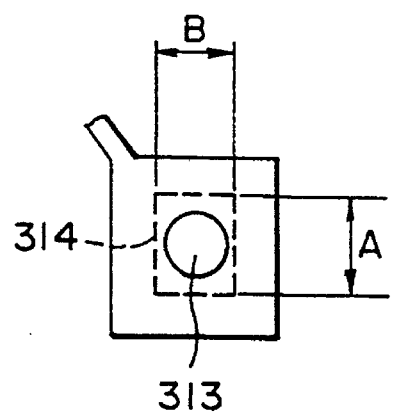
FIG. 44E is a view showing a resonator of rectangular cross-section with a circular light exit port.

As shown in FIG. 44E, each of the resonator portions 314 may be of a rectangular cross-section having longer and shorter sides A, B and the light exit port 313 may be of circular configuration.

Since the planes of polarization of the laser beams can be aligned with one another and with a particular direction according to the second embodiment of the present invention, the laser can easily emit laser beams having their planes of polarization aligned with a particular direction without need of any fine positional adjustment when connecting to laser printer or communication apparatus. The aforementioned embodiment focuses on the surface emission type semiconductor laser using an AlGaAs-type semiconductor. Nevertheless, the present invention is applicable to a surface emission type semiconductor laser using an AlGaInP-type or InGaAsP-type semiconductor. Further, the present invention may be applied to a surface emission type semiconductor laser formed by semiconductor layers having polarities opposite to the semiconductor layers of the surface emission type semiconductor laser of the aforementioned embodiment.

We claim:

1. A surface emission type semiconductor laser comprising:
    a substrate formed of a compound semiconductor of a first conductance type;

a lower electrode formed on the bottom of said substrate;

a distributed reflection multilayer film mirror of the first conductance type formed on the top of said substrate;

a first clad layer of the first conductance type formed on said distributed reflection multilayer film mirror;

a quantum well active layer formed on said first clad layer;

a second clad layer of a second conductance type formed on said quantum well active layer and having one or more column-like portions;

a contact layer of the second conductance type formed on the column-like portion or portions in the second clad layer;

a buried insulation layer embedded around said column-like portion or portions of said second clad layer and said contact layer, including at least a first insulation layer which covers the surface of said second clad layer and said contact layer and which is formed of a silicon compound;

an upper electrode forming a bridge between said contact and buried insulation layers and having an opening facing part of said contact layer; and a dielectric multilayer film mirror formed at least on said contact layer to cover the opening of said upper electrode.

2. A surface emission type semiconductor laser as defined in claim 1 wherein in addition to said first insulation layer, said buried insulation layer also includes a second insulation layer formed on said first insulation layer for flattening an area surrounding the column-like portion or portions of said second clad layer and said contact layer.

3. A surface emission type semiconductor laser as defined in claim 1 wherein said first insulation layer has its film thickness ranging between 500 Angstroms and 2000 Angstroms.

4. A surface emission type semiconductor laser as defined in claim 1 wherein said first insulation layer is formed of at least one material selected from a group consisting of silicon oxides, silicon nitrides and silicon carbides.

5. A surface emission type semiconductor laser as defined in claim 2 wherein said second insulation layer is formed of at least one material selected from a group consisting of silicon compounds formed at temperatures lower than that of the silicon compound of said first insulation layer, heat-resistant resins and polycrystalline II–VI group compound semiconductors.

6. A surface emission type semiconductor laser as defined in claim 1 wherein the film thickness of said second clad layer at the areas other than said column-like portion or portions is within a predetermined range.

7. A surface emission type semiconductor laser as defined in claim 6 wherein said film thickness is within a range between 0 and 0.58 µm.

8. A surface emission type semiconductor laser as defined in claim 7 wherein said film thickness is within a range between 0 and 0.35 µm.

9. A surface emission type semiconductor laser as defined in claim 1 wherein said quantum well active layer includes well layers formed of a III–V group compound semiconductor and barrier layers formed of a III–V group compound semiconductor and wherein the film thickness of each of said well layers is between 40 Angstroms and 120 Angstroms, the film thickness of each of said barrier layers being between 40 Angstroms and 100 Angstroms, and the total number of said well layers being between 3 and 40.

10. A surface emission type semiconductor laser as defined in claim 1 wherein said distributed reflection type multilayer film mirror has a reflectivity equal to or higher than 99.2% within range of a wavelength at least 40 nm which includes a lasing wavelength $\lambda_{EM}$.

11. A surface emission type semiconductor laser as defined in claim 1 wherein said distributed reflection type multilayer film mirror comprising alternately stacked first and second type layers of first and second III–V group compound semiconductors, respectively, wherein said second compound semiconductor has an energy bandgap larger than that of said first compound semiconductor, and a refractive index different from that of said first compound semiconductor.

12. A surface emission type semiconductor laser as defined in claim 11 wherein the carrier concentration of the interface region between said first type layer and said second type layer is higher than that in the remaining regions of these layers.

13. A surface emission type semiconductor laser as defined in claim 11 wherein the maximum value of the carrier concentration of said interface region is between a minimum of 1.1 times and a maximum of 100 times the value of said remaining regions.

14. A surface emission type semiconductor laser as defined in claim 11 wherein the maximum value of the carrier concentration of said interface region is $5 \times 10^{20}$ cm$^{-3}$ or less.

15. A surface emission type semiconductor laser as defined in claim 11 wherein the thickness of said interface region is within ⅓ of the total thickness of the two layers forming the interface.

16. A surface emission type semiconductor laser as defined in claim 11 wherein the dopants used to dope said interface region are selected from S, Se, Te and Si for an n-type region.

17. A surface emission type semiconductor laser as defined in claim 1 wherein said dielectric multilayer film mirror has a reflectivity between 98.5% and 99.5%.

18. A surface emission type semiconductor laser as defined in claim 17 wherein said dielectric multilayer film mirror is formed of a dielectric material having an absorption coefficient which is equal to or lower than 100 cm$^{-1}$ for the lasing wavelength.

19. A surface emission type semiconductor laser as defined in claim 18 wherein said dielectric multilayer film mirror is formed by alternately deposited layers of at least one material selected from a group consisting of SiO$_x$, MgF$_x$, CaF$_x$, BaF$_x$ and AlF$_x$ on the one hand.

20. A surface emission type semiconductor laser as defined in claim 1 wherein when the diameter of the column-like portion or portions in said second clad layer is Da and the diameter of the opening in said upper electrode is Dw, Da is between 6 µm and 12 µm and Dw is between 4 µm and 8 µm.

21. A surface emission type semiconductor laser as defined in claim 1 wherein said first and second clad layers include semiconductor layers of Al$_x$Ga$_{1-x}$As where x is equal to or larger than 0.65.

22. A surface emission type semiconductor laser as defined in claim 1 wherein the column-like portion or portions of said second clad layer has a film thickness between 0.8 µm and 3.5 µm.

23. A surface emission type semiconductor laser as defined in claim 1 wherein each column-like portion in said second clad layer has a rectangular cross-section parallel to the plane of said semiconductor substrate and having longer and shorter sides and wherein the plane of polarization in an emitted laser beam is parallel to said shorter sides.

24. A surface emission type semiconductor laser as defined in claim 23 wherein when said longer and shorter sides are respectively A and B, B<A<2B.

25. A surface emission type semiconductor laser as defined in claim 23 wherein said second clad layer includes a plurality of column-like portions each having a rectangular cross-section, the shorter sides of the rectangular column-like portions being parallel to one another, whereby laser beams aligned in phase and polarization plane with one another can be emitted from the column-like portions through said opening.

26. A surface emission type semiconductor laser as defined in claim 25 wherein said buried insulation layer is formed of transparent material, whereby laser beams aligned in phase and polarization plane with one another and each providing a single emission spot can be emitted from said column-like portions and said buried insulation layer between said column-like portions through said opening.

27. A surface emission type semiconductor laser as defined in claim 25 wherein said column-like portions each having a rectangular cross-section are disposed in linear symmetry on a two-dimensional plane parallel to said semiconductor substrate and wherein the opening formed in said upper electrode is of a circular or regularly polygonal configuration, whereby a laser beam of substantially circular cross-section can be emitted from said surface emission type semiconductor laser.

28. A surface emission type-semiconductor laser as defined in claim 25 wherein a plurality of optical resonators each including a plurality of said column-like portions are formed on said semiconductor substrate such that each of said optical resonators has an independent upper electrode, whereby a laser beam having a substantially circular emission spot emitted from each of said optical resonators can independently be turned on and off and modulated.

29. A surface emission type semiconductor laser as defined in claim 28 wherein said optical resonators includes column-like portions of rectangular cross-section with all the shorter sides thereof being parallel to one another, whereby the planes of polarization in the laser beams emitted from the respective optical resonators can be aligned with one direction.

30. A surface emission type semiconductor laser as defined in claim 28 wherein at least one of said optical resonators includes column-like portions having their shorter sides not parallel to those of the other optical resonator or resonators, whereby the plane of polarization in the laser beam emitted said at least one optical resonator can be different from the planes of polarization of the laser beams from the other optical resonators.

31. A surface emission type semiconductor laser as defined in claim 25 wherein said column-like portions are disposed equidistantly on a two-dimensional plane parallel to the plane of said semiconductor substrate in transverse and/or longitudinal lines, whereby said surface emission type semiconductor laser can emit a line laser beam.

32. A surface emission type semiconductor laser as defined in claim 1 wherein said opening is of a rectangular configuration having longer and shorter sides.

33. A surface emission type semiconductor laser as defined in claim 32 wherein when the longer sides are a and the shorter sides are b, b<a<2b.

34. A surface emission type semiconductor laser comprising:

a substrate formed of a compound semiconductor of a first conductance type;

a lower electrode formed on the bottom of said substrate;

a distributed reflection multilayer film mirror of the first conductance type formed on the top of said substrate;

a first clad layer of the first conductance type formed on said distributed reflection multilayer film mirror;

a quantum well active layer formed on said first clad layer;

a second clad layer of a second conductance type formed on said quantum well active layer and having one or more column-like portions;

a contact layer of the second conductance type formed on the column-like portion or portions in the second clad layer;

a buried insulation layer embedded around said column-like portion or portions of said second clad layer and said contact layer;

an upper electrode formed to bridge between said contact and buried insulation layers and having an opening facing a part of said contact layer; and a dielectric multilayer film mirror formed at least on said contact layer to cover the opening of said upper electrode, wherein the peak wavelength $\lambda_G$ of the gain spectrum of said quantum well active layer is set to be smaller than a desired lasing wavelength $\lambda_{EM}$ by a given differential wavelength (gain offset) $\Delta\lambda_{BS}$.

35. A surface emission type semiconductor laser as defined in claim 34 wherein said gain offset $\Delta\lambda_{BS}$ ranges between 5 nm and 20 nm.

36. A surface emission type semiconductor laser as defined in claim 34 wherein said buried insulation layer includes at least a first insulation layer of a silicon compound which covers the surface of said second clad layer and said contact layer.

37. A method of producing a surface emission type semiconductor laser, comprising the steps of:

(a) forming semiconductor layers including at least a distributed reflection type multilayer film mirror of a first conductance type, a first clad layer of the first conductance type, a quantum well active layer, a second clad layer of a second conductance type and a contact layer of the second conductance type on a substrate formed of a first conductance type compound semiconductor through epitaxial growth;

(b) etching said contact and second clad layers to form one or more column-like portions;

(c) forming a buried insulation layer including at least a first insulation layer of silicon compound covering the surface of said second clad layer and said contact layer around said column-like portion or portions;

(d) forming an upper electrode having an opening facing a part of said contact layer and bridging between said contact layer and said buried insulation layer; and (e) forming a dielectric multilayer film mirror at least on said contact layer to cover the opening of said upper electrode.

38. A method of producing a surface emission type semiconductor laser as defined in claim 37 wherein after said first insulation layer has been formed, said buried insulation layer is formed with a second insulation layer on said first insulation layer for flattening an area surrounding the column-like portion or portions of said second clad layer and said contact layer.

39. A method of producing a surface emission type semiconductor laser as defined in claim 37 wherein said distributed reflection type multilayer film mirror is formed by alternately depositing semiconductor layers of lower and higher refractive indexes, said deposition of semiconductor layers being switched from one semiconductor layer deposition to the other semiconductor layer deposition at minimum and maximum point in a reflectivity profile which is determined during formation of said layers by irradiating light having a given wavelength onto the substrate, sensing its reflective spectrum and measuring the reflectivity profile on the semiconductor layer being formed on the substrate.

40. A method of producing a surface emission type semiconductor laser as defined in claim 37 wherein said step (b) comprises a step of irradiating light having its wavelength within a given range onto the substrate having said semiconductor layers, sensing its reflective spectrum and measuring a dip appearing in the reflective spectrum due to a standing wave of the optical resonator, during the etching step, whereby the depth of etching can be controlled.

41. A method of producing a surface emission type semiconductor laser as defined in claim 40 wherein the depth of etching is controlled such that the film thickness of said second clad layer at an area other than said column-like portion or portions is within a given range.

42. A method of producing a surface emission type semiconductor laser as defined in claim 41 wherein said film thickness is set to be within a range between 0 and 0.58 μm.

43. A method of producing a surface emission type semiconductor laser as defined in any one of claim 37 wherein after the step (a), a protective layer of $SiO_x$ is formed on the surface of said semiconductor layers.

44. A method of producing a surface emission type semiconductor laser as defined in claim 43 wherein during the etching step, the depth of etching in said protective layer is controlled by irradiating light having a given wavelength onto the substrate on which said protective layer is formed, sensing its reflective spectrum and measuring the reflectivity profile.

45. A method of producing a surface emission type semiconductor laser as defined in claim 37 wherein the length of a resonator constituted by said semiconductor layers formed in the step (a) is controlled by etching before the step (d) and wherein the depth of etching is controlled, during the etching step, by irradiating light having its wavelength within a given range onto the substrate on which said semiconductor layers are formed, sensing its reflective spectrum and measuring a dip appearing on the reflective spectrum due to a standing wave of the optical resonator.

46. A method of producing a surface emission type semiconductor laser as defined in claim 37 wherein the step (a) comprises a step of forming said semiconductor layers through the metal-organic vapor phase deposition method.

47. A method of producing a surface emission type semiconductor laser as defined in claim 37 wherein the temperature of said substrate is maintained at a level within a range between 0° C. and 40° C. during the step (b).

48. A method of producing a surface emission type semiconductor laser, comprising the steps of:

(a) forming semiconductor layers including at least a distributed reflection type multilayer film mirror of a first conductance type, a first clad layer of the first conductance type, a quantum well active layer, a second clad layer of a second conductance type and a contact layer of the second conductance type on a substrate formed of a first conductance type compound semiconductor through epitaxial growth;

(b) etching said contact and second clad layers to form one or more column-like portions;

(c') forming a buried insulation layer around said column-like portion or portions;

(d) forming an upper electrode having an opening facing a part of said contact layer and bridging between the contact layer and the buried insulation layer; and (e) forming a dielectric multilayer film mirror at least on said contact layer to cover the opening of said upper electrode, said semiconductor layers being controlled such that the peak wavelength $\lambda_G$ of the gain spectrum of said quantum well active layer is smaller than a desired lasing wavelength $\lambda_{EM}$ by a predetermined differential wavelength (gain offset) $\Delta\lambda_{BS}$.

49. A method of producing a surface emission type semiconductor laser as defined in claim 38 wherein said gain offset $\Delta\lambda_{BS}$ is set to be between 5 nm and 20 nm.

50. A method of producing a surface emission type semiconductor laser as defined in claim 48 wherein said step (c') includes a step of forming a first insulation layer of a silicon compound covering at least the surface of said second clad layer and said contact layer.

* * * * *